(12) United States Patent
Sato et al.

(10) Patent No.: US 7,223,516 B2
(45) Date of Patent: May 29, 2007

(54) POSITIVE TYPE PHOTORESIST COMPOSITION

(75) Inventors: Kenichiro Sato, Shizuoka (JP); Toshiaki Aoai, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 1291 days.

(21) Appl. No.: 09/729,953

(22) Filed: Dec. 6, 2000

(65) Prior Publication Data

US 2002/0006576 A1    Jan. 17, 2002

Related U.S. Application Data

(63) Continuation of application No. 09/023,801, filed on Feb. 12, 1998.

(30) Foreign Application Priority Data

| Feb. 17, 1997 | (JP) | ................................. 9-32431 |
| Feb. 27, 1997 | (JP) | ................................. 9-43974 |
| Mar. 3, 1997 | (JP) | ................................. 9-48056 |
| Mar. 7, 1997 | (JP) | ................................. 9-53583 |

(51) Int. Cl.
   *G03F 7/004*    (2006.01)
(52) U.S. Cl. .................... 430/270.1; 430/905; 430/910
(58) Field of Classification Search ............. 430/270.1, 430/910, 905
   See application file for complete search history.

(56) References Cited

U.S. PATENT DOCUMENTS

| 5,621,019 | A | | 4/1997 | Nakano et al. | |
| 5,677,405 | A | * | 10/1997 | Goodall et al. | ............. 526/281 |
| 5,968,713 | A | | 10/1999 | Nozaki et al. | |
| 6,013,416 | A | * | 1/2000 | Nozaki et al. | ........... 430/283.1 |
| 6,060,207 | A | | 5/2000 | Shida et al. | |
| 6,150,068 | A | * | 11/2000 | Sato et al. | ................ 430/270.1 |
| 6,200,725 | B1 | * | 3/2001 | Takechi et al. | .......... 430/270.1 |
| 6,329,125 | B2 | | 12/2001 | Takechi et al. | |
| 6,388,101 | B1 | | 5/2002 | Hada et al. | |

FOREIGN PATENT DOCUMENTS

| DE | 196 26 003 A1 | 6/1996 |
| EP | 0 856 773 A1 | 8/1998 |
| JP | 7-252324 | 10/1995 |
| JP | 8-82925 | 3/1996 |
| JP | 10-177247 | 6/1998 |
| JP | 10-207069 | 8/1998 |
| JP | 10-274852 | 10/1998 |

\* cited by examiner

*Primary Examiner*—John S. Chu
(74) *Attorney, Agent, or Firm*—Sughrue Mion, PLLC

(57) ABSTRACT

A positive type photoresist composition suitable for light in the wavelength region of 170 nm to 220 nm, high in sensitivity, excellent in adhesion and giving a good resist pattern profile, which comprises a resin having an ester group represented by the following general formula [I] in its molecule and a compound generating an acid by irradiation of an active light ray or radiation:

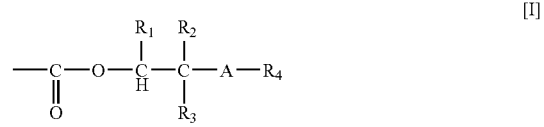

[I]

wherein $R_1$ represents a hydrogen atom, an alkyl group or a cycloalkyl group; and $R_2$ and $R_3$, which may be the same or different, each represents a hydrogen atom, an alkyl group, a cycloalkyl group or -A-$R_4$, and $R_2$ and $R_3$ may combine together to form a ring, wherein $R_4$ represents a hydrogen atom, an alkyl group or a cycloalkyl group, $R_4$ and $R_2$ or $R_3$ may combine together to form a ring, and A represents an oxygen atom or a sulfur atom.

2 Claims, No Drawings

POSITIVE TYPE PHOTORESIST COMPOSITION

This is a continuation of application Ser. No. 09/023,801 filed Feb. 12, 1998, the disclosure of which is incorporated herein by reference.

FIELD OF THE INVENTION

The present invention relates to a positive type photoresist composition suitable for exposure treatment with active light rays or radiation, particularly light rays having a wavelength as very short as 170 nm to 220 nm, and more particularly to a positive type photoresist composition high in sensitivity, and giving an excellent resist pattern and a pattern excellent in adhesion to a substrate.

Further, the present invention relates to an ultramicro-lithography process or another photo-fabrication process for producing a very large scale integrated circuit or a high capacity microchip, and more particularly to a positive type photoresist composition which can form a highly refined pattern by use of far ultraviolet rays including excimer laser beams.

BACKGROUND OF THE INVENTION

In recent years, there have been glowing demands in the field of production of various electronic devices requiring fine processing such as semiconductor elements towards the devices progressively increased in density and integration. This makes very severe the required performances for the photography techniques for realizing refined patterns. Contributing to this refining technique are photoresists increased in resolution and exposure light having a shortened wavelength.

In general, the resolution (Res) of the optical system can be represented by the Rayleigh equation, namely Res=$\kappa \cdot \lambda$/NA (wherein $\kappa$ is a process factor, $\lambda$ is a wavelength of an exposure light source, and NA is the number of openings of a lens). This equation shows that the width of a reproduced line can be decreased to resolve a fine pattern (namely high resolution can be obtained) by shortening the wavelength at the time of exposure. Surely, the exposure wavelength has been sifted to the g-line (436 nm) and the i-line (365 nm) of a high pressure mercury lamp with a decrease in the minimum width of the reproduced line, and the production of the devices by use of the KrF excimer laser beam (249 nm) has been studied. For further fine processing, the use of an excimer laser beam having a shorter wavelength, particularly ArF (193 nm), has a good prospect.

Looking at photoresists exposed to shortwave light, high integration in multilayer resist systems utilizing surface lithography, not in monolayer resist systems which have previously been used in the industrial production, is also studied. However, it still suffers from the problem of complicated processes which have prevented the practical application of the multilayer resists.

In the case of excimer lasers including KrF excimer lasers, it is generally considered that the life of gases is short, and that the cost performance of the lasers is required to be improved because exposure devices themselves are expensive.

Responding to this are so-called chemical amplification type resists becoming the main current in KrF excimer laser exposure applications. In the chemical amplification type resists, acids are generated from photo acid generators existing in catalytic amounts in the systems by exposure, and protective groups of alkali-soluble groups of binders or low molecular weight compounds are eliminated with the catalytic reaction of acids by the catalytic reaction to ensure discrimination of the solubility in alkali developing solutions. In the chemical amplification type resists, the acids generated by the photocatalytic reaction are catalytically utilized, so that an increase in sensitivity is expected.

In general, the chemical amplification system resists can be roughly divided into three classes, commonly called as a 2-component system, a 2.5-component system and a 3-component system. In the 2-component system, a photo acid generator is combined with a binder resin. The binder resin is a resin having a group which is decomposed by the action of an acid to enhance the solubility of the resin in an alkali developing solution (which is also referred to as an acid decomposable group) in its molecule. The 2.5-component system contains a low molecular weight compound further having an acid decomposable group in addition to such a 2-component system. The 3-component system contains the photo acid generator, the alkali-soluble resin and the above-mentioned low molecular weight compound.

However, when the wavelength of exposure light becomes short, a new problem is encountered. That is, in the photoresists, raw materials good in transparency to short-wave light is poor in resistance to dry etching. On the other hand, there is the problem that raw materials good in resistance to dry etching is poor in transparency. The compatibility of the resistance to dry etching and the transparency is basically the problem of the performance of the binder resins contained in photoresist layers.

The binder resins include novolak resins and poly(p-hydroxystyrene). The novolak resins are widely utilized as alkali-soluble resins for i-line resists, and the poly(p-hydroxystyrene) resins are used as base polymers for KrF excimer laser resists. These produce no problem as long as long-wave light is used. However, different therefrom, the use of shortwave light rises a problem. In particular, the above-mentioned resins have high optical density within the wavelength region of 170 nm to 220 nm. It is therefore actually difficult to directly use these resins as with the conventional methods. Accordingly, the development of resins high in light transparency and resistance to dry etching has been looked forward to.

One of the general solutions to this problem is a method of introducing, for example, an alicyclic hydrocarbon moiety into the resin. There is also a method of utilizing a naphthalene skeleton, one of the aromatic compounds. In particular, various reports disclose that the introduction of alicyclic hydrocarbon moieties fulfills demands for both light transparency and resistance to dry etching. For example, it is described in *Journal of Photopolymer Science and Technology*, 3, 439 (1992).

On the other hand, what to select as the acid decomposable group contained in the resin is important, particularly, because it affects the sensitivity and resolution of the resist and further the aging stability.

The acid decomposable groups for protecting carboxylic acid groups, which have hitherto been mainly reported, include tertiary alkyl esters such as t-butyl esters and acetal esters such as tetrahydropyranyl esters and ethoxyethyl esters. However, the t-butyl ester groups have the drawback that the ability of being eliminated with the generated acids is low, resulting in a lowering of the sensitivity. Conversely, the tetrahydropyranyl esters and the ethoxyethyl esters have a large problem with the aging stability because of their easy decomposition at ordinary temperatures.

Further, JP-A-5-346668 (the term "JP-A" as used herein means an "unexamined published Japanese patent application") has proposed to use 3-oxocyclohexyl ester groups as the acid decomposable groups. However, they are not necessarily satisfactory in sensitivity.

As described above, for the acid decomposable groups for protecting the carboxylic acids which satisfy the sensitivity and the aging stability of the photoresists at the same time, how to design the acid decomposable groups has been not necessarily clear.

Furthermore, in order to decrease the width of the reproduced line to resolve the fine pattern in the resulting resist pattern, not only the above-mentioned characteristics but also sufficient adhesion of the fine pattern obtained to a substrate is required. Even if the fine pattern is obtained, insufficient adhesion thereof sometimes causes separation thereof.

On the other hand, in photofabrication processes of lithography, the production of semiconductors for ICs and the production of circuit substrates for thermal heads, semiconductor wafer, glass, ceramic or metal substrates are coated with photoresists to a thickness of 0.5 µm to 2.5 µm by spin coating or roller coating, followed by heating and drying. Then, circuit patterns are printed thereon through exposure masks with active light such as ultraviolet rays, and baked after exposure if necessary, followed by development to form images of the resists. Further, pattern processing can be performed on the substrates by etching using the images as masks.

In many cases, alkali-soluble resins and photosensitive materials are generally used in combination as positive type photoresist compositions, and especially, compositions comprising novolak type phenol resins and naphthoquinonediazide compounds in combination are used. The positive type photoresists comprising the novolak resins and quinonediazide compounds have advantageous characteristics such as high resistance to plasma etching, the prevention of dissolution of the naphthoquinonediazide compounds, the disappearance of the ability of preventing the compounds from being dissolved, associated with carboxylic acids by light irradiation, and an improvement in alkali solubility of the novolak resins as a result thereof. Accordingly, a number of the photoresists have been developed and have come in practice, and sufficient results have been obtained for processing of a line width up to about 0.8 µm to about 2 µm.

However, integrated circuits have been progressively increased in their integration degree, and therefore processing of ultrafine patterns having a line width of a half micron or less has become necessary in the production of semiconductor substrates for very large scale integrated circuits. For fulfilling this necessity, the wavelength of light used in exposure devices employed for photolithography becomes progressively shorter, and now, of the far ultraviolet rays, the use of excimer laser light having a short wavelength (such as XeCl, KrF or ArF) has been studied.

In the pattern formation of lithography in this wavelength region, the absorption of the novolak resins and the naphthoquinonediazide compounds in the far ultraviolet region is so strong that light becomes difficult to arrive at the bottom portions of the resists. Accordingly, only patterns low in sensitivity and tapered are obtained. The novolak-naphthoquinonediazide resists are therefore insufficient.

One means for solving this problem is chemical amplification system resist compositions described in U.S. Pat. No. 4,491,628 and European Patent 249,139. The positive type chemical amplification system resist composition is a composition designed so as to produce an acid in an exposed area by irradiation of active light such as far ultraviolet rays and to change the solubility of the area irradiated with active light and an area not irradiated therewith in a developing solution by a reaction using this acid as a catalyst, thereby forming a pattern on a substrate.

Examples of such resins which are used in combination with the photo acid generators and changed in solubility with the acids include acetal or O,N-acetal compounds (JP-A-48-89003), orthoesters or amidoacetal compounds (JP-A-51-120714), polymers having acetal or ketal groups on main chains (JP-A-53-133429), enol ether compounds (JP-A-55-12995), N-acyliminocarboxylic acid compounds (JP-A-55-126236), polymers having orthoecter groups on main chains (JP-A-56-17345), tertiary alkyl ester compounds (JP-A-60-3625), silyl ester compounds (JP-A-60-10247) and silyl ether compounds (JP-A-60-37549 and JP-A-60-121446). These compounds exceed 1 in quantum yield in principle, so that they exhibit high photosensitivity.

Similarly, the systems which are stable at room temperature, but are decomposed in the presence of acids by heating to be solubilized in alkalis include, for example, combined systems of photo acid generators described in JP-A-59-45439, JP-A-60-3625, JP-A-62-229242, JP-A-63-27829, JP-A-63-36240 JP-A-63-250642, *Polym. Eng. Sci.*, 23, 1012 (1983), *ACS. Sym.*, 242, 11 (1984), *Semiconductor World*, November, 91 (1987), *Macromolecules*, 21, 1475 (1988) and *SPIE*, 920, 42 (1988), and esters of tertiary or secondary carbon (for example, t-butyl or 2-cyclohexenyl) or carbonic ester compounds. These systems also have high sensitivity and can be effective for the above-mentioned shortening of the wavelength of light sources, because of their lower absorption in the far ultraviolet region, compared with the novolak resin/naphthoquinonediazide systems.

In particular, there are proposed resist compounds comprising hydroxystyrene polymers particularly low in photoabsorption when the 248-nm light of a KrF excimer laser is used, into which acetal groups or ketal groups are introduced as protective groups. Examples thereof are described in JP-A-2-141636, JP-A-2-19847, JP-A-4-219757 and JP-A-5-281745. Besides, similar compositions having t-butoxycarbonyloxy groups or p-tetrahydropyranyloxy groups as acid decomposable groups are proposed in JP-A-2-209977, JP-A-3-206458 and JP-A-2-19847. However, these compositions substantially have the disadvantage of low sensitivity caused by too high absorbance when an ArF laser is used as a light source. Accompanied thereby, they further have the problems of deterioration of pattern profiles and lack of focus permissibility, so that many improvements are required.

As the photoresist compositions for the ArF light source, photoresist compositions in which (meth)acrylic resins smaller in absorption than partially hydrogenated hydroxystyrene resins are combined with compounds generating acids with light are proposed, for example, in JP-A-7-199467 and JP-A-7-252324. Above all, JP-A-6-289615 discloses resins in which organic groups of tertiary carbon are attached by ester linkages to oxygen of a carboxyl group of acrylic acid, and JP-A-7-234511 discloses copolymer resins comprising structural units in which dimethyl-substituted tertiary carbon groups are attached by ester linkages to oxygen of a carboxyl group of acrylic acid, and structural units in which alicyclic groups are attached by ester linkages. These resins have photoabsorptive aryl groups in carbon substituent groups, or are poor in acid decomposability although improved in light permeability to the ArP light source. Thus, resins exhibiting characteristics sufficiently satisfactory to the object have not been obtained yet.

Here, also with respect to the photo acid generators used in the positive type chemical amplification resists as described above, the prior art is described. The known photo acid generators include N-imidosulfonates, N-oximesulfonates, o-nitrobenzylsulfonates and pyrogallol trimethanesulfonate. Further, as the agents high in photolysis efficiency and excellent in image forming properties, sulfoniums and iodoniums are known. As counter bases thereto, perfluoro Lewis acid bases such as $PF_6^-$, $AsF_6^-$ and $SbF_6^-$, and further a trifluoromethanesulfonic acid anion and a toluenesulfonic acid anion are known. Furthermore, from the viewpoint of improving solvent solubility, benzenesulfonic acid, naphthalenesulfonic acid and anthracene-sulfonic acid each having one straight-chain alkyl group or alkoxyl group are also disclosed. However, all of them are not sufficiently overcome in drawbacks such as contamination with counter anion elements and thinning of resist patterns with time from exposure to heating treatment, and more improvements in sensitivity and resolution are desired.

SUMMARY OF THE INVENTION

It is therefore an object of the present invention to provide a positive type photoresist composition sufficiently suitable for light, particularly, within the wavelength region of 170 nm to 220 nm, highly sensitive to light, excellent in a resist pattern profile obtained, and excellent in adhesion to a substrate.

Another object of the present invention is to solve the problems of techniques improving the essential performance of the above-mentioned microphotofabrication using far ultraviolet rays, particularly excimer laser beams, namely to develop a resist composition satisfying required characteristics such as sensitivity, resolution and a pattern profile to the use of the shortwave light sources. Of these, a primary object of the present invention is to develop a photoresist composition particularly low in absorbance to an ArF excimer laser light source, therefore high in sensitivity, and accompanied thereby, also excellent in resolution and a pattern profile.

A further object of the present invention is to develop a photoresist composition having an acid decomposable group to which the above-mentioned tertiary carbon atom is attached by an ester linkage, which is improved in the prior-art disadvantages, namely low in absorbance and good in acid decomposability, therefore high in sensitivity, good in a pattern profile and excellent in storage stability, to an ArF excimer laser light source.

As a result of intensive studies in view of the above-mentioned various characteristics, the present inventors have discovered that the objects of the present invention can be successfully attained by using a resin comprising a group having a specific structure, thus completing the present invention.

Further, the present inventors have intensively studied materials constituting resist compositions in positive type chemical amplification systems. As a result, the present inventors have known that the objects can be attained by a combination of a (meth)acrylic resin containing structural units each having an acid decomposable substituent group of a specific structure and a photo acid generator, thus completing the present invention.

That is, the above-mentioned objects can be attained by the following constitution:

(1) A positive type photoresist composition comprising a resin having an ester group represented by the following general formula [I] in its molecule and a compound generating an acid by irradiation of an active light ray or radiation:

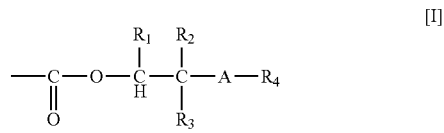

wherein $R_1$ represents a hydrogen atom, an alkyl group or a cycloalkyl group; and $R_2$ and $R_3$, which may be the same or different, each represents a hydrogen atom, an alkyl group, a cycloalkyl group or $-A-R_4$, and $R_2$ and $R_3$ may combine together to form a ring, wherein $R_4$ represents a hydrogen atom, an alkyl group or a cycloalkyl group, $R_4$ and $R_2$ or $R_3$ may combine together to form a ring, and A represents an oxygen atom or a sulfur atom.

(2) The positive type photoresist composition described in the above (1), wherein said resin is a resin containing repeating structural units represented by the following general formula [II]:

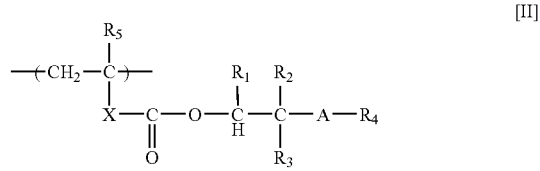

wherein $R_1$ to $R_4$ have the same meanings as given in the above (1); $R_5$ represents a hydrogen atom or a methyl group; and X represents one group selected from the group consisting of a single bond, an alkylene group, a substituted alkylene group, an ether group, a thioether group, a carbonyl group, an ester group, an amido group, a sulfonamido group, a urethane group and a urea group, or a combination of two or more of them.

(3) The positive type photoresist composition described in the above (1) or (2), wherein said resin further contains repeating structural units each having an alicyclic hydrocarbon moiety.

(4) The positive type photoresist composition described in the above (3), wherein said repeating structural units each having a alicyclic hydrocarbon moiety are repeating structural units represented by the following general formula [III]:

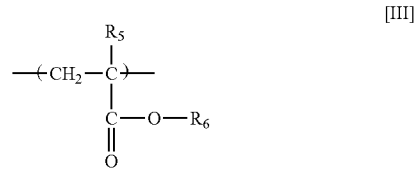

wherein $R_5$ has the same meaning as given in the above (2); and $R_6$ represents a monovalent alicyclic hydrocarbon group.

(5) The positive type photoresist composition described in the above (3), wherein said repeating structural units each having a alicyclic hydrocarbon moiety are repeating structural units represented by the following general formula [IV]:

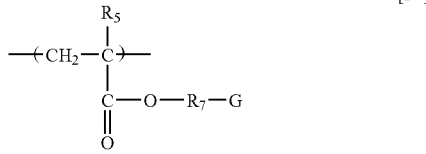

[IV]

wherein $R_5$ has the same meaning as given in the above (2); and $R_7$ represents a connecting group containing a divalent alicyclic hydrocarbon moiety; and G represents —COOH, —OH, —COOR$_8$ or —OR$_8$ wherein $R_8$ represents a tertiary alkyl group, a tetrahydropyranyl group, a tetrahydrofuranyl group, —CH$_2$OR$_9$ or —CH(CH$_3$)OR$_9$ wherein $R_9$ represents an alkyl group.

(6) A positive type photoresist composition comprising a resin which has an ester group represented by the following general formula [I-2] in its molecule and is decomposed by action of an acid to increase solubility in an alkali solution, and a compound generating an acid by irradiation of an active light ray or radiation:

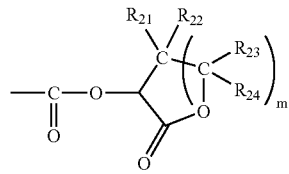

[I-2]

wherein $R_{21}$ to $R_{24}$, which may be the same or different, each represents a hydrogen atom or an alkyl group; and m represents 1 or 2.

(7) The positive type photoresist composition described in the above (6), wherein said resin is a resin which contains repeating structural units corresponding to a monomer represented by the following general formula [II-2] and is decomposed by action of an acid to increase solubility in an alkali solution:

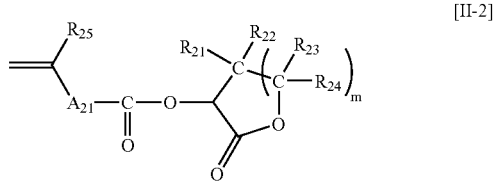

[II-2]

wherein $R_{21}$ to $R_{24}$ and m have the same meanings as given in the above (6); $R_{25}$ represents a hydrogen atom or a methyl group; and $A_{21}$ represents one group selected from the group consisting of a single bond, an alkylene group, a substituted alkylene group, an ether group, a thioether group, a carbonyl group, an ester group, an amido group, a sulfonamido group, a urethane group and a urea group, or a combination of two or more of them.

(8) The positive type photoresist composition described in the above (6) or (7), wherein said resin further contains repeating structural units each having an alicyclic hydrocarbon moiety.

(9) The positive type photoresist composition described in any one of the above (6) to (8), wherein said resin further contains repeating structural units each having a group which is decomposed by action of an acid to increase solubility in an alkali developing solution.

(10) A positive type photoresist composition for far ultraviolet ray exposure comprising a resin which is decomposed by action of an acid to increase solubility in an alkali solution, and a compound generating an acid by irradiation of an active light ray or radiation, wherein said resin is a polymer containing a monomer represented by the following general formula [I-3] as one of repeating structural units:

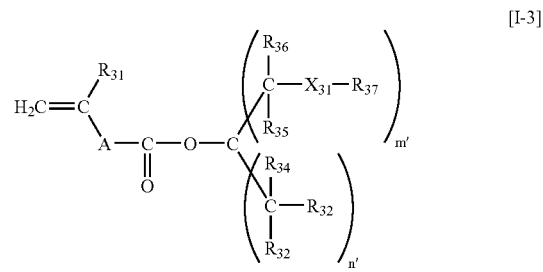

[I-3]

wherein $R_{31}$ represents a hydrogen atom or a methyl group; $R_{32}$ to $R_{34}$, which may be the same or different, each represents a hydrogen atom or an alkyl group; $R_{35}$ and $R_{36}$, which may be the same or different, each represents a hydrogen atom, an alkyl group or $X_{31}R_{37}$ wherein $R_{37}$ is a hydrogen atom or an alkyl group, and $X_{31}$ is an oxygen atom or a sulfur atom; $A_{31}$ represents one group selected from the group consisting of a single bond, an alkylene group, a substituted alkylene group, an ether group, an ester group, a thioether group, a carbonyl group, an amido group, a sulfonamido group, a urethane group and a urea group, or a combination of two or more of them; and m' is 1, 2 or 3, n' is 0, 1 or 2, and the sum of m' and n' is 3.

(11) The positive type photoresist composition described in the above (10), wherein said resin is a copolymer containing repeating units of a monomer represented by general formula [I-3] and a monomer having an alicyclic hydrocarbon moiety in its molecule.

(12) The positive type photoresist composition described in the above (10) or (11), wherein the active light ray or the radiation for exposure has a wavelength of 170 nm to 220 nm.

(13) The positive type photoresist composition described in the above (10) or (11), wherein said resin further contains repeating structural units each having a group which is decomposed by action of an acid to increase solubility in an alkali developing solution.

(14) The positive type photoresist composition described in any one of the above (10) to (12), wherein said composition is composed so as to give a transmission optical density of 1.0 or less per micron of coated layer in thickness to an active light ray having a wavelength of 193 nm.

(15) A positive type photoresist composition for far ultraviolet ray exposure comprising a resin which is decomposed by action of an acid to increase solubility in an alkali solution, and a compound generating an acid by irradiation of an active light ray or radiation, wherein said resin is a polymer containing a monomer represented by the following general formula [I-4] as one of repeating structural units:

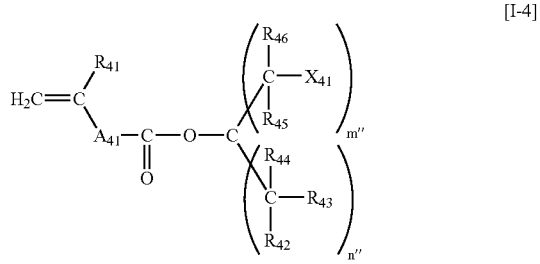

wherein $R_{41}$ represents a hydrogen atom or a methyl group; $R_{42}$ to $R_{44}$, which may be the same or different, each represents a hydrogen atom or an alkyl group; $R_{45}$ and $R_{46}$, which may be the same or different, each represents a hydrogen atom, an alkyl group or a halogen atom; $X_{41}$ represents a halogen atom; $A_{41}$ represents one group selected from the group consisting of a single bond, an alkylene group, a substituted alkylene group, an ether group, an ester group, a thioether group, a carbonyl group, an amido group, a sulfonamido group, a urethane group and a urea group, or a combination of two or more of them; and m" is 1, 2 or 3, n" is 0, 1 or 2, and the sum of m" and n" is 3.

(16) The positive type photoresist composition described in the above (15), wherein said resin is a copolymer containing repeating units of a monomer represented by general formula [I-4] and a monomer having an alicyclic hydrocarbon moiety in its molecule.

(17) The positive type photoresist composition described in the above (15) or (16), wherein the active light ray or the radiation for exposure has a wavelength of 170 nm to 220 nm.

(18) The positive type photoresist composition described in the above (15) or (16), wherein said resin further contains repeating structural units each having a group which is decomposed by action of an acid to increase solubility in an alkali developing solution.

(19) The positive type photoresist composition described in any one of the above (15) to (17), wherein said composition is composed so as to give a transmission optical density of 1.0 or less per micron of coated layer in thickness to an active light ray having a wavelength of 193 nm.

DETAILED DESCRIPTION OF THE INVENTION

The present invention will be described in detail below.

The alkyl groups represented by $R_1$ to $R_3$ in general formula [I] are preferably lower alkyl groups such as methyl, ethyl, propyl, isopropyl, butyl, isobutyl and sec-butyl, more preferably, methyl, ethyl, propyl, isopropyl and butyl, and most preferably methyl and ethyl. The cycloalkyl groups include cyclopentyl, cyclohexyl and cyclooctyl, and preferably, cyclopentyl and cyclohexyl.

The alkyl groups represented by $R_4$ are preferably alkyl groups each having 1 to 8 carbon atoms, more preferably alkyl groups having 1 to 6 carbon atoms, and most preferably methyl, ethyl, propyl and butyl groups. The cycloalkyl groups include cyclopentyl, cyclohexyl and cyclooctyl groups, and preferably, cyclopentyl and cyclohexyl groups.

$R_2$ and $R_3$, or $R_4$ and $R_2$ or $R_3$ may combine together by an alkylene chain to form a ring. Such rings include cyclopentyl, cyclohexyl and cyclooctyl groups.

A is preferably a sulfur atom, although the details thereof are unknown.

The group represented by general formula [I] contains a protective group, is excellent in eliminating ability of a protective group moiety according to an acid generated with a photo acid generator, and is not excessively decomposed during storage. Accordingly, the high sensitivity is compatible with the excellent aging storage stability in the resist composition using the resin containing that group.

Raw material resins for the resins containing the groups represented by the above-mentioned general formula [I] may be any, as long as they provide the effects of the present invention.

In the present invention, as the resins containing the groups represented by general formula [I], the resins containing the repeating structural units represented by the above-mentioned general formula [II] are preferred. These resins can be obtained, for example, by radical polymerization of monomers corresponding to the repeating structural units represented by the above-mentioned general formula [II].

X in the above-mentioned general formula [II] is a single bond, or one group selected from an alkylene group, a substituted alkylene group, an ether group, a thioether group, a carbonyl group, an ester group, an amido group, a sulfonamido group, a urethane group and a urea group, or a combination of two or more of them. The alkylene groups and the substituted alkylene groups include groups shown below:

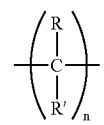

wherein R and R', which may be the same or different, each represents a hydrogen atom, an alkyl group, a substituted alkyl group, a halogen atom, a hydroxyl group or an alkoxyl group. The alkyl groups are preferably lower alkyl groups such as methyl, ethyl, propyl, isopropyl and butyl, and more preferably, methyl, ethyl, propyl and isopropyl. Substituent groups of the substituted alkyl groups include halogen atoms and hydroxyl and alkoxyl groups. The alkoxyl groups include groups having 1 to 4 carbon atoms such as methoxy, ethoxy, propoxy and butoxy. n represents an integer of 1 to 10.

Of the above, X is particularly preferably a single bond, or one group selected from an alkylene group, a substituted alkylene group, an ether group, a thioether group, a carbonyl group and an ester group, or a combination of two or more of them. The alkylene groups are preferably alkylene groups each having 1 to 4 carbon atoms herein, and specific examples thereof include methylene, ethylene, propylene, butylene, methyl-substituted methylene, dimethyl-substituted methylene, methyl-substituted ethylene, dimethyl-substituted ethylene, methyl-substituted propylene and dimethyl-substituted propylene.

Preferred examples of the repeating structural units represented by general formula [II] include repeating structural units represented by the following general formulas [II-A] to [II-K]:

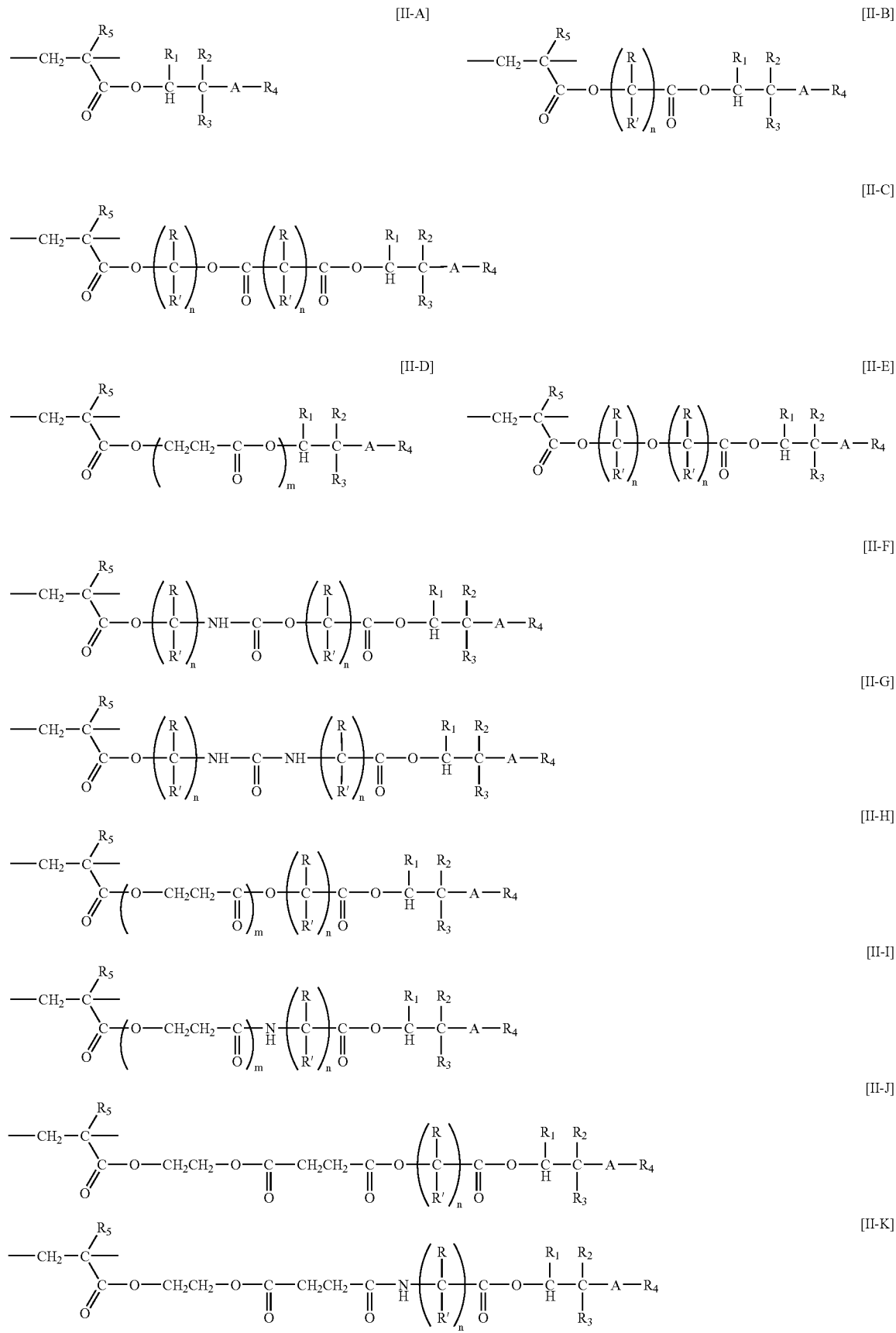

In the above-mentioned general formulas, $R_1$ to $R_5$, R, R', A and n have the same meanings as given above, and m represents an integer of 1 to 3.

Specific examples of monomers corresponding to the repeating structural units represented by general formula [II] are enumerated below, but do not limit the scope of the present invention:

[II-A-1]
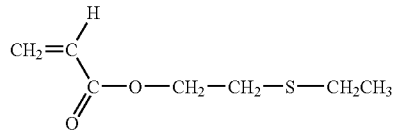

[II-A-2]
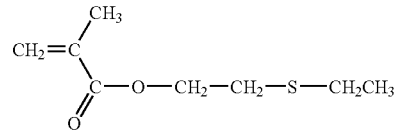

[II-A-3]
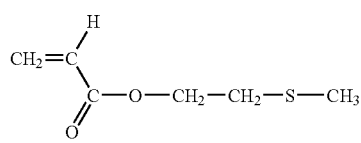

[II-A-4]
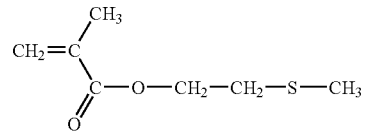

[II-A-5]
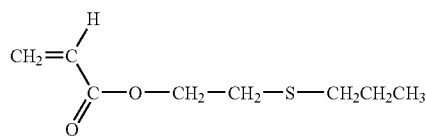

[II-A-6]
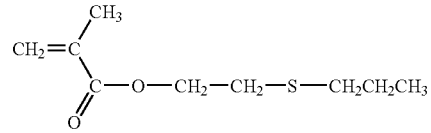

[II-A-7]
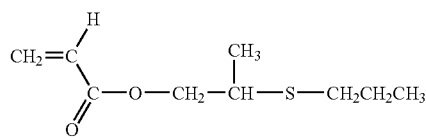

[II-A-8]
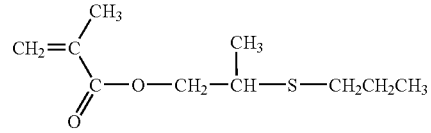

[II-A-9]
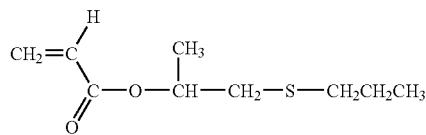

[II-A-10]
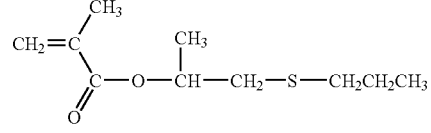

[II-A-11]
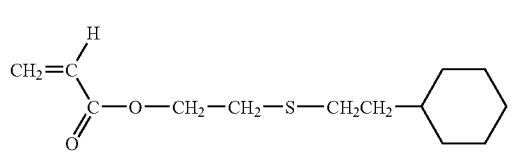

[II-A-12]
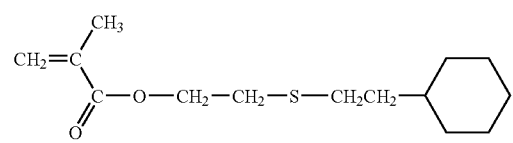

[II-A-13]
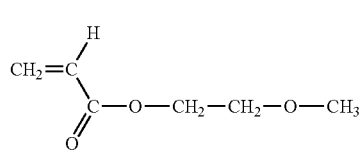

[II-A-14]
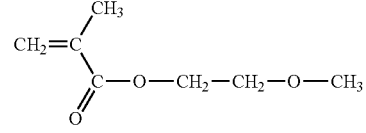

[II-A-15]
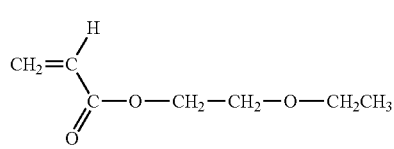

[II-A-16]
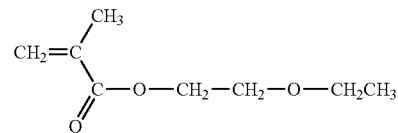

[II-A-17]
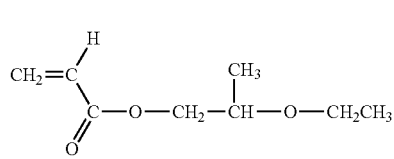

[II-A-18]

-continued
[II-A-19]
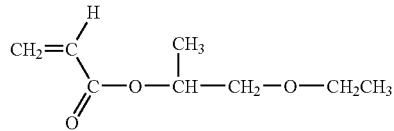
[II-A-20]
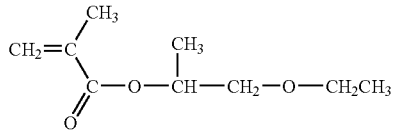
[II-B-1]
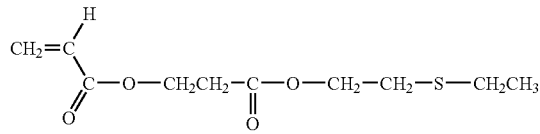
[II-B-2]
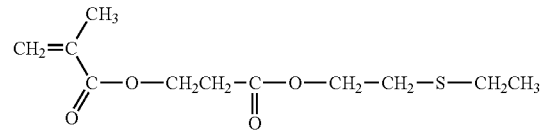
[II-B-3]
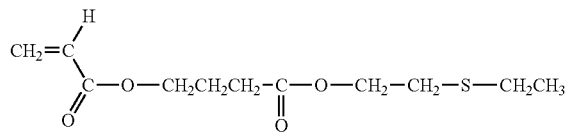
[II-B-4]
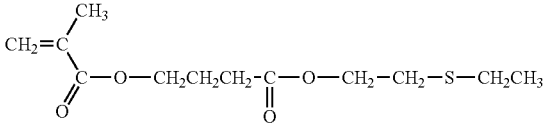
[II-B-5]
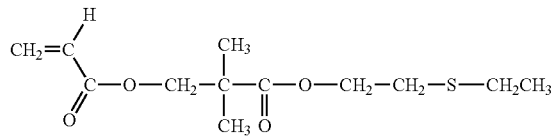
[II-B-6]
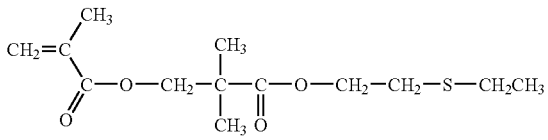
[II-B-7]
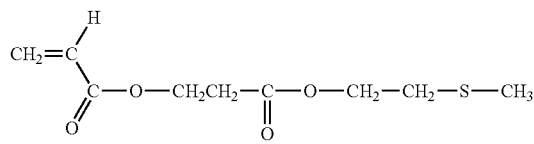
[II-B-8]
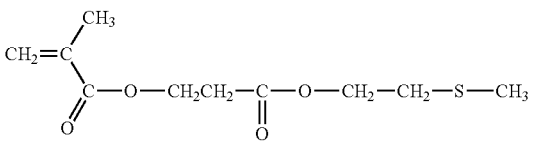
[II-B-9]
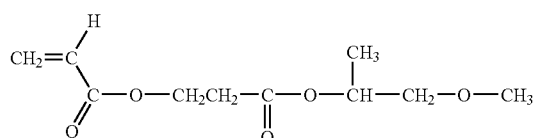
[II-B-10]
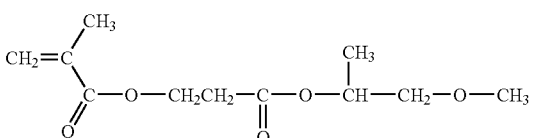
[II-C-1]
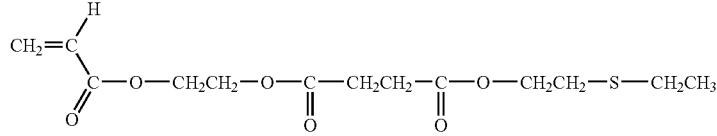
[II-C-2]
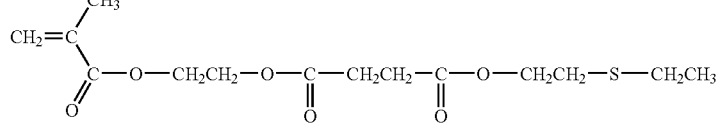
[II-C-3]
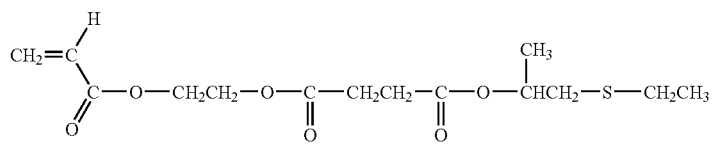

-continued
[II-C-4]
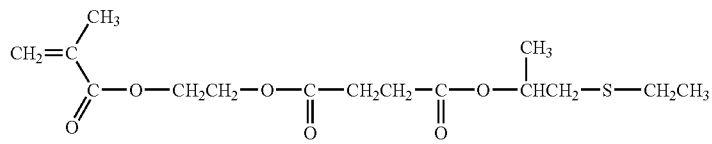
[II-C-5]
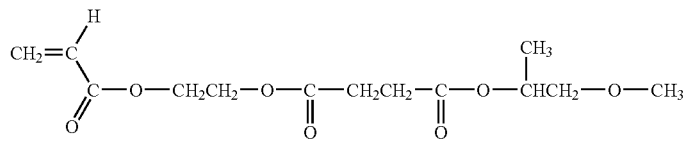
[II-C-6]
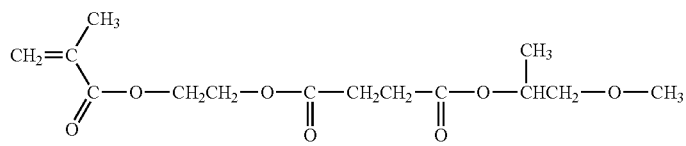
[II-C-7]
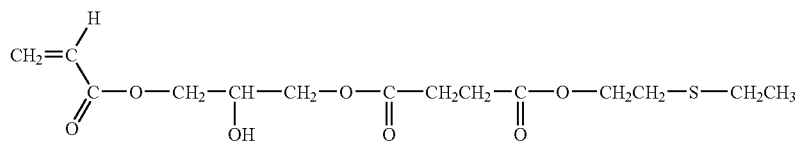
[II-C-8]
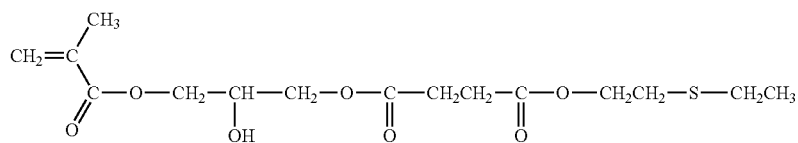
[II-C-9]
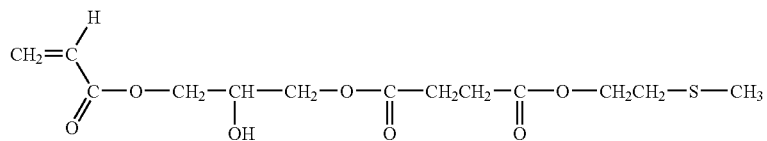
[II-C-10]
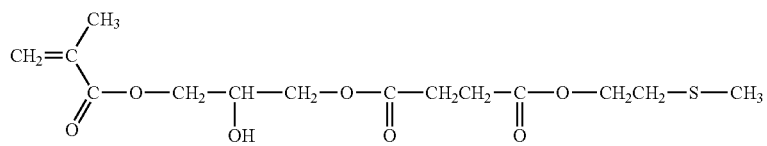
[II-D-1]
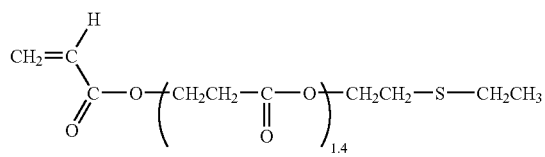
[II-D-2]
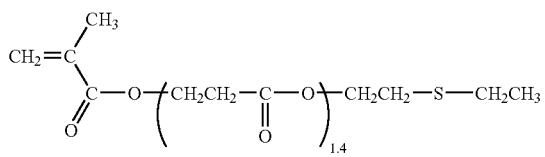
[II-D-3]
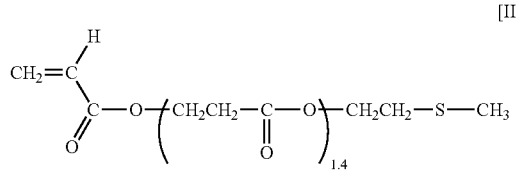
[II-D-4]
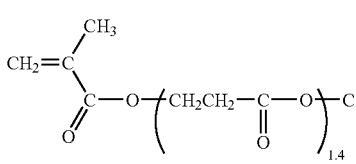

-continued
[II-D-5]
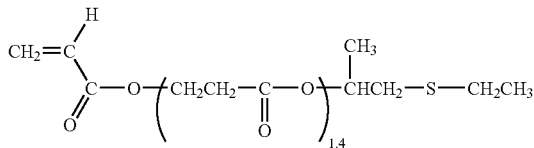
[II-D-6]
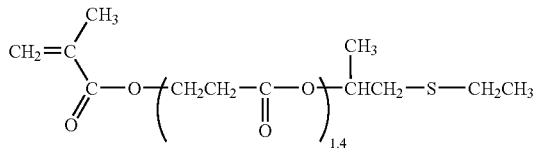
[II-D-7]
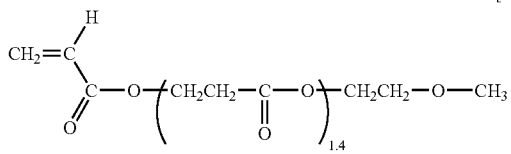
[II-D-8]
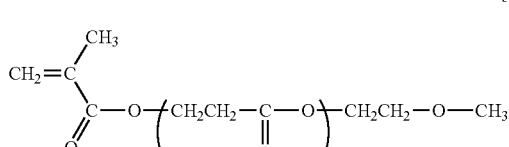
[II-D-9]
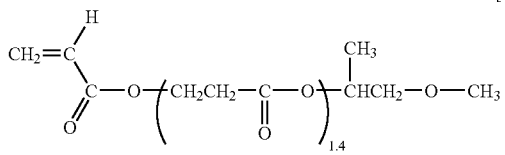
[II-D-10]
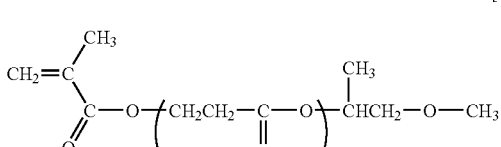
[II-E-1]
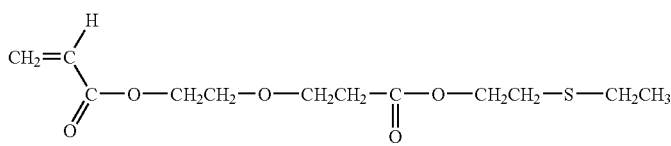
[II-E-2]
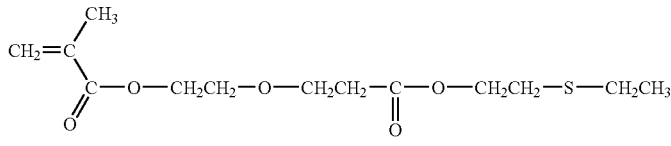
[II-E-3]
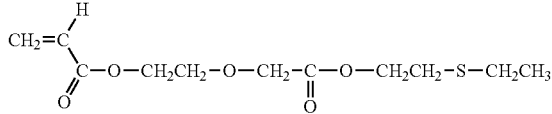
[II-E-4]
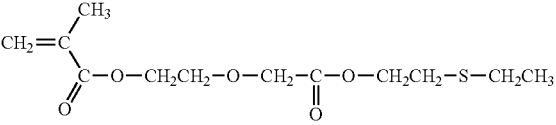
[II-E-5]
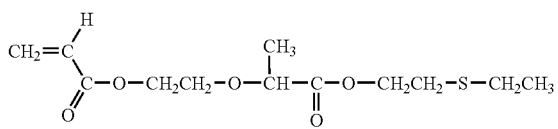
[II-E-6]
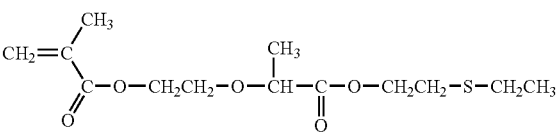
[II-E-7]
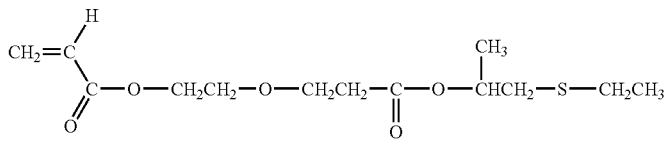
[II-E-8]
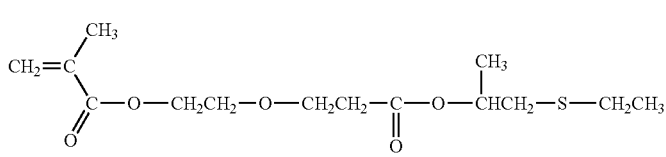

-continued
[II-E-9] 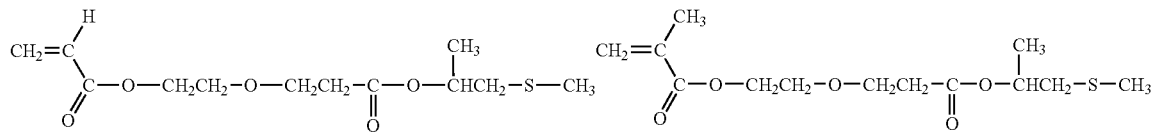 [II-E-10]
[II-F-1]
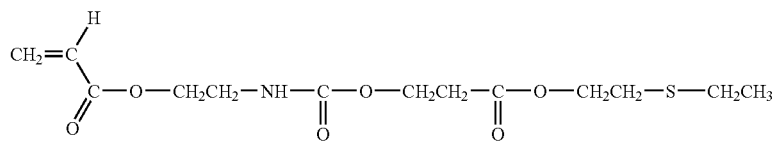
[II-F-2]
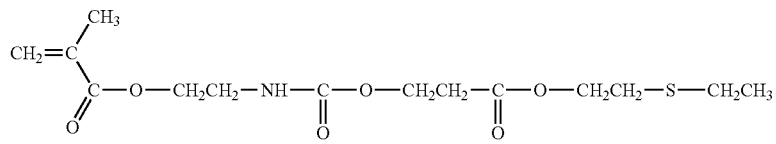
[II-F-3]
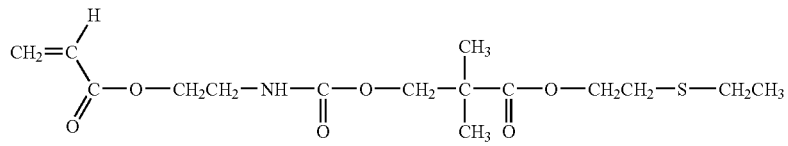
[II-F-4]
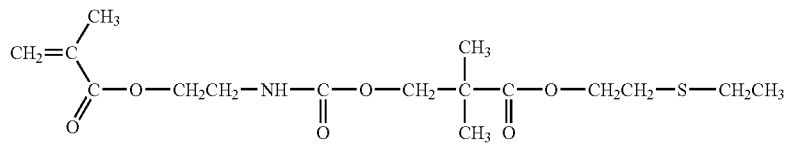
[II-F-5]
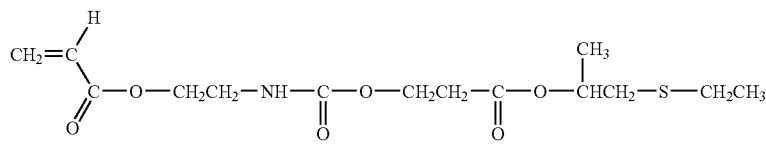
[II-F-6]
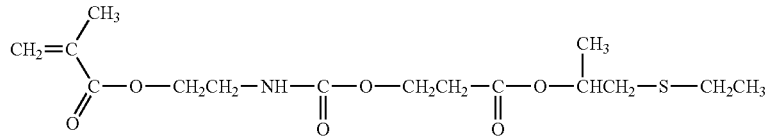
[II-F-7]
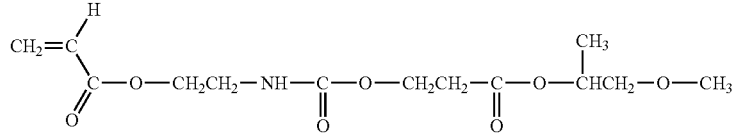
[II-F-8]
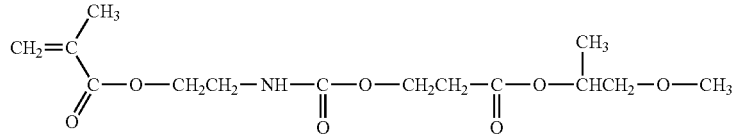
[II-F-9]
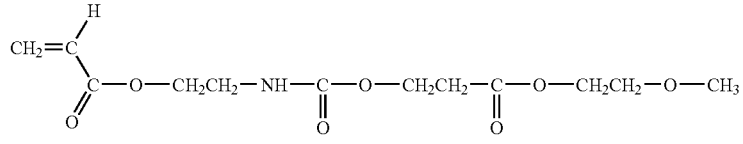

-continued
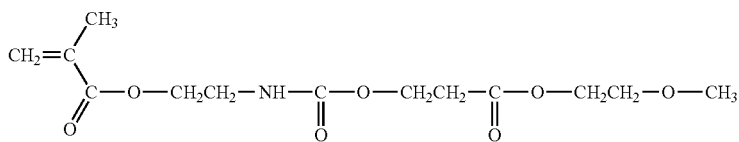
[II-F-10]
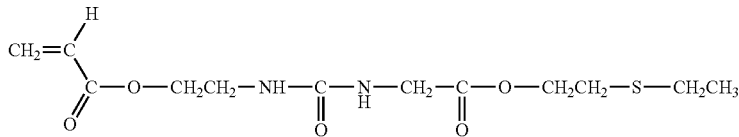
[II-G-1]
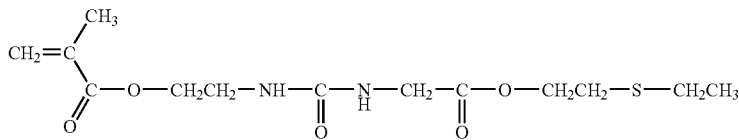
[II-G-2]
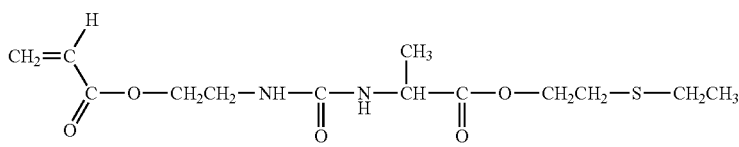
[II-G-3]
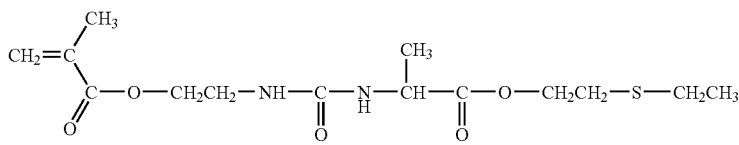
[II-G-4]
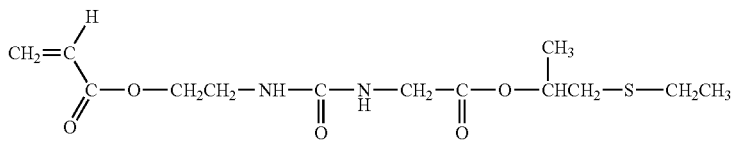
[II-G-5]
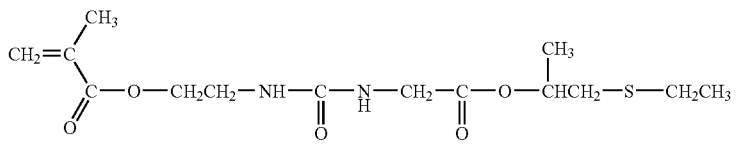
[II-G-6]
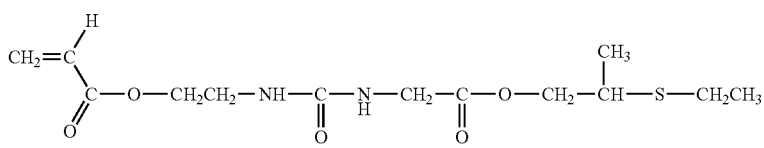
[II-G-7]
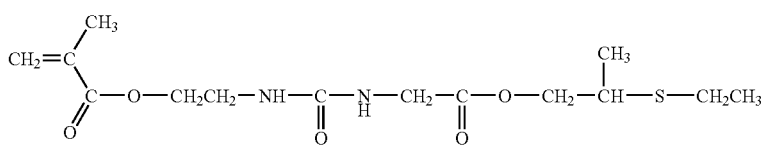
[II-G-8]
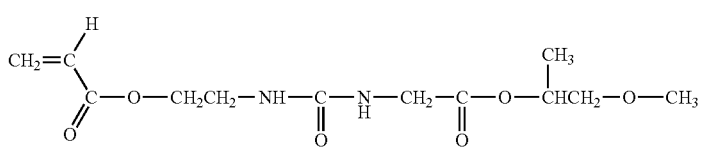
[II-G-9]

[II-G-10]
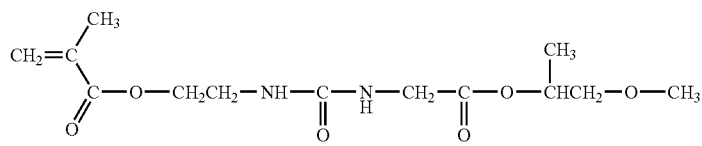
[II-H-1]
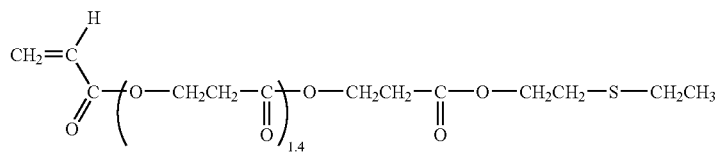
[II-H-2]
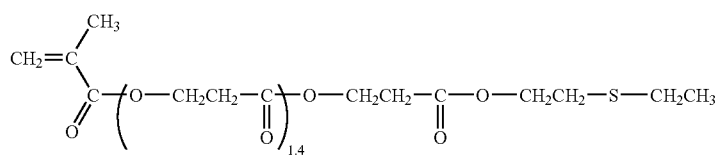
[II-H-3]
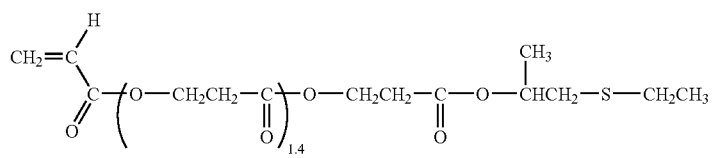
[II-H-4]
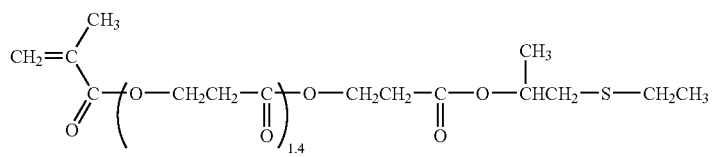
[II-H-5]
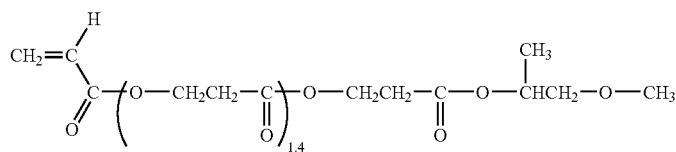
[II-H-6]
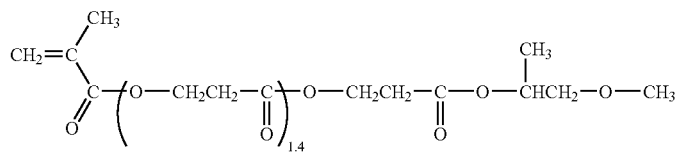
[II-I-1]
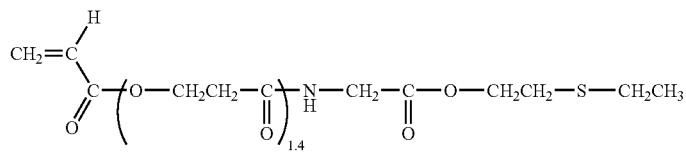
[II-I-2]
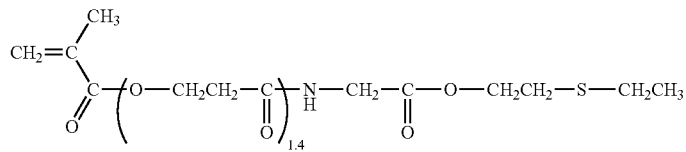

-continued
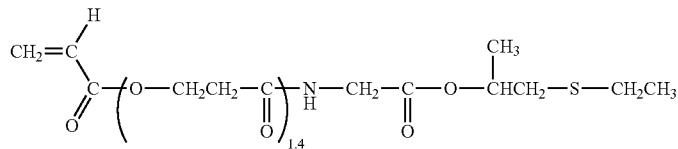
[II-I-3]
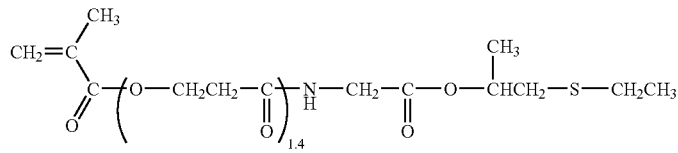
[II-I-4]
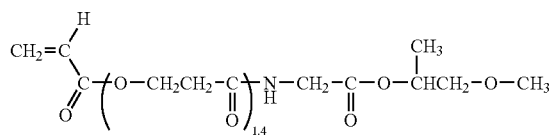
[II-I-5]
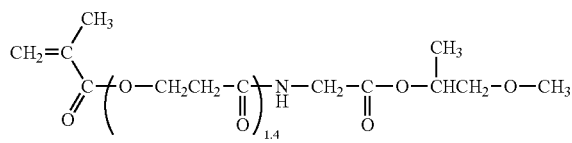
[II-I-6]
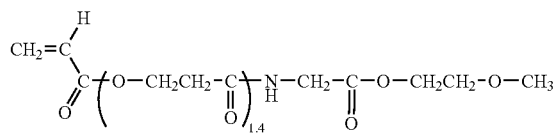
[II-I-7]
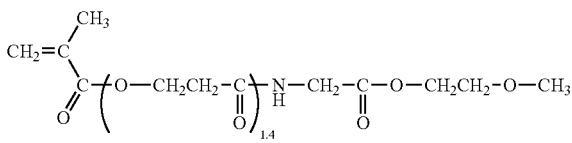
[II-I-8]
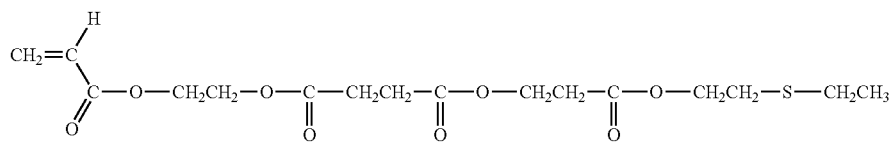
[II-J-1]
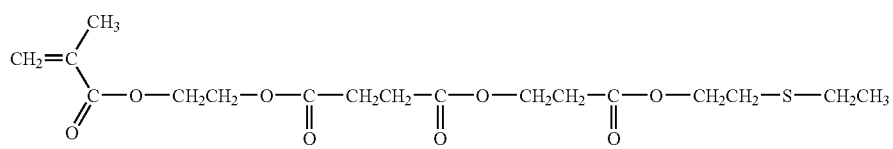
[II-J-2]
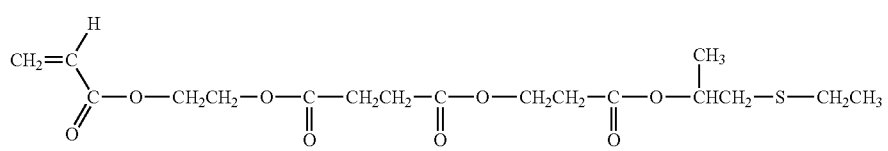
[II-J-3]
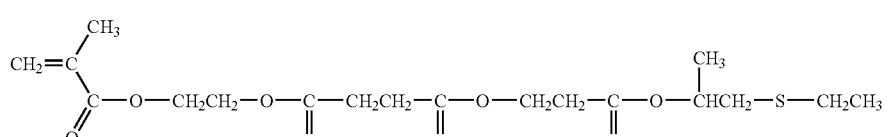
[II-J-4]
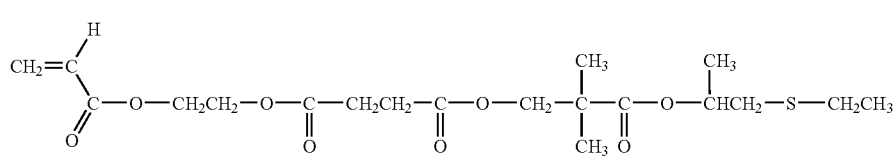
[II-J-5]

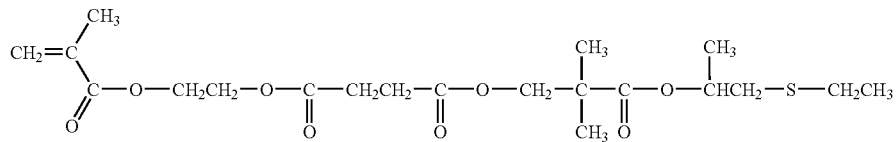
[II-J-6]
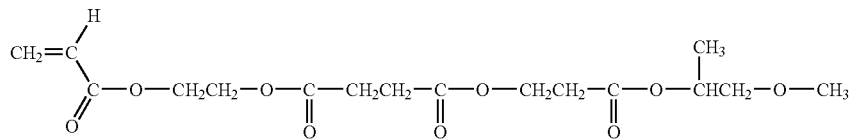
[II-J-7]
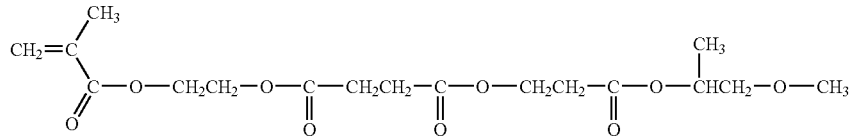
[II-J-8]
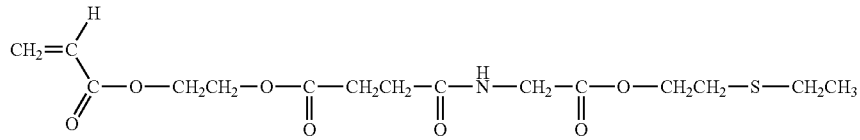
[II-K-1]
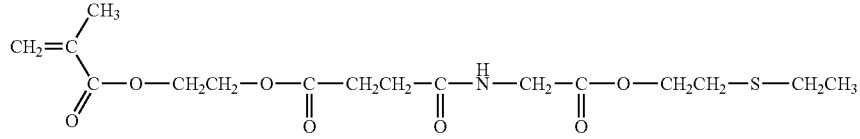
[II-K-2]
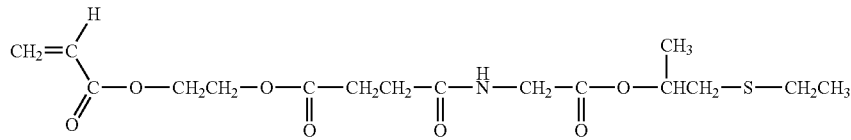
[II-K-3]
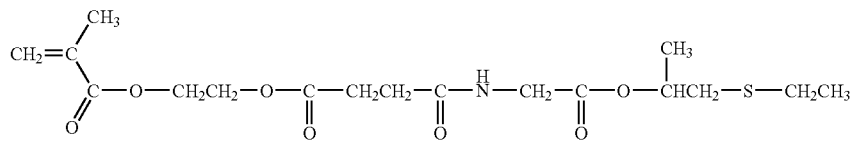
[II-K-4]
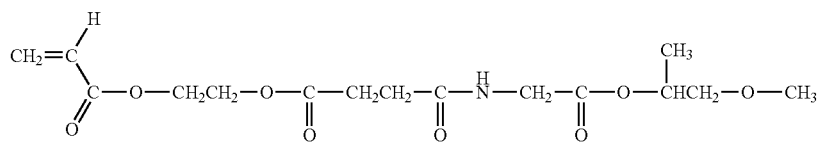
[II-K-5]
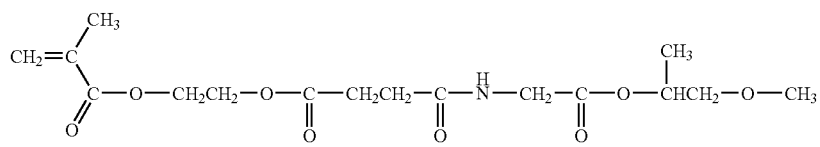
[II-K-6]

Such monomers corresponding to the repeating structural units represented by general formula [II] can be generally obtained by reacting carboxylic anhydrides having radical-polymerizable carbon-carbon bonds or carboxylic acid chlorides with alkoxy- or mercapto-substituted alcohol compounds under basic conditions.

It is preferred that the resins used in the positive type photoresist compositions of the present invention contain the repeating units having alicyclic hydrocarbon moieties in their molecules, as well as the groups represented by the above-mentioned general formula [I]. This can enhance the resistance to dry etching of the positive photoresists. The repeating structural units having alicyclic hydrocarbon moieties in their molecules include, for example, repeating structural units represented by the above-mentioned general formulas [III] and [IV].

$R_6$ in general formula [III] is a monovalent alicyclic hydrocarbon group. Specifically, such groups include an adamantyl group, a 2-methyl-2-adamantyl group, a norbornyl group, a bornyl group, an isobornyl group, a tricyclodecanyl group, a dicyclopentenyl group, a norbornaneepoxy group, a menthyl group, an isomenthyl group and a neomenthyl group.

In general formula [IV], $R_7$ is a connecting group having a divalent alicyclic hydrocarbon moiety. The alicyclic hydrocarbon moieties contained in the connecting groups represented by $R_7$ include, for example, the following structures:

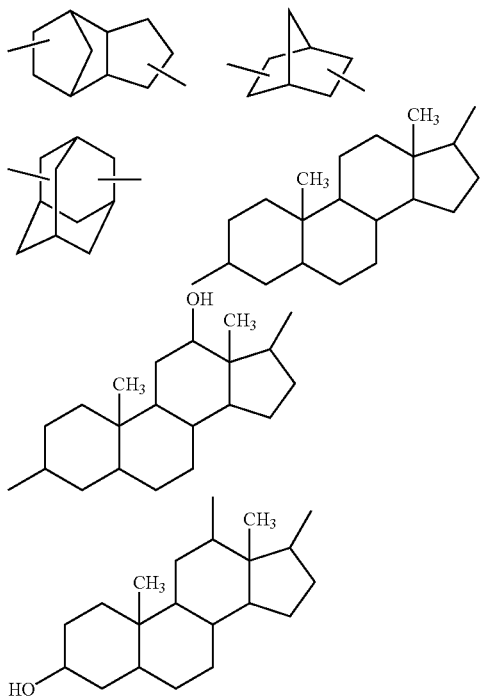

The connecting group in $R_7$ connecting the above-mentioned alicyclic hydrocarbon moiety and the ester group, or above-mentioned alicyclic hydrocarbon moiety and the group represented by G, which may be a single bond, includes one group selected from an alkylene group, an ether group, a thioether group, a carbonyl group, an ester group, an amido group and a sulfonamide group, or a combination of two or more of them.

$R_8$ in the —$COOR_8$ or —$OR_8$ group represents a substituent group decomposable by the action of an acid. Examples of such groups include tertiary alkyl groups such as t-butyl and t-amyl, 1-alkoxyethyl groups such as tetrahydropyranyl, tetrahydrofuranyl, —$CH(CH_3)OCH_2CH_3$ and —$CH(CH_3)OCH_2CH(CH_3)_2$, and alkoxymethyl groups such as —$CH_2OCH_3$ and —$CH_2OCH_2CH_3$.

In the above-mentioned resins, the content of the repeating structural units containing the groups represented by general formula [I] is preferably 5 mol % to 80 mol %, and more preferably 10 mol % to 70 mol %, based on the total repeating units. Less than 5 mol % is unfavorable because the effect of the present invention is difficult to be achieved. Exceeding 80 mol % unfavorably results in liability to deteriorate the resistance to dry etching.

The content of the repeating structural units having alicyclic hydrocarbon moieties in their molecules contained in the resins is 20 mol % to 95 mol %, and preferably 30 mol % to 90 mol %, based on the total repeating units.

The above-mentioned resins used in the present invention may further contain repeating structural units corresponding to the following conventional monomers containing acid decomposable groups other than the groups represented by general formula [I].

Examples of the conventional monomers include t-butyl acrylate, t-butyl methacrylate, t-amyl acrylate, t-amyl methacrylate, tetrahydrofuranyl acrylate, tetrahydrofuranyl methacrylate, tetrahydropyranyl acrylate, tetrahydropyranyl methacrylate, alkoxymethyl acrylate, alkoxymethyl methacrylate and 1-alkoxyethyl methacrylate.

In the above-mentioned resins, the content of the repeating structural units corresponding to such conventional monomers having acid decomposable groups is preferably 99 mol % or less, more preferably 90 mol % or less, and most preferably 80 mol % or less, based on the total molar number of the repeating structural units having the groups represented by the above-mentioned general formula [I]. Exceeding 99 mol % is unfavorable because the effect of the present invention is not sufficiently manifested.

Such resins can be further copolymerized with the following monomers as repeating units within the range in which the effect of the present invention can be effectively obtained. However, the present invention is not limited thereto.

This enables fine adjustment of properties required for the above-mentioned resins, particularly (1) solubility in coating solvents, (2) film forming properties (glass transition temperature), (3) alkali developing properties, (4) film thickness loss (hydrophilic and hydrophobic properties, selection of alkali-soluble groups), (5) adhesion of unexposed areas to substrates and (6) resistance to dry etching.

Such monomers for copolymerization include, for example, compounds each having one addition-polymerizable unsaturated bond, selected from acrylic esters, methacrylic esters, acrylamide compounds, methacrylamide compounds, allyl compounds, vinyl ethers and vinyl esters.

Specifically, examples of the acrylic esters include alkyl acrylates (wherein alkyl groups each preferably has 1 to 10 carbon atoms) (such as methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimetylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate).

Examples of the methacrylic esters include alkyl methacrylates (wherein alkyl groups each preferably has 1 to 10 carbon atoms) (such as methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate).

Examples of the acrylamide compounds include acrylamide, N-alkylacrylamides (wherein alkyl groups each preferably has 1 to 10 carbon atoms, for example, methyl, ethyl, propyl, butyl, t-butyl, heptyl, octyl, cyclohexyl and hydroxyethyl), N,N-dialkylacrylamides (wherein alkyl groups each preferably has 1 to 10 carbon atoms, for example, methyl, ethyl, butyl, isobutyl, ethylhexyl and cyclohexyl), N-hydroxyethyl-N-methylacrylamide and N-2-acetamidoethyl-N-acetylacrylamide.

Examples of the methacrylamide compounds include methacrylamide, N-alkylmethacrylamides (wherein alkyl groups each preferably has 1 to 10 carbon atoms, for example, methyl, ethyl, t-butyl, ethylhexyl, hydroxyethyl and cyclohexyl), N,N-dialkylmethacrylamides (wherein alkyl groups are, for example, ethyl, propyl and butyl) and N-hydroxyethyl-N-methylmethacrylamide.

Examples of the allyl compounds include allyl esters (such as allyl acetate, allyl caproate, allyl caprylate, allyl laurate, allyl palmitate, allyl stearate, allyl benzoate, allyl acetoacetate and allyl lactate) and allyloxyethanol.

Examples of the vinyl ethers include alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether).

Examples of the vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate.

The monomers also include dialkyl itaconates (such as dimethyl itaconate, diethyl itaconate and dibutyl itaconate), dialkyl esters of maleic acid or fumaric acid (such as dimethyl maleate and dibutyl fumarate) and monoalkyl esters thereof, acrylic acid, methacrylic acid, crotonic acid, itaconic acid, maleic anhydride, maleimide, acrylonitrile, methacrylonitrile and maleylonitrile.

In addition, any monomers may be used, as long as they are addition-polymerizable unsaturated compounds copolymerizable with the repeating structural units represented by general formula [I].

The content of the repeating structural units corresponding to the additional monomers as described above is preferably 99 mol % or less, more preferably 90 mol % or less, and most preferably 80 mol % or less, based on the total molar number of the repeating structural units represented by general formula [I] and the repeating structural units having alicyclic hydrocarbon moieties. Exceeding 99 mol % is unfavorable because the effect of the present invention is not sufficiently manifested.

The above-mentioned resins can be represented, for example, by the following general formula [V], but the scope of the present invention is not limited thereto.

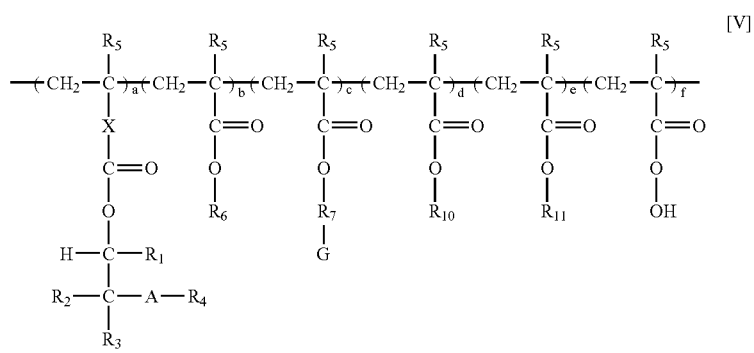

wherein $R_1$ to $R_7$, A, X and G have the same meanings as given above; $R_{10}$ represents a tertiary alkyl group, a tetrahydropyranyl group, a tetrahydrofuranyl group, an alkoxyethyl group, an alkoxymethyl group, a 3-oxocyclohexyl group, or a 2-oxocyclohexyl group; $R_{11}$ represents a methyl group, an ethyl group, a propyl group, an iso-propyl group or a n-butyl group; a is 5 to 80; b is 0 to 70; c is 0 to 95; d, e and f are each 0 to 50; $a+d \geq 30$; $b+c \geq 50$; $a+b+c+d+e+f=100$; $a>d$; and $a+b+c>e+f$.

The weight-average molecular weight of the above-mentioned resins used in the present invention is preferably 2,000 to 200,000. If the weight-average molecular weight is less than 2,000, deterioration in heat resistance and resistance to dry etching is unfavorably observed. Exceeding 200,000 brings about unfavorable results such as deterioration in developing properties, and deterioration in film forming properties caused by an extreme increase in viscosity.

The resins used in the present invention can be synthesized by usual methods including radical polymerization using azo compounds as initiators.

The positive type photoresist compositions of the present invention mainly contain the above-mentioned resins and photo acid generators. The amount of the resin added to the whole composition is 40% to 99% by weight, and preferably 50% to 97% by weight, based on the total solid content of the resist.

The alkyl groups represented by $R_{21}$ to $R_{24}$ in general formula [I-2] are preferably lower alkyl groups such as methyl, ethyl, propyl, isopropyl, butyl, isobutyl and sec-butyl, more preferably, methyl, ethyl, propyl, isopropyl and butyl, and most preferably methyl and ethyl.

m represents 1 or 2, and preferably 1.

Raw material resins for the resins containing the groups represented by the above-mentioned general formula [I-2] may be any, as long as they provide the effects of the present invention.

In the present invention, as the resins containing the groups represented by general formula [I-2], the resins containing the repeating structural units represented by the above-mentioned general formula [II-2] are preferred. These resins can be obtained, for example, by radical polymerization of monomers corresponding to the repeating structural units represented by the above-mentioned general formula [II-2].

$A_{21}$ in the above-mentioned general formula [II-2] is a single bond, or one group selected from an alkylene group, a substituted alkylene group, an ether group, a thioether group, a carbonyl group, an ester group, an amido group, a sulfonamido group, a urethane group and a urea group, or a combination of two or more of them. The alkylene groups and the substituted alkylene groups represented by $A_{21}$ include groups shown below:

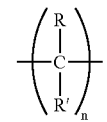

wherein R and R', which may be the same or different, each represents a hydrogen atom, an alkyl group, a substituted alkyl group, a halogen atom, a hydroxyl group or an alkoxyl group. The alkyl groups are preferably lower alkyl groups such as methyl, ethyl, propyl, isopropyl and butyl, and more preferably, methyl, ethyl, propyl and isopropyl. Substituent groups of the substituted alkyl groups include halogen atoms and hydroxyl and alkoxyl groups. The alkoxyl groups include groups having 1 to 4 carbon atoms such as methoxy, ethoxy, propoxy and butoxy. n represents an integer of 1 to 10.

Of the above, $A_{21}$ is particularly preferably a single bond, or one group selected from an alkylene group, a substituted alkylene group, an ether group, an ester group, an amido group, a urethane group and a urea group, or a combination of two or more of them. The alkylene groups and the substituted alkylene groups are preferably alkylene groups each having 1 to 4 carbon atoms herein, and specific examples thereof include methylene, ethylene, propylene, butylene, methyl-substituted methylene, dimethyl-substituted methylene, methyl-substituted ethylene, dimethyl-substituted ethylene, methyl-substituted propylene and dimethyl-substituted propylene.

Preferred examples of the monomers represented by general formula [II-2] include monomers represented by the following general formulas [II-A'] to [II-I']:

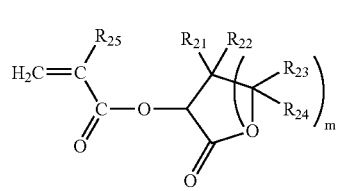
[II-A']

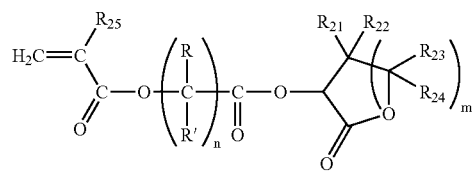
[II-B']

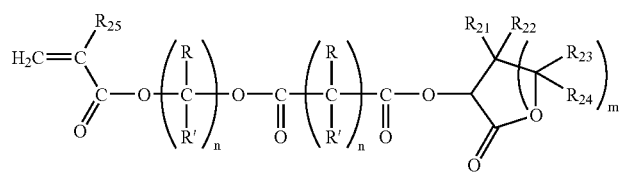
[II-C']

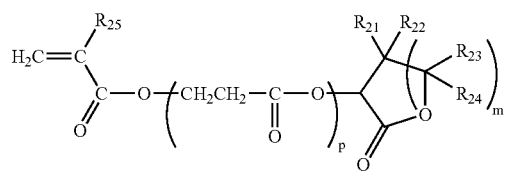
[II-D']

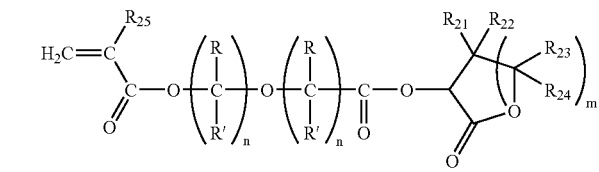
[II-E']

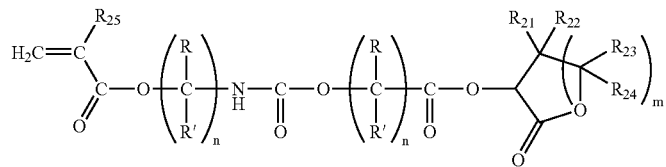
[II-F']
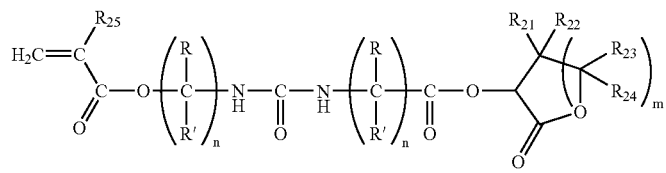
[II-G']
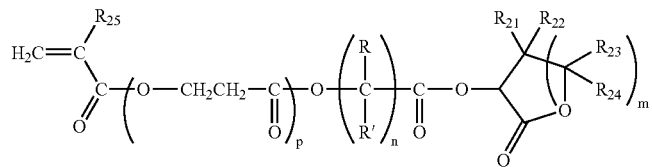
[II-H']
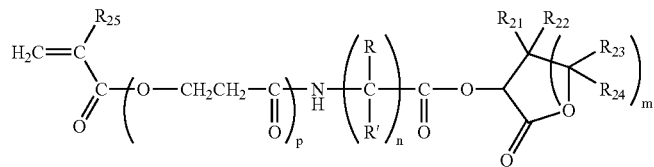
[II-I']
In the above-mentioned general formulas, $R_{21}$ to $R_{25}$, R, R', n and m have the same meanings as given above, and p represents an integer of 1 to 3.
Specific examples of the monomers represented by general formula [II] are enumerated below, but do not limit the scope of the present invention:
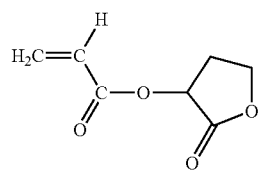
[II-A'-1]
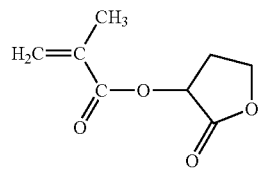
[II-A'-2]
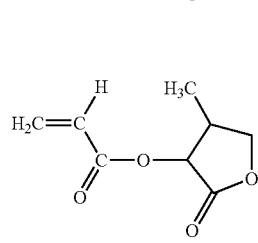
[II-A'-3]
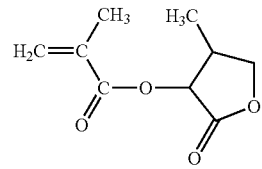
[II-A'-4]
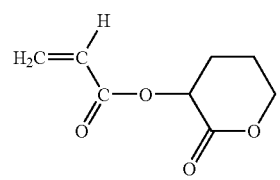
[II-A'-5]
[II-A'-6]
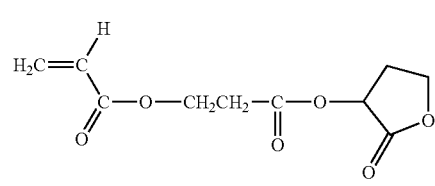
[II-B'-1]

-continued

-continued

-continued

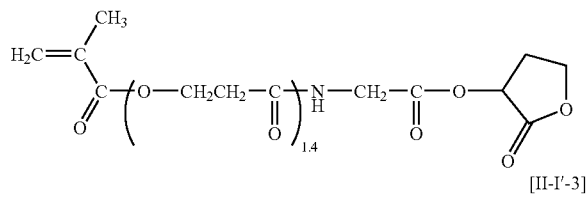

[II-I'-2]

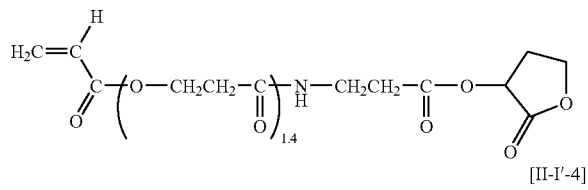

[II-I'-3]

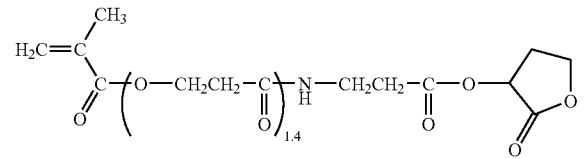

[II-I'-4]

Such monomers represented by general formula [II-2] can be synthesized by esterifying carboxylic acids having radical-polymerizable carbon-carbon bonds in their molecules with 2-hydroxylactones by the method described in *Angew. Chem. int. Ed. Engl.*, 17, 522 (1978), or by reacting the corresponding carboxylic acid chlorides with 2-hydroxylactones under basic conditions.

It is preferred that the resins used in the positive type photoresist compositions of the present invention contain the repeating units having alicyclic hydrocarbon moieties in their molecules, as well as the groups represented by the above-mentioned general formula [I]. This can enhance the resistance to dry etching of the positive photoresists. The repeating structural units having alicyclic hydrocarbon moieties in their molecules include, for example, repeating structural units represented by the above-mentioned general formulas [III] and [IV].

In the above-mentioned resins, the content of the repeating structural units containing the groups represented by general formula [I-2] is preferably 3 mol % to 60 mol %, and more preferably 5 mol % to 50 mol %, based on the total repeating units. Less than 3 mol % is unfavorable because the effect of the present invention is difficult to be achieved. Exceeding 60 mol % unfavorably results in liability to deteriorate the resistance to dry etching.

The content of the repeating structural units having alicyclic hydrocarbon moieties in their molecules contained in the resins is 40 mol % to 97 mol %, and preferably 50 mol % to 95 mol %, based on the total repeating units.

It is preferred that the above-mentioned resins used in the present invention further contain groups which are decomposed by the action of acids to increase solubility in alkali developing solutions (also referred to as acid decomposable groups), in addition to the repeating structural units having alicyclic hydrocarbon moieties. This makes the effect of improving sensitivity more significant.

Preferred examples of such acid decomposable groups include —COOR$_8$, —OR$_8$, a 3-oxocyclohexyl group and a 2-oxocyclohexyl group as described above.

Specifically, examples thereof include repeating structural units corresponding to conventional monomers such as t-butyl acrylate, t-butyl methacrylate, t-amyl acrylate, t-amyl methacrylate, tetrahydrofuranyl acrylate, tetrahydrofuranyl methacrylate, tetrahydropyranyl acrylate, tetrahydropyranyl methacrylate, alkoxymethyl acrylate, alkoxymethyl methacrylate, 1-alkoxyethyl methacrylate, 3-oxocyclohexyl acrylate, 3-oxocyclohexyl methacrylate, 2-oxocyclohexyl acrylate and 2-oxocyclohexyl methacrylate.

As to the content of the repeating structural units corresponding to the monomers having such conventional acid decomposable groups in the above-mentioned resins, the conventional acid decomposable groups/repeating structural units having groups represented by the above-mentioned general formula [I] is preferably 6/1 or less, and more preferably 3/1 or less. If this value exceeds 6/1, the effect of the present invention is not sufficiently manifested to bring about an unfavorable result.

Such resins can be further copolymerized with the following monomers as repeating units within the range in which the effect of the present invention can be effectively obtained. However, the present invention is not limited Cello thereto.

This enables fine adjustment of properties required for the above-mentioned resins, particularly (1) solubility in coating solvents, (2) film forming properties (glass transition temperature), (3) alkali developing properties, (4) film thickness loss (hydrophilic and hydrophobic properties, selection of alkali-soluble groups), (5) adhesion of unexposed areas to substrates and (6) resistance to dry etching, as described above.

Such monomers for copolymerization include, for example, compounds each having one addition-polymerizable unsaturated bond, selected from acrylic esters, methacrylic esters, acrylamide compounds, methacrylamide compounds, allyl compounds, vinyl ethers and vinyl esters.

Specifically, examples of the acrylic esters include alkyl acrylates (wherein alkyl groups each preferably has 1 to 10 carbon atoms) (such as methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate).

Examples of the methacrylic esters include alkyl methacrylates (wherein alkyl groups each preferably has 1 to 10 carbon atoms) (such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimetylolpropane monomethacrylate, pentaerythritol monomethacrylate, furfuryl methacrylate and tetrahydrofurfuryl methacrylate).

Examples of the acrylamide compounds include acrylamide, N-alkylacrylamides (wherein alkyl groups each preferably has 1 to 10 carbon atoms, for example, methyl, ethyl, propyl, butyl, t-butyl, heptyl, octyl, cyclohexyl and hydroxyethyl), N,N-dialkylacrylamides (wherein alkyl groups each preferably has 1 to 10 carbon atoms, for example, methyl, ethyl, butyl, isobutyl, ethylhexyl and cyclohexyl), N-hydroxyethyl-N-methylacrylamide and N-2-acetamidoethyl-N-acetylacrylamide.

Examples of the methacrylamide compounds include methacrylamide, N-alkylmethacrylamides (wherein alkyl groups each preferably has 1 to 10 carbon atoms, for example, methyl, ethyl, t-butyl, ethylhexyl, hydroxyethyl and cyclohexyl), N,N-dialkylmethacrylamides (wherein alkyl groups are, for example, ethyl, propyl and butyl) and N-hydroxyethyl-N-methylmethacrylamide.

Examples of the allyl compounds include allyl esters (such as allyl acetate, allyl caproate, allyl caprylate, allyl laurate, allyl palmitate, allyl stearate, allyl benzoate, allyl acetoacetate and allyl lactate) and allyloxyethanol.

Examples of the vinyl ethers include alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether).

Examples of the vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate.

The monomers also include dialkyl itaconates (such as dimethyl itaconate, diethyl itaconate and dibutyl itaconate), dialkyl esters of maleic acid or fumaric acid (such as dimethyl maleate and dibutyl fumarate) and monoalkyl esters thereof, acrylic acid, methacrylic acid, crotonic acid, itaconic acid, maleic anhydride, maleimide, acrylonitrile, methacrylonitrile and maleylonitrile.

In addition, any monomers may be used, as long as they are addition-polymerizable unsaturated compounds copolymerizable with the repeating structural units represented by general formula [I-2].

The content of the repeating structural units corresponding to the additional monomers as described above is preferably 99 mol % or less, more preferably 90 mol % or less, and most preferably 80 mol % or less, based on the total molar number of the repeating structural units represented by general formula [I-2] and the repeating structural units having alicyclic hydrocarbon moieties. Exceeding 99 mol % is unfavorable because the effect of the present invention is not sufficiently manifested.

The above-mentioned resins can be represented, for example, by the following general formula [V'], but the scope of the present invention is not limited thereto.

group, a tetrahydropyranyl group, a tetrahydrofuranyl group, an alkoxyethyl group, an alkoxymethyl group, a 3-oxocyclohexyl group, or a 2-oxocyclohexyl group; $R_{211}$ represents a methyl group, an ethyl group, a propyl group, an isopropyl group or a n-butyl group; a' is 5 to 80; b' is 0 to 70; c' is 0 to 95; d', e' and f' are each 0 to 50; a'+d'≧5; b'+c'≧40; and a'+b'+c'+d'+e'+f'=100.

The weight-average molecular weight of the above-mentioned resins used in the present invention is preferably 2,000 to 200,000. If the weight-average molecular weight is less than 2,000, deterioration in heat resistance and resistance to dry etching is unfavorably observed. Exceeding 200,000 brings about unfavorable results such as deterioration in developing properties, and deterioration in film forming properties caused by an extreme increase in viscosity.

The resins used in the present invention can be synthesized by usual methods including radical polymerization using azo compounds as initiators.

The positive type photoresist compositions of the present invention mainly contain the above-mentioned resins and photo acid generators. The amount of the resin added to the whole composition is 40% to 99% by weight, and preferably 50% to 97% by weight, based on the total solid content of the resist.

Then, the resins which are decomposed by the action of acids to increase solubility in alkali developing solutions, namely the polymers containing the repeating structural units represented by general formula [I-3], are described. In general formula [I-3], $R_{31}$ represents a hydrogen atom or a methyl group; $R_{32}$ to $R_{34}$, which may be the same or different, each represents a hydrogen atom or an alkyl group; $R_{35}$ and $R_{36}$, which may be the same or different, each represents a hydrogen atom, an alkyl group or $X_{31}R_{37}$ wherein $R_{37}$ is a hydrogen atom or an alkyl group, and $X_{31}$ is an oxygen atom or a sulfur atom. The alkyl groups represented by $R_{32}$ to $R_{37}$ are preferably lower alkyl groups such as methyl, ethyl, propyl, isopropyl, butyl, isobutyl and sec-butyl, more preferably methyl, ethyl, propyl, isopropyl and butyl, and most preferably methyl and ethyl.

m' is 1, 2 or 3, n' is 0, 1 or 2, and the sum of m' and n' is 3.

$A_{31}$ represents one group selected from the group consisting of a single bond, an alkylene group, a substituted alkylene group, an ether group, an ester group, an amido

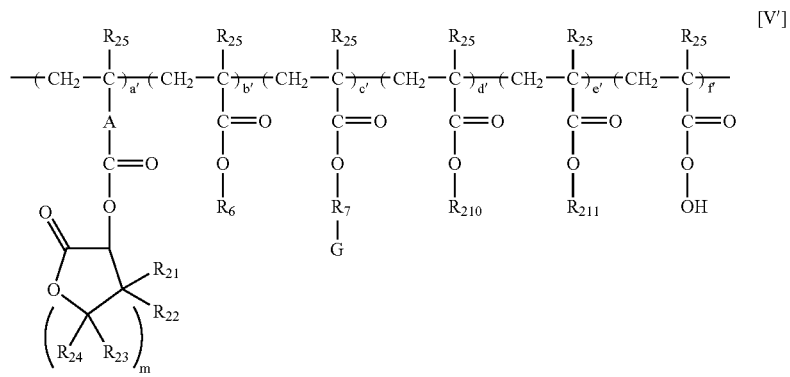

wherein $R_{21}$ to $R_{25}$, $R_6$, $R_7$, $A_{21}$ and G have the same meanings as given above; $R_{210}$ represents a tertiary alkyl group, a sulfonamido group, a urethane group and a urea group, or a combination of two or more of them.

The alkylene groups and the substituted alkylene groups represented by $A_{31}$ include groups shown below:

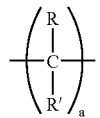

wherein R and R', which may be the same or different, each represents a hydrogen atom, an alkyl group, a substituted alkyl group, a halogen atom, a hydroxyl group or an alkoxyl group. The alkyl groups are preferably lower alkyl groups such as methyl, ethyl, propyl, isopropyl and butyl, and more preferably, methyl, ethyl, propyl and isopropyl. Substituent groups of the substituted alkyl groups include halogen atoms and hydroxyl and alkoxyl groups. The alkoxyl groups include groups having 1 to 4 carbon atoms such as methoxy, ethoxy, propoxy and butoxy. a represents an integer of 1 to 10.

Of the above, $A_{31}$ is particularly preferably a single bond, or one group selected from an alkylene group, a substituted alkylene group, an ether group, an amido group, a urea group, a urethane group and an ester group, or a combination of two or more of them. The alkylene groups and the substituted alkylene groups are preferably alkylene groups each having 1 to 4 carbon atoms herein, and specific examples thereof include methylene, ethylene, propylene, butylene, methyl-substituted methylene, dimethyl-substituted methylene, methyl-substituted ethylene, dimethyl-substituted ethylene, methyl-substituted propylene and dimethyl-substituted propylene.

Preferred examples of the monomers represented by general formula [I] include monomers represented by the following general formulas [I-A] to [I-K]:

[I-A]
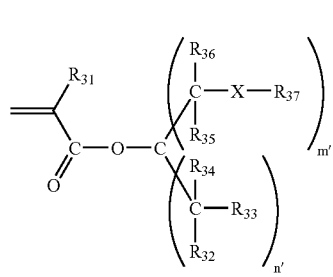

[I-B]
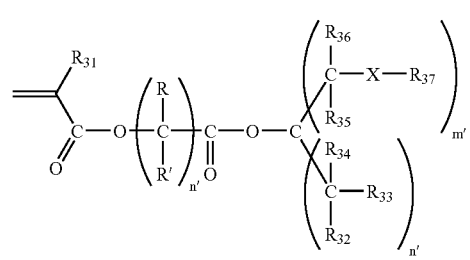

[I-C]
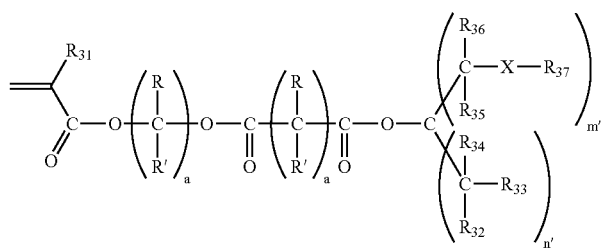

[I-D]
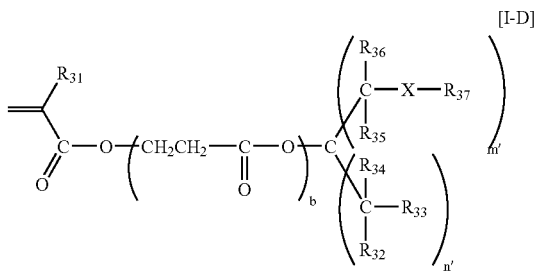

[I-E]
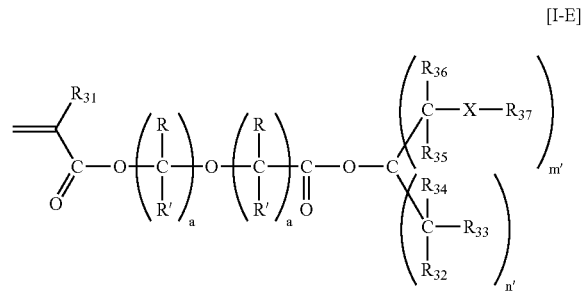

[I-F]
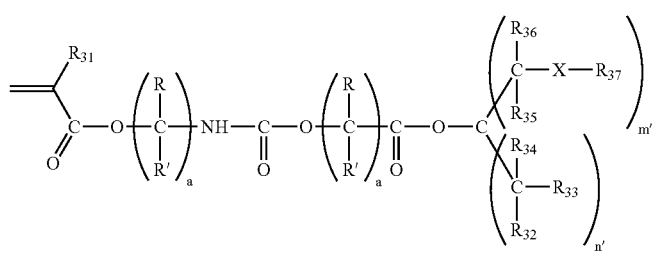

-continued
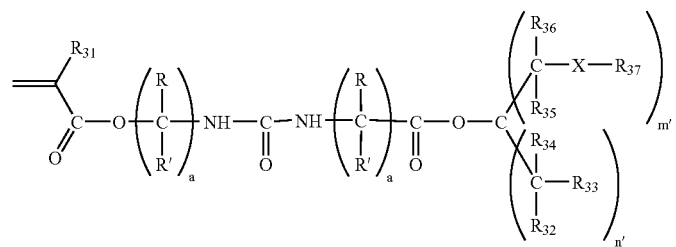
[I-G]
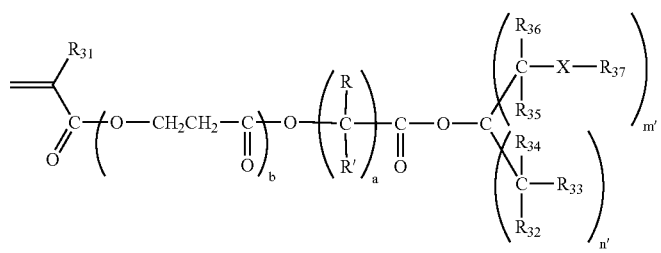
[I-H]
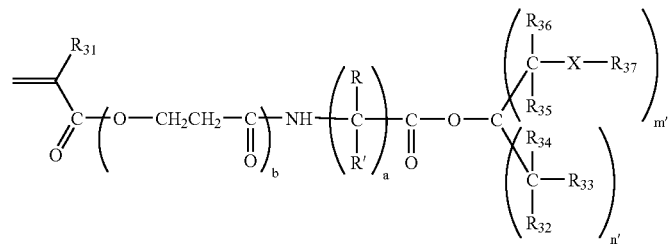
[I-I]
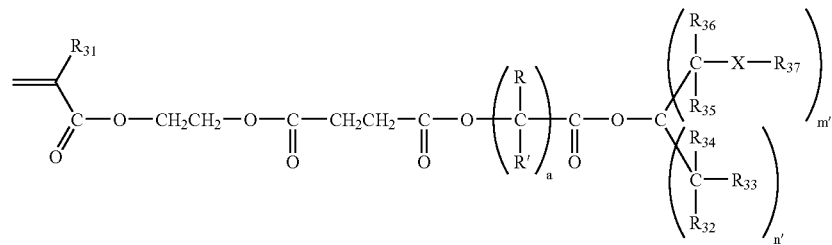
[I-J]
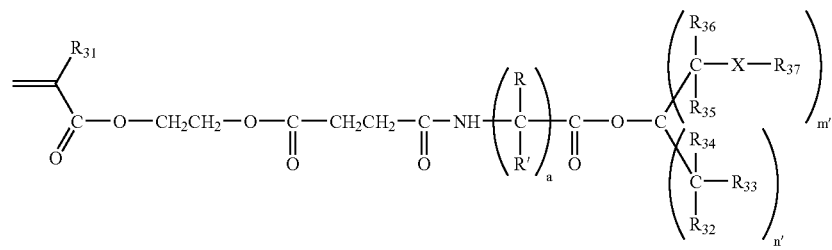
[I-K]

In the above-mentioned general formulas, $R_{31}$ to $R_{37}$, R, R', n', m' and a have the same meanings as given above, and b represents an integer of 1 to 3.
Specific examples of the monomers represented by general formula [I-3] are enumerated below, but do not limit the scope of the present invention:
[I-A-1]
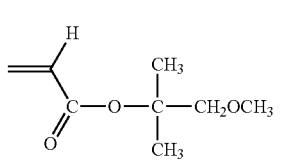
[I-A-2]
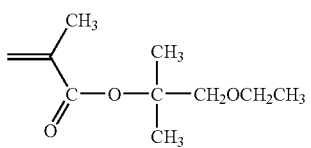
[I-A-3]
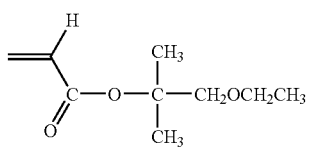
[I-A-4]
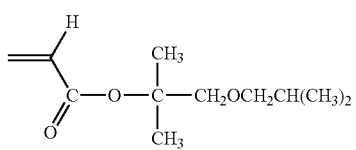
[I-A-5]
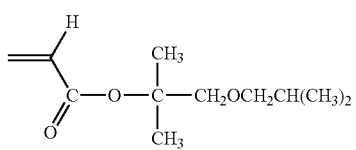
[I-A-6]
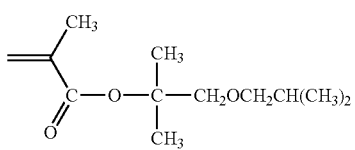
[I-A-7]
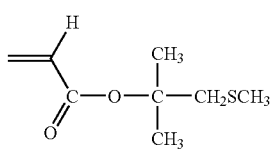
[I-A-8]
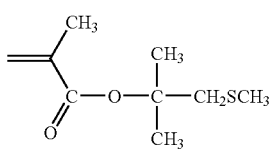
[I-A-9]
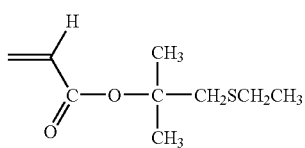
[I-A-10]
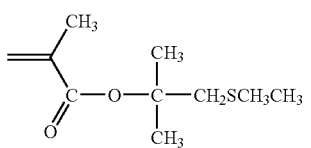
[I-A-11]
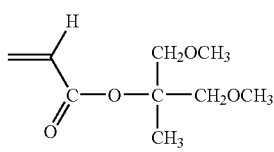
[I-A-12]
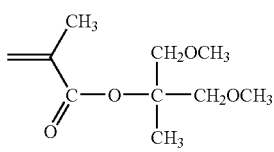
[I-A-13]
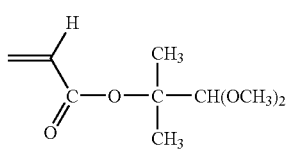
[I-A-14]
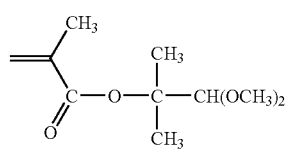
[I-A-15]
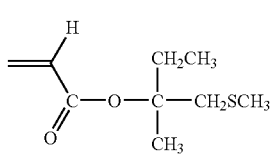
[I-A-16]
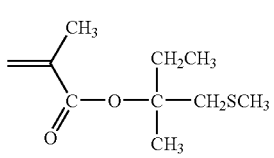
[I-B-1]
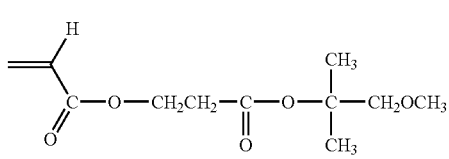
[I-B-2]
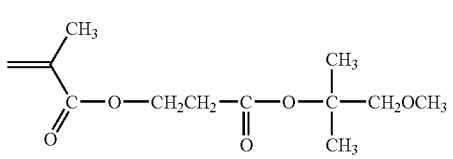

-continued
[I-B-3]
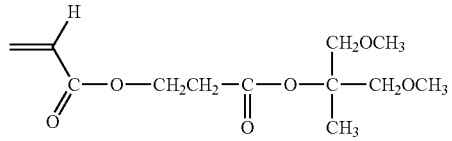
[I-B-4]
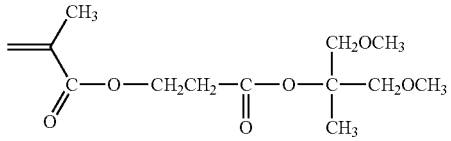
[I-B-5]
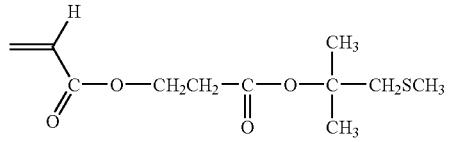
[I-B-6]
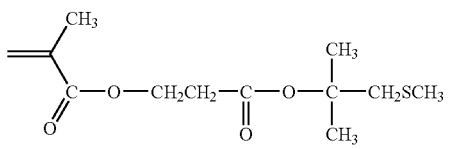
[I-B-7]
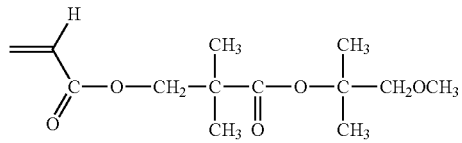
[I-B-8]
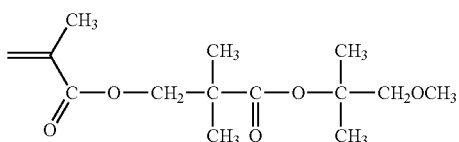
[I-B-9]
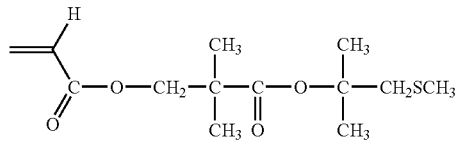
[I-B-10]
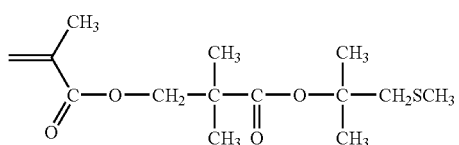
[I-C-1]
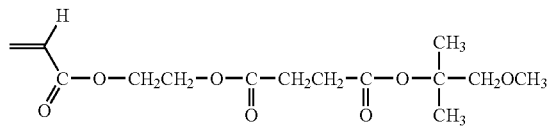
[I-C-2]
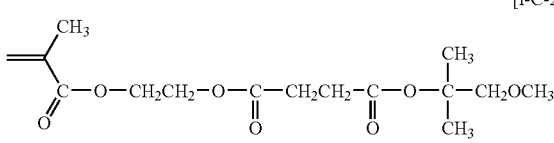
[I-C-3]
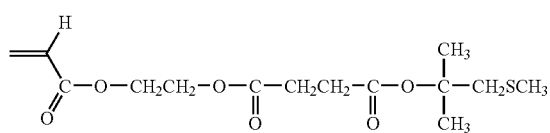
[I-C-4]
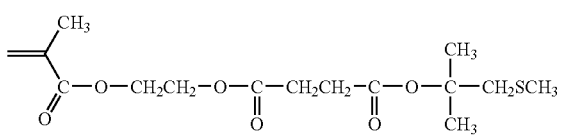
[I-C-5]
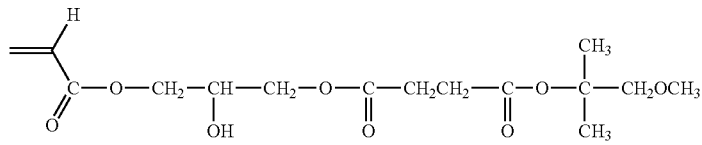
[I-C-6]
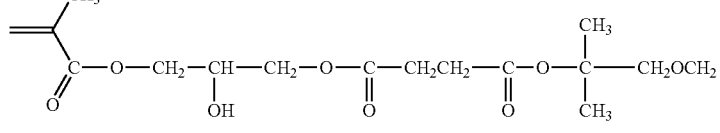
[I-D-1]
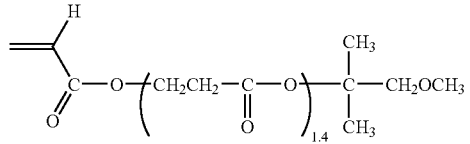
[I-D-2]
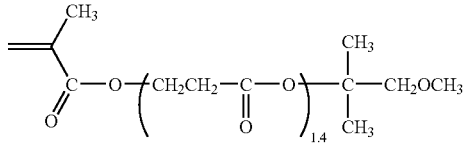
[I-D-3]
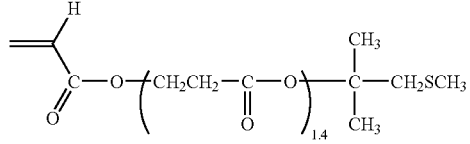
[I-D-4]
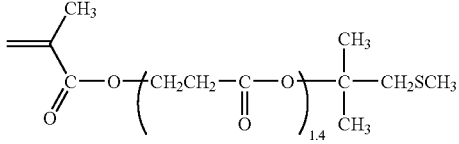

-continued
[I-E-1] 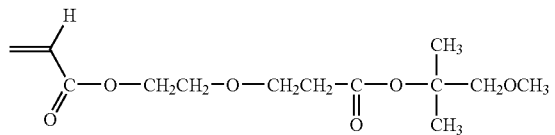
[I-E-2] 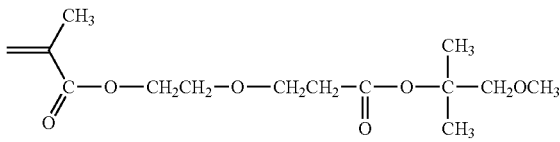
[I-E-3] 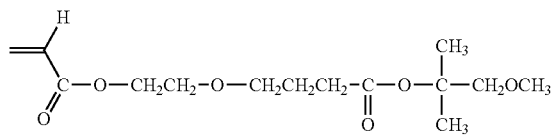
[I-E-4] 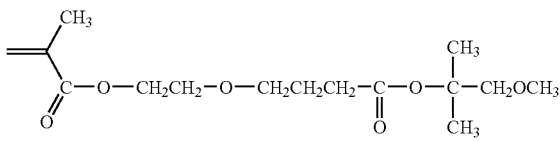
[I-E-5] 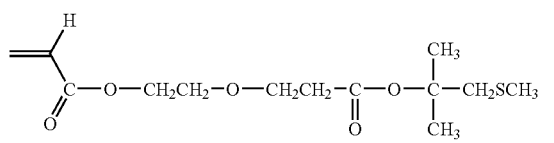
[I-E-6] 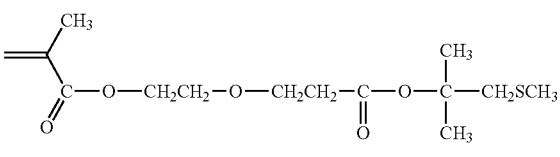
[I-F-1] 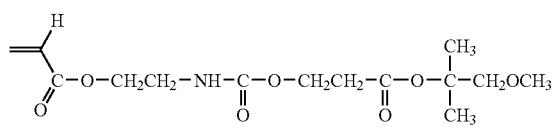
[I-F-2] 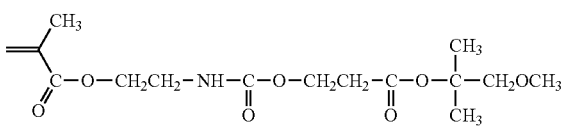
[I-F-3] 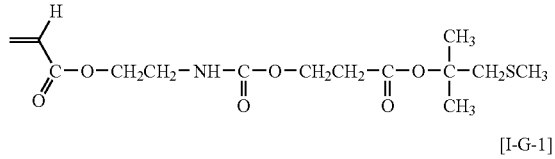
[I-F-4] 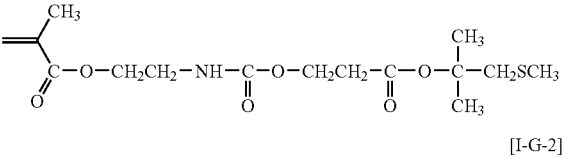
[I-G-1] 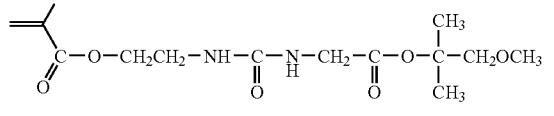
[I-G-2] 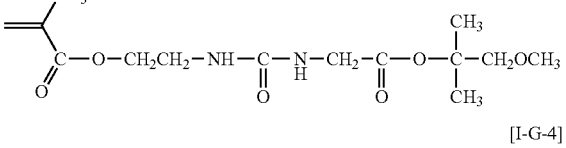
[I-G-3] 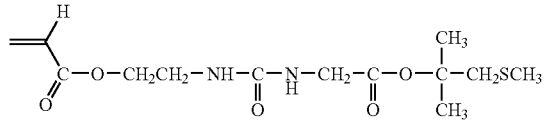
[I-G-4] 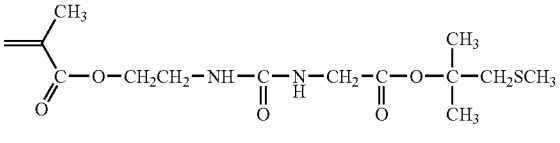
[I-G-5] 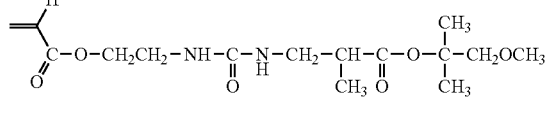
[I-G-6] 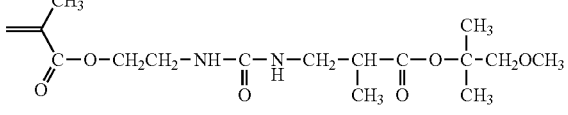
[I-G-7] 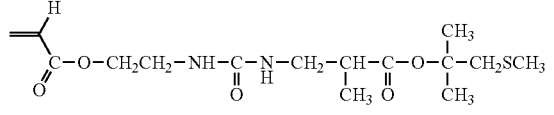
[I-G-8] 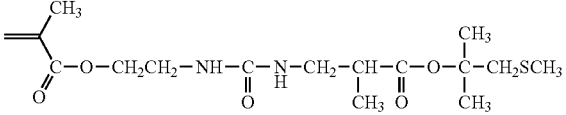

-continued
[I-G-9] 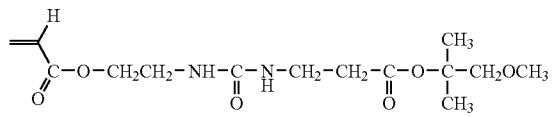
[I-G-10] 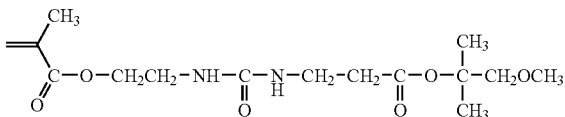
[I-H-1] 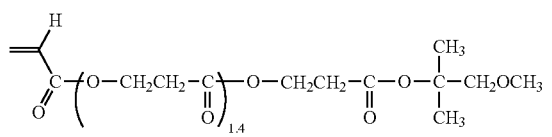
[I-H-2] 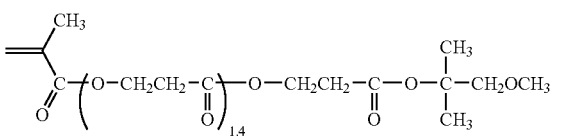
[I-H-3] 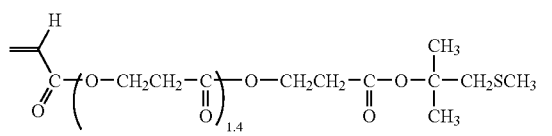
[I-H-4] 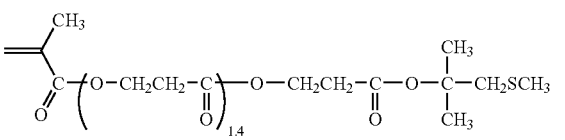
[I-I-1] 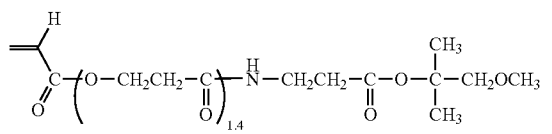
[I-I-2] 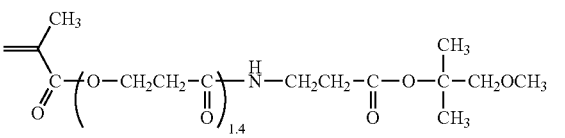
[I-I-3] 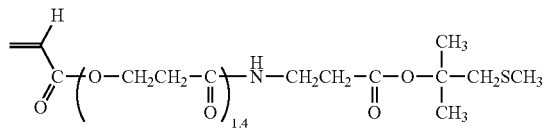
[I-I-4] 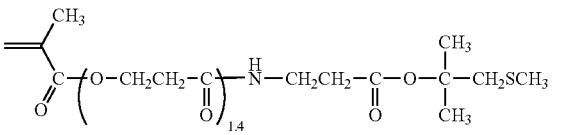
[I-I-5] 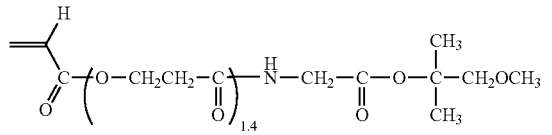
[I-I-6] 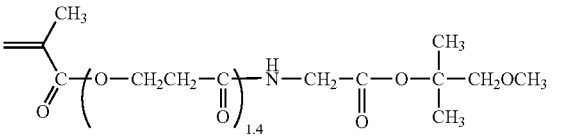
[I-J-1] 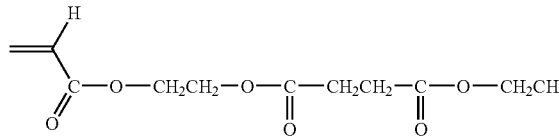
[I-J-2] 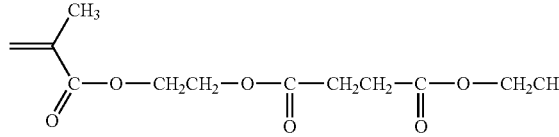
[I-J-3] 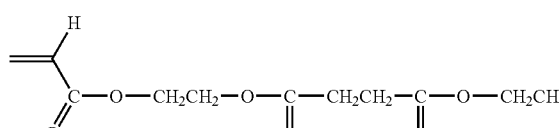

-continued
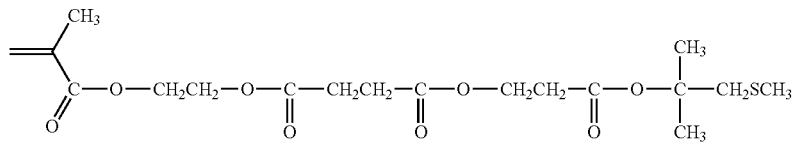
[I-J-4]
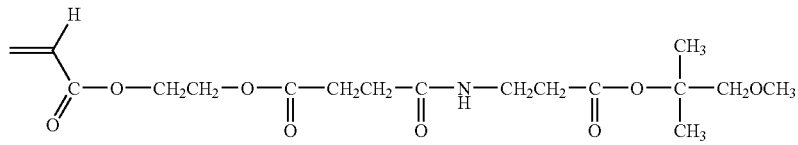
[I-K-1]
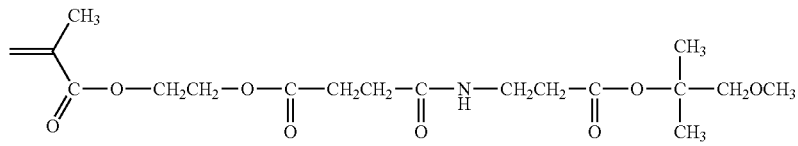
[I-K-2]
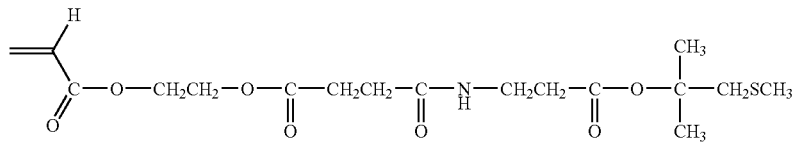
[I-K-3]
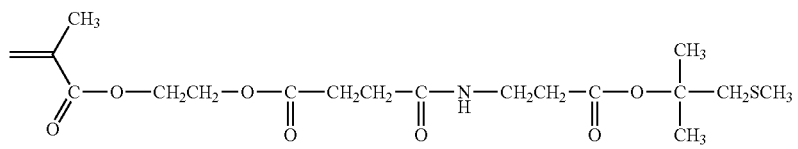
[I-K-4]
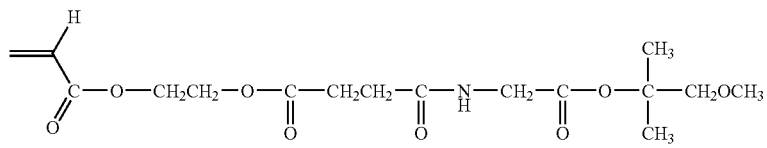
[I-K-5]
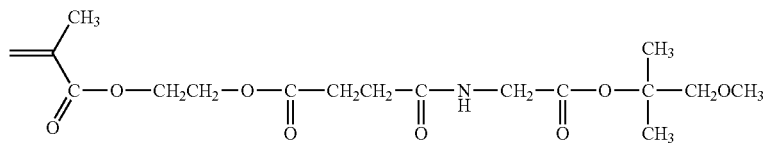
[I-K-6]

The monomers represented by general formula [I-3] can be synthesized by esterifying carboxylic acids having radical-polymerizable carbon-carbon bonds in their molecules with 2-hydroxylactones by the method described in *Angew. Chem. int. Ed. Engl.*, 17, 522 (1978), or by reacting the corresponding carboxylic acid chlorides with 2-hydroxylactones under basic conditions.

Further, the resins which are decomposed by the action of acids to increase solubility in alkali developing solutions, namely the polymers containing the repeating structural units represented by general formula [I-4], are described. In general formula [I-4], $R_{41}$ represents a hydrogen atom or a methyl group; $R_{42}$ to $R_{44}$, which may be the same or different, each represents a hydrogen atom or an alkyl group; $R_{45}$ and $R_{46}$, which may be the same or different, each represents a hydrogen atom, an alkyl group or a halogen atom; and $X_{41}$ is a halogen atom. The alkyl groups represented by $R_{42}$ to $R_{46}$ are preferably lower alkyl groups such as methyl, ethyl, propyl, isopropyl, butyl, isobutyl and sec-butyl, more preferably methyl, ethyl, propyl, isopropyl and butyl, and most preferably methyl and ethyl. $X_{41}$ is a chlorine, bromine or iodine ion. m" is 1, 2 or 3, n" is 0, 1 or 2, and the sum of m" and n" is 3.

$A_{41}$ represents one group selected from the group consisting of a single bond, an alkylene group, a substituted alkylene group, an ether group, an ester group, a thioether group, a carbonyl group, an amido group, a sulfonamido group, a urethane group and a urea group, or a combination of two or more of them. The alkylene groups and the substituted alkylene groups represented by $A_{41}$ include groups shown below:

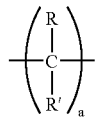

wherein R and R', which may be the same or different, each represents a hydrogen atom, an alkyl group, a substituted alkyl group, a halogen atom, a hydroxyl group or an alkoxyl group. The alkyl groups are preferably lower alkyl groups such as methyl, ethyl, propyl, isopropyl and butyl, and more preferably, methyl, ethyl, propyl and isopropyl. Substituent groups of the substituted alkyl groups include halogen atoms and hydroxyl and alkoxyl groups. The alkoxyl groups include groups having 1 to 4 carbon atoms such as methoxy, ethoxy, propoxy and butoxy. n represents an integer of 1 to 10.

Of the above, $A_{41}$ is particularly preferably a single bond, or one group selected from an alkylene group, a substituted alkylene group, an amido group, a urethane group, a urea group, an ether group and an ester group, or a combination of two or more of them. The alkylene groups and the substituted alkylene groups are preferably alkylene groups each having 1 to 4 carbon atoms herein, and specific examples thereof include methylene, ethylene, propylene, butylene, methyl-substituted methylene, dimethyl-substituted methylene, methyl-substituted ethylene, dimethyl-substituted ethylene, methyl-substituted propylene and dimethyl-substituted propylene.

Preferred examples of the monomers represented by general formula [I-4] include monomers represented by the following general formulas [I-A'] to [I-K']:

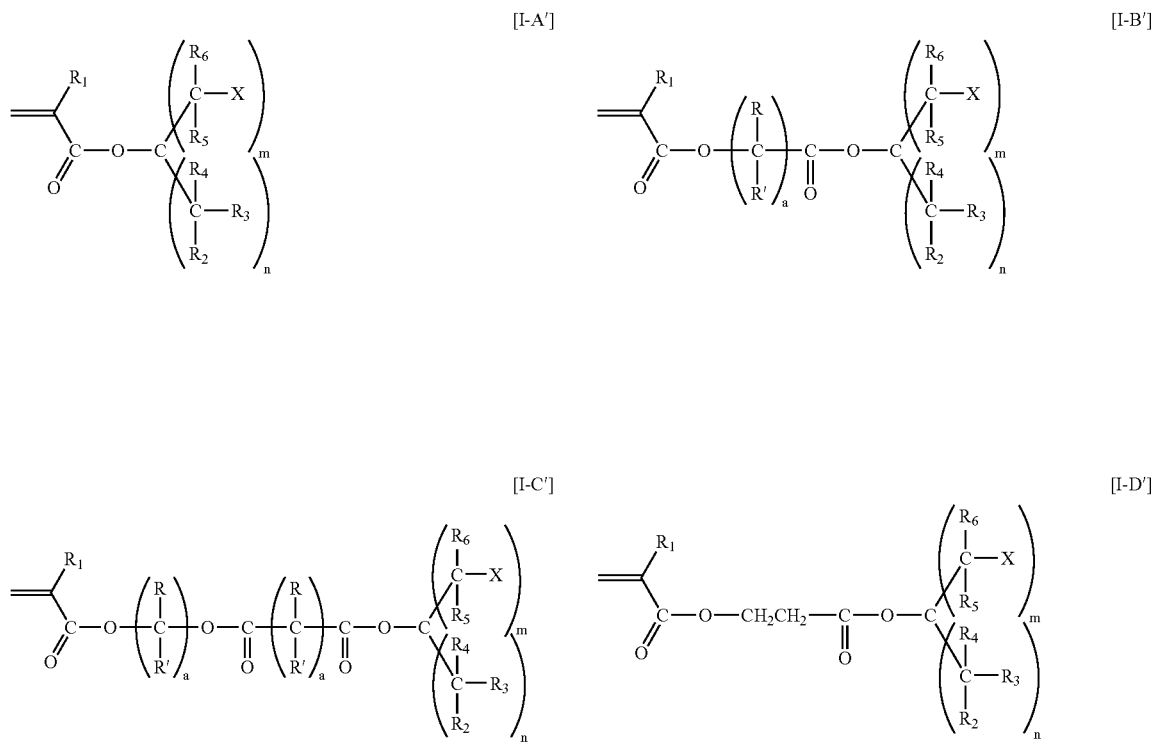

-continued
[I-E']
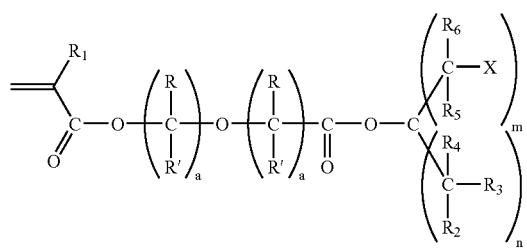
[I-F']
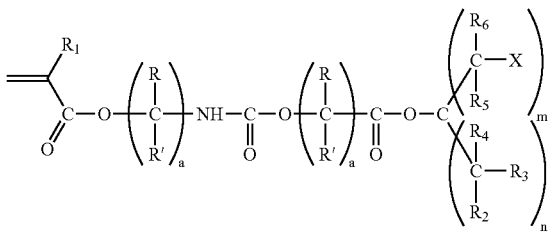
[I-G']
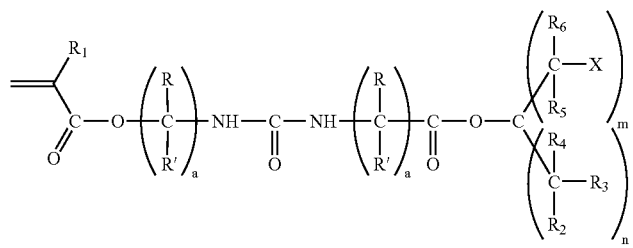
[I-H']
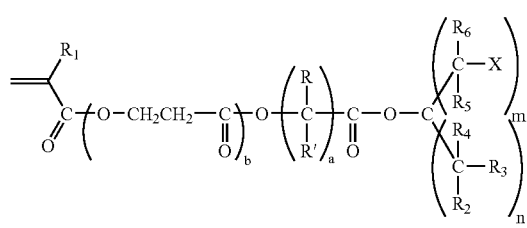
[I-I']
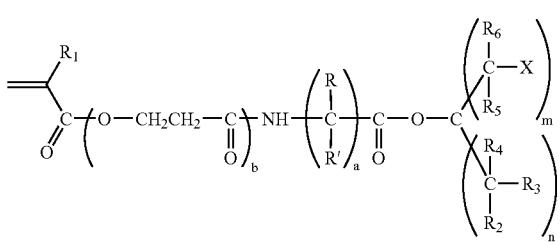
[I-J']
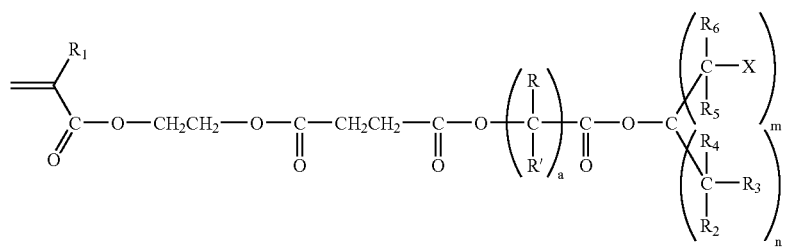

-continued
[I-K']
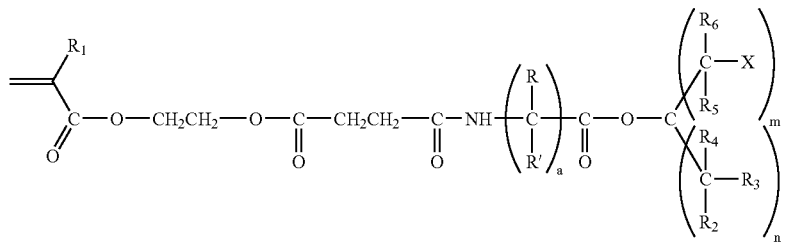
In the above-mentioned general formulas, $R_{42}$ to $R_{47}$, R, R', n and m have the same meanings as given above, and a and b each represents an integer of 1 or 2.
Specific examples of the monomers represented by general formula [I-4] are enumerated below, but do not limit the scope of the present invention:
[I-A'-1]
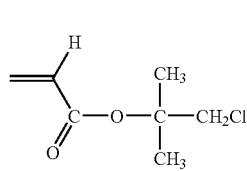
[I-A'-2]
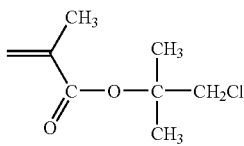
[I-A'-3]
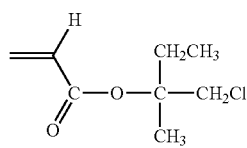
[I-A'-4]
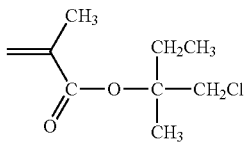
[I-A'-5]
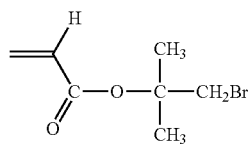
[I-A'-6]
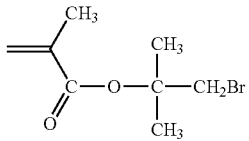
[I-A'-7]
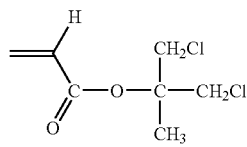
[I-A'-8]
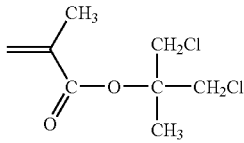
[I-B'-1]
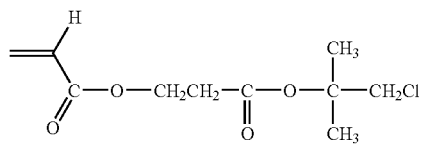
[I-B'-2]
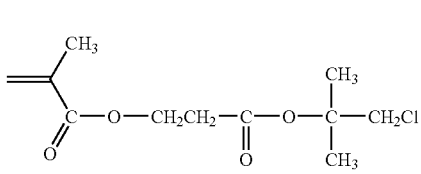
[I-B'-3]
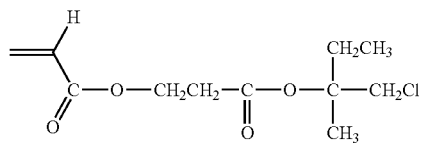
[I-B'-4]
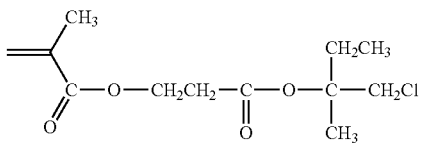
[I-B'-5]
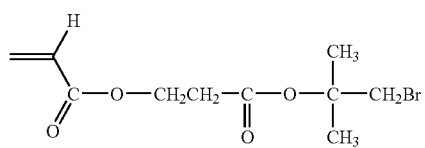
[I-B'-6]
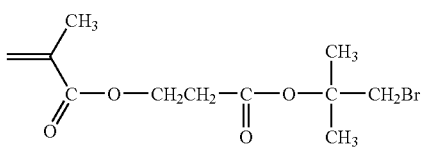

-continued
[I-B'-7] 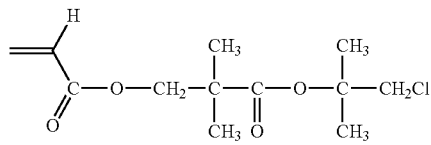
[I-B'-8] 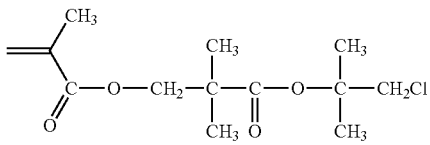
[I-C'-1] 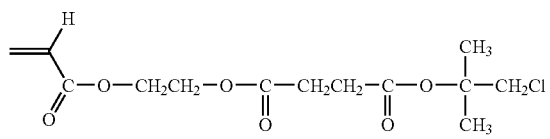
[I-C'-2] 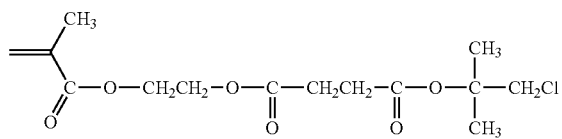
[I-C'-3] 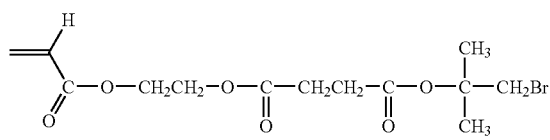
[I-C'-4] 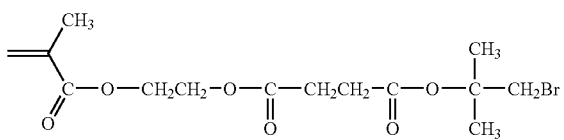
[I-C'-5] 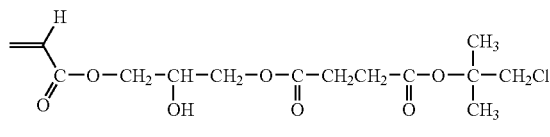
[I-C'-6] 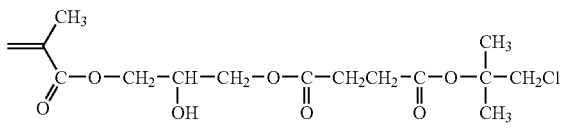
[I-D'-1] 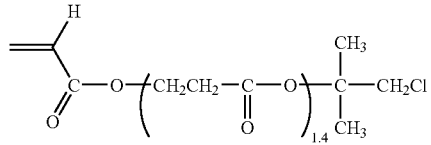
[I-D'-2] 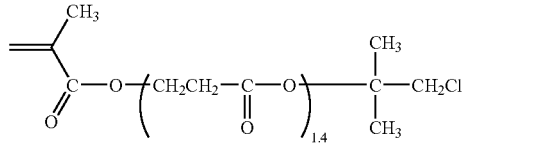
[I-D'-3] 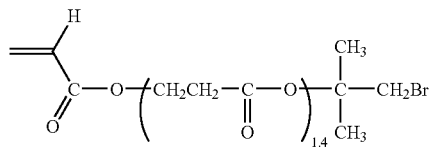
[I-D'-4] 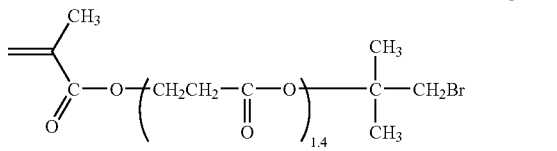
[I-E'-1] 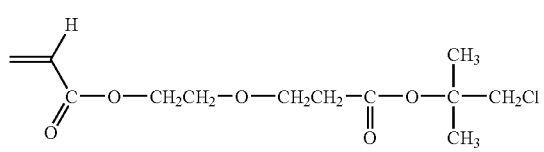
[I-E'-2] 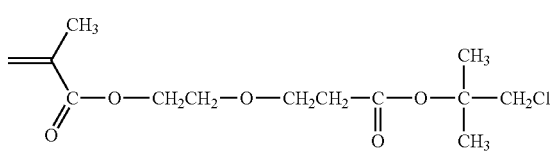
[I-E'-3] 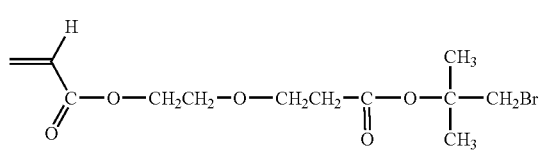
[I-E'-4] 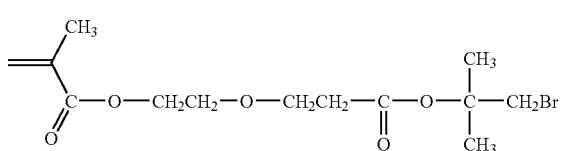
[I-E'-5] 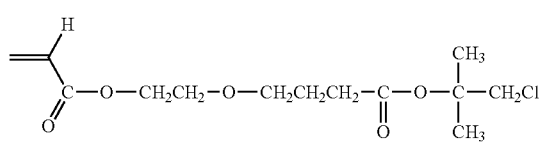
[I-E'-6] 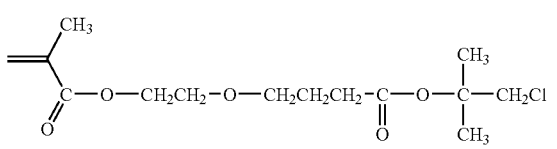

-continued
[I-E'-7] 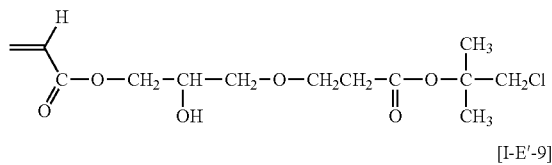
[I-E'-8] 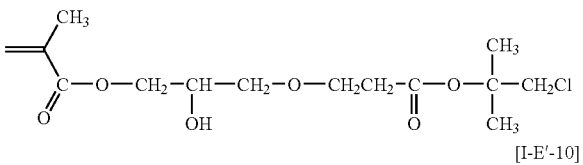
[I-E'-9] 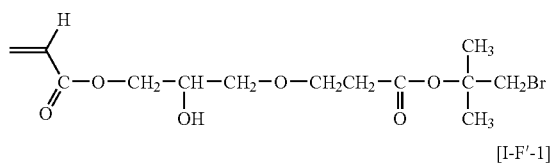
[I-E'-10] 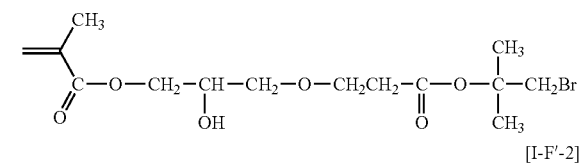
[I-F'-1] 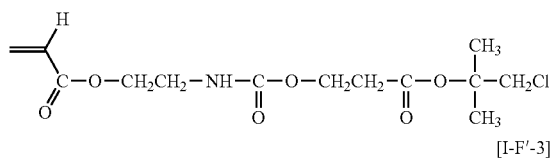
[I-F'-2] 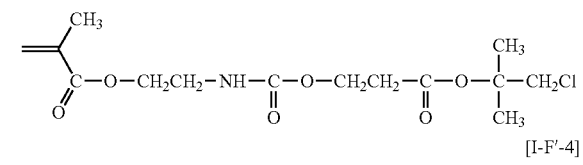
[I-F'-3] 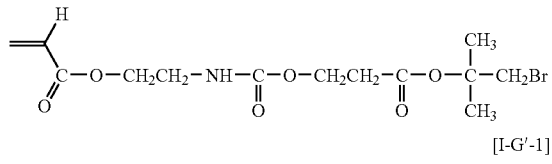
[I-F'-4] 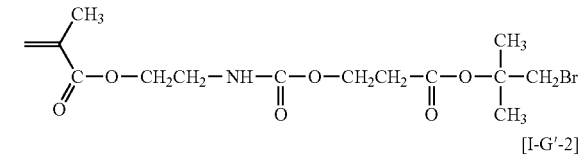
[I-G'-1] 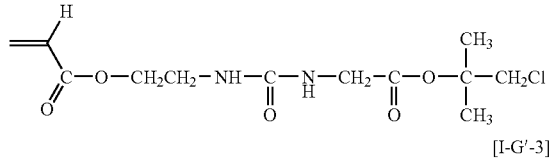
[I-G'-2] 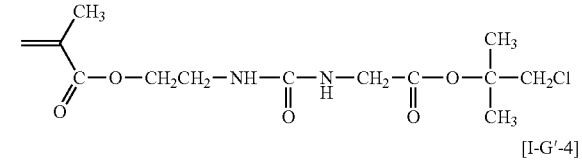
[I-G'-3] 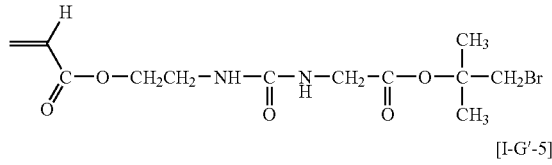
[I-G'-4] 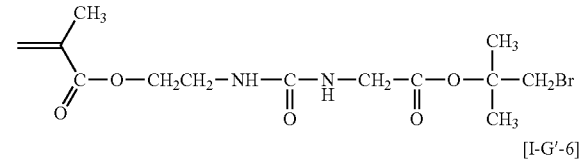
[I-G'-5] 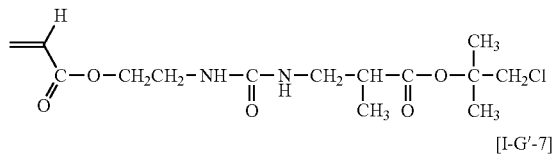
[I-G'-6] 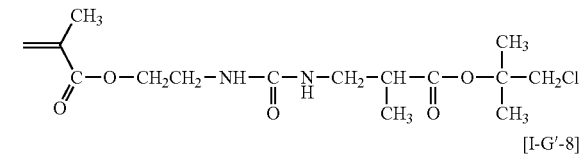
[I-G'-7] 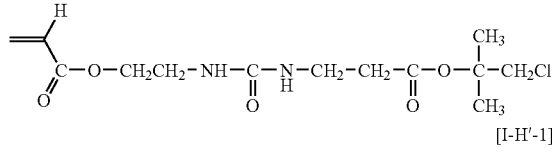
[I-G'-8] 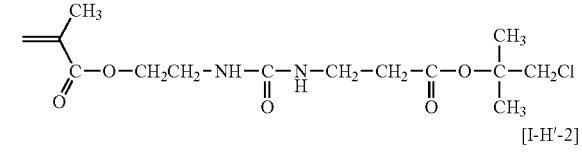
[I-H'-1] 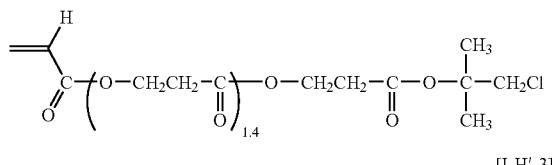
[I-H'-2] 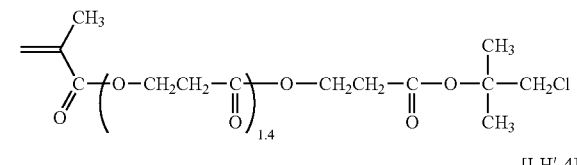
[I-H'-3] 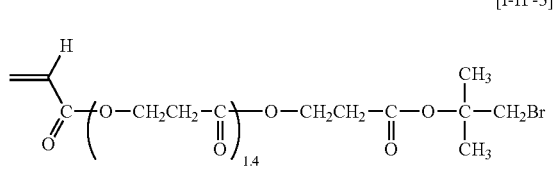
[I-H'-4] 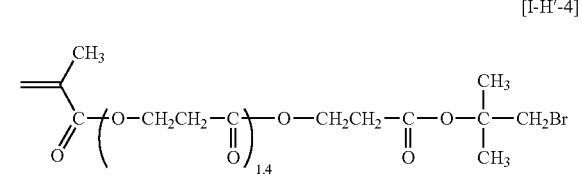

-continued
[I-I'-1]
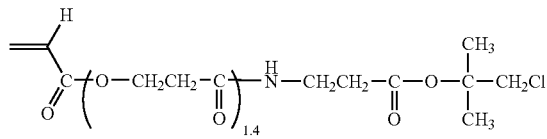
[I-I'-2]
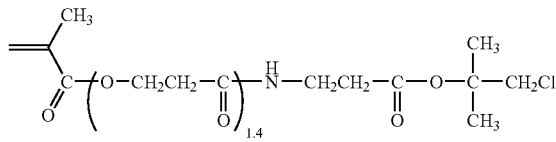
[I-I'-3]
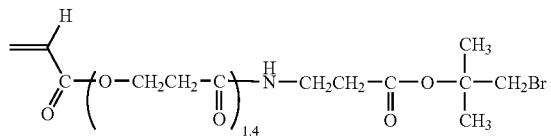
[I-I'-4]
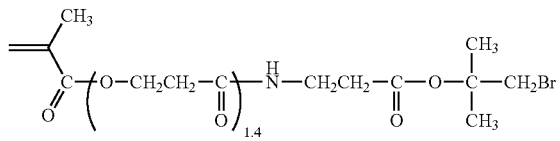
[I-I'-5]
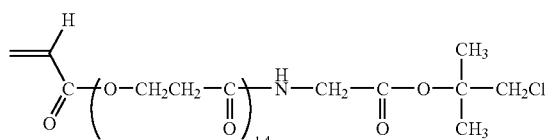
[I-I'-6]
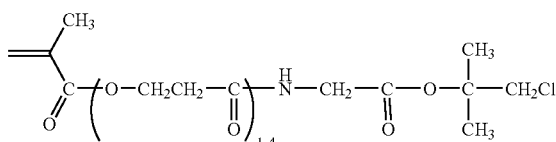
[I-J'-1]
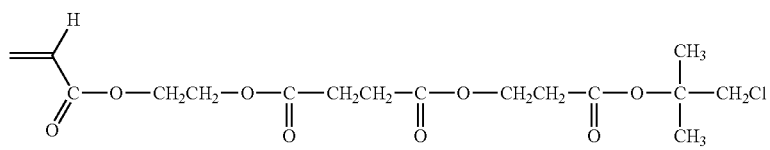
[I-J'-2]
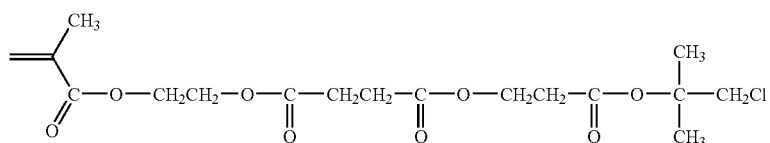
[I-J'-3]
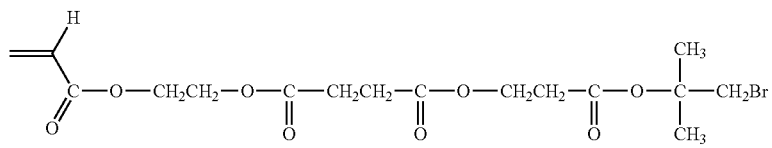
[I-J'-4]
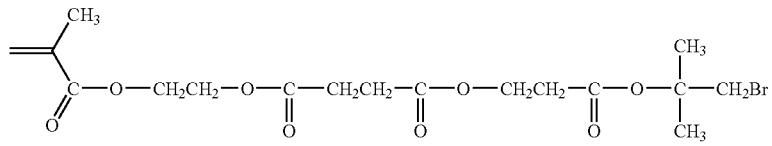
[I-K'-1]
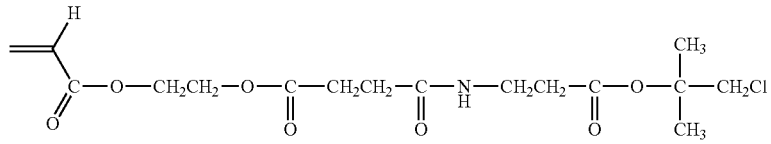
[I-K'-2]
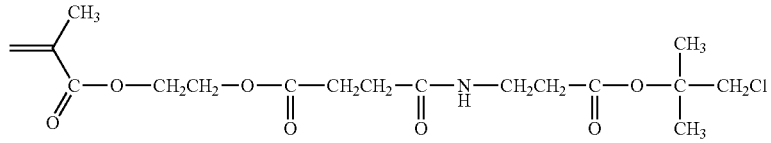

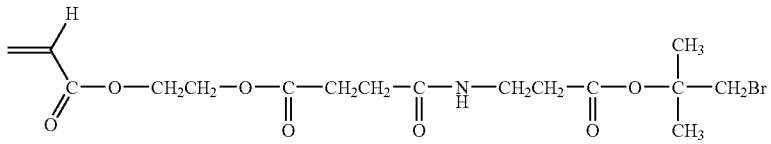

[I-K'-3]

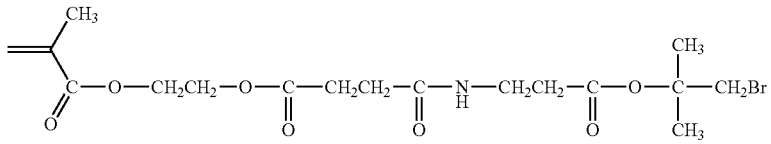

[I-K'-4]

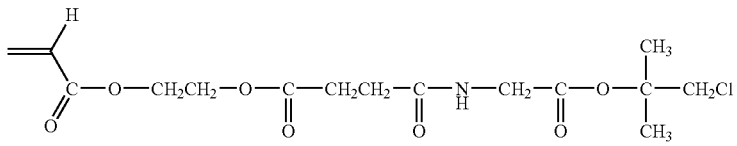

[I-K'-5]

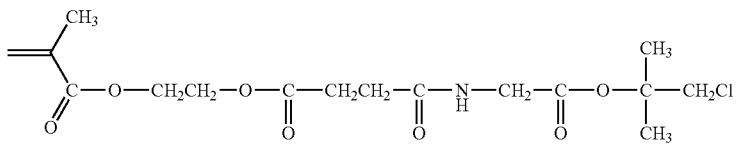

[I-K'-6]

Such monomers represented by general formula [I-4] can be synthesized by esterifying carboxylic acids having radical-polymerizable carbon-carbon bonds in their molecules with 2-hydroxylactones by the method described in *Angew. Chem. int. Ed. Engl.*, 17, 522 (1978), or by reacting the corresponding carboxylic acid chlorides with 2-hydroxylactones under basic conditions.

It is preferred that the resins used in the positive type photoresist compositions of the present invention contain the repeating units having alicyclic hydrocarbon moieties in their molecules, as well as the groups represented by the above-mentioned general formulas [I-3] and [I-4]. This can enhance the resistance to dry etching of the positive photoresists. The repeating structural units having alicyclic hydrocarbon moieties in their molecules include, for example, repeating structural units represented by the above-mentioned general formulas [III] and [IV].

In the above-mentioned resins, the content of the repeating structural units containing the groups represented by general formula [I-3] or [I-4] is preferably 5 mol % to 80 mol %, and more preferably 10 mol % to 70 mol %, based on the total repeating units. Less than 5 mol % is unfavorable because the effect of the present invention is difficult to be achieved. Exceeding 80 mol % unfavorably results in liability to deteriorate the resistance to dry etching.

The content of the repeating structural units having alicyclic hydrocarbon moieties in their molecules contained in the resins is 20 mol % to 95 mol %, and preferably 30 mol % to 90 mol %, based on the total repeating units.

It is preferred that the above-mentioned resins used in the present invention further contain groups which are decomposed by the action of acids to increase solubility in alkali developing solutions (also referred to as acid decomposable groups), in addition to the groups represented by general formula [I-3] or [I-4] and the repeating structural units having alicyclic hydrocarbon moieties. This makes the effect of improving sensitivity more significant.

Preferred examples of such acid decomposable groups include —COOR$_{11}$, —OR$_{11}$, a 3-oxocyclohexyl group and a 2-oxocyclohexyl group as described above.

Specifically, examples thereof include repeating structural units corresponding to conventional monomers such as t-butyl acrylate, t-butyl methacrylate, t-amyl acrylate, t-amyl methacrylate, tetrahydrofuranyl acrylate, tetrahydrofuranyl methacrylate, tetrahydropyranyl acrylate, tetrahydropyranyl methacrylate, alkoxymethyl acrylate, alkoxymethyl methacrylate, 1-alkoxyethyl methacrylate, 3-oxocyclohexyl acrylate, 3-oxocyclohexyl methacrylate, 2-oxocyclohexyl acrylate and 2-oxocyclohexyl methacrylate.

In the above-mentioned resins, the content of the repeating structural units corresponding to such conventional mol % or less, more preferably 90 mol % or less, and most preferably 80 mol % or less, based on the total molar number of the repeating structural units having the groups represented by the above-mentioned general formula [I-3] or [I-4]. Exceeding 99 mol % is unfavorable because the effect of the present invention is not sufficiently manifested.

Such resins can be further copolymerized with the following monomers as repeating units within the range in which the effect of the present invention can be effectively obtained. However, the present invention is not limited thereto.

This enables fine adjustment of properties required for the above-mentioned resins, particularly (1) solubility in coating solvents, (2) film forming properties (glass transition temperature), (3) alkali developing properties, (4) film thickness loss (hydrophilic and hydrophobic properties, selection of alkali-soluble groups), (5) adhesion of unexposed areas to substrates and (6) resistance to dry etching.

Such monomers for copolymerization include, for example, compounds each having one addition-polymeriz able unsaturated bond, selected from acrylic esters, methacrylic esters, acrylamide compounds, methacrylamide compounds, allyl compounds, vinyl ethers and vinyl esters.

Specifically, examples of the acrylic esters include alkyl acrylates (wherein alkyl groups each preferably has 1 to 10 carbon atoms) (such as methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate).

Examples of the methacrylic esters include alkyl methacrylates (wherein alkyl groups each preferably has 1 to 10 carbon atoms) (such as methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimetylolpropane monomethacrylate, pentaerythritol monomethacrylate, furfuryl methacrylate and tetrahydrofurfuryl methacrylate).

Examples of the acrylamide compounds include acrylamide, N-alkylacrylamides (wherein alkyl groups each preferably has 1 to 10 carbon atoms, for example, methyl, ethyl, propyl, butyl, t-butyl, heptyl, octyl, cyclohexyl and hydroxyethyl), N,N-dialkylacrylamides (wherein alkyl groups each preferably has 1 to 10 carbon atoms, for example, methyl, ethyl, butyl, isobutyl, ethylhexyl and cyclohexyl), N-hydroxyethyl-N-methylacrylamide and N-2-acetamidoethyl-N-acetylacrylamide.

Examples of the methacrylamide compounds include methacrylamide, N-alkylmethacrylamides (wherein alkyl groups each preferably has 1 to 10 carbon atoms, for example, methyl, ethyl, t-butyl, ethylhexyl, hydroxyethyl and cyclohexyl), N,N-dialkylmethacrylamides (wherein alkyl groups are, for example, ethyl, propyl and butyl) and N-hydroxyethyl-N-methylmethacrylamide.

Examples of the allyl compounds include allyl esters (such as allyl acetate, allyl caproate, allyl caprylate, allyl laurate, allyl palmitate, allyl stearate, allyl benzoate, allyl acetoacetate and allyl lactate) and allyloxyethanol.

Examples of the vinyl ethers include alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether).

Examples of the vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate.

The monomers also include dialkyl itaconates (such as dimethyl itaconate, diethyl itaconate and dibutyl itaconate), dialkyl esters of maleic acid or fumaric acid (such as dimethyl maleate and dibutyl fumarate) and monoalkyl esters thereof, acrylic acid, methacrylic acid, crotonic acid, itaconic acid, maleic anhydride, maleimide, acrylonitrile, methacrylonitrile and maleylonitrile.

In addition, any monomers may be used, as long as they are addition-polymerizable unsaturated compounds copolymerizable with the repeating structural units represented by general formula [I-3] or [I-4].

The content of the repeating structural units corresponding to the additional monomers as described above is preferably 99 mol % or less, more preferably 90 mol % or less, and most preferably 80 mol % or less, based on the total molar number of the repeating structural units represented by general formula [I-3] or [I-4] and the repeating structural units having alicyclic hydrocarbon moieties. Exceeding 99 mol % is unfavorable because the effect of the present invention is not sufficiently manifested.

The weight-average molecular weight of the above-mentioned resins used in the present invention is preferably 2,000 to 200,000. If the weight-average molecular weight is less than 2,000, deterioration in heat resistance and resistance to dry etching is unfavorably observed. Exceeding 200,000 brings about unfavorable results such as deterioration in developing properties and deterioration in film forming properties caused by an extreme increase in viscosity.

As described above, the resins used in the present invention have no groups strong in photoabsorption in the far ultraviolet region on either their main chains or their side chains, so that irradiated light sufficiently arrives at around the substrate sides of coated films, which causes high sensitivity and excellent pattern profiles. It goes without saying that being low in transmission density is a necessary condition and does not necessarily results in excellent resist characteristics, and that other factors also have influence thereon. However, the resins used in the present invention fulfill this necessary condition.

The resins used in the present invention can be synthesized by usual methods including radical polymerization using azo compounds as initiators.

The positive type photoresist compositions of the present invention mainly contain the above-mentioned resins and photo acid generators. The amount of the resin added to the whole composition is 40% to 99% by weight, and preferably 50% to 97% by weight, based on the total solid content of the resist.

Then, the photo acid generators contained in the positive type photoresist compositions of the present invention are described below.

The photo acid generators are required to satisfy two properties, namely (1) transparency to exposure light (in the case that the agents have no photobleaching property) and (2) sufficient photodecomposability for ensuring resist sensitivity. Although guidelines for molecular design for fulfilling such conflicting requirements are not clear in the present circumstances, examples of the photo acid generators include aliphatic alkylsulfonium salts having 2-oxocyclohexyl groups described in JP-A-7-25846, JP-A-7-28237, JP-A-7-92675 and JP-A-8-27102, and N-hydroxysuccinimide sulfonates. Further, examples thereof include sulfonium salts represented by the following general formula (VI), disulfones represented by the following general formula (VII) and compounds represented by the following general formula (VIII), which are described in *J. Photopolym. Sci. Technol.*, 7 (3), 423 (1994).

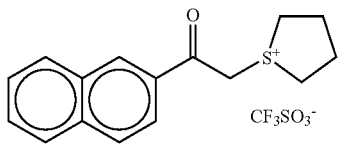

(VI)

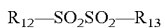

(VII)

(VIII)

wherein $R_{12}$ to $R_{15}$, which may be the same or different, each represents an alkyl group or a cyclic alkyl group.

Further, N-hydroxymaleinimide sulfonates represented by the following general formula (IX) are also preferred.

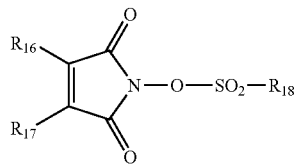

(IX)

wherein $R_{16}$ and $R_{17}$, which may be the same or different, each represents a hydrogen atom, an alkyl group having 1 to 6 carbon atoms, or a cycloalkyl group having 6 or less carbon atoms, and $R_{16}$ and $R_{17}$ may combine together by an alkylene group to form a ring; and $R_{18}$ represents an alkyl group, a perfluoroalkyl group, a cycloalkyl group or a camphor substituent. Such N-hydroxymaleinimide sulfonates are particularly preferred in photosensitivity.

In the above-mentioned general formula (IX), the alkyl groups each having 1 to 6 carbon atoms represented by $R_{16}$ and $R_{17}$ include methyl, ethyl, propyl, isopropyl, n-butyl, isobutyl, tert-butyl, n-pentyl and n-hexyl. Particularly, methyl, ethyl and propyl are preferred, and methyl and ethyl are more preferred. The cycloalkyl groups each having 6 or less carbon atoms include cyclopropyl, cyclopentyl and cyclohexyl. Cyclopentyl and cyclohexyl are preferred. Examples of the formation of rings with $R_{16}$ and $R_{17}$ by alkylene chains include the formation of cyclohexyl, norbornyl and tricyclodecanyl groups.

The alkyl groups represented by $R_{18}$ include straight-chain alkyl groups each having 1 to 20 carbon atoms, including methyl, ethyl and propyl, and branched alkyl groups each having 1 to 20 carbon atoms, including isopropyl, isobutyl, tert-butyl and neopentyl. Straight-chain or branched alkyl groups each having 1 to 16 carbon atoms are preferred, and straight-chain or branched alkyl groups each having 4 to 15 carbon atoms are more preferred. The perfluoroalkyl groups include straight-chain perfluoroalkyl groups each having 1 to 20, including trifluoromethyl and pentafluoroethyl, and branched perfluoroalkyl groups each having 1 to 20, including heptafluoroisopropyl and nonafluoro-tert-butyl. Straight-chain or branched perfluoroalkyl groups each having 1 to 16 carbon atoms are preferred. The cyclic alkyl groups include monocyclic alkyl groups such as cyclopentyl and cyclohexyl, and polycyclic alkyl groups such as decalyl, norbornyl and tricyclodecanyl.

The amount of such a photo acid generators added to the composition is preferably 0.1% to 20% by weight, more preferably 0.3% to 15% by weight, and most preferably 1% to 10% by weight, based on the total solid content of the positive type photoresist composition.

In the positive type photoresist compositions of the present invention, photo acid generators as described below may be used in combination, in addition to the above-mentioned photo acid generators.

The following photo acid generators which can be used in combination are added to the compositions preferably in an amount of not more than 2% by weight, and more preferably in an amount of not more than 1% by weight, per the solid content of the whole positive type photoresist composition.

Examples of such photo acid generators include diazonium salts described in S. I. Schlesinger, *Photogr. Sci. Eng.*, 18, 387 (1974) and T. S. Bal et al., *Polymer,* 21, 423 (1980), ammonium salts described in U.S. Pat. Nos. 4,069,055, 4,069,056 and Re 27,992, and JP-A-3-140140, phosphonium salts described in D. C. Necker et al., *Macromolecules,* 17, 2468 (1984), C. S. Wen et al., *Tec. Ptoc. Conf. Rad. Curing ASIA,* p. 478, Tokyo, October (1988), U.S. Pat. Nos. 4,069,055 and 4,069,056, iodonium salts described in J. V. Crivello et al., *Macromolecules,* 10 (6), 1307 (1977), *Chem. & Eng. News,* Nov. 28, 31 (1988), European Patents 104, 143, 339,049 and 410,201, JP-A-2-150848 and JP-A-2-296514, sulfonium salts described in J. V. Crivello et al., *Polymer, J.* 17, 73 (1985), J. V. Crivello et al., *J. Org. Chem.,* 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci., Polymer Chem. Ed.,* 17, 2877 (1979), European Patents 370,693, 161,881, 410,201, 339,049, 233,567, 297,443 and 297,442, U.S. Pat. Nos. 3,902,114, 4,933,377, 4,760,013, 4,734,444 and 2,833,827, and German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979), onium salts such as arsonium salts described in C. S. Wen et al., *Tec. Ptoc. Conf. Rad. Curing ASIA,* p. 478, Tokyo, October (1988), organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metal/organic halides described in K. Meier et al., *J. Rad. Curina,* 13 (4), 26 (1986), T. P. Gill et al., *Inorg. Chem.,* 19, 3007 (1980), D. Astruc, *Acc. Chem. Res.,* 19 (12), 377 (1896) and JP-A-2-161445, photo acid generators having o-nitrobenzyl type protective groups described in S. Hayase et al., *J. Polymer Sci.,* 25, 753 (1987), E. Reichmanis et al., *J. Polymer Sci., Polymer Chem. Ed.,* 23, 1 (1985), Q. Q. Zhu et al., *J. Photochem.,* 36, 85, 39, 317 (1987), B. Amit et al., *Tetrahedron Lett.,* (24), 2205 (1973), D. H. R. Barton et al., *J. Chem. Soc.,* 35, 71 (1965), P. M. Collins et al., *J. Chem. Soc.,* Perkin I, 1695 (1975), M. Rudinstein et al., *Tetrahedron Lett.,* (17), 1445 (1975), J. W. Walker et al., *J. Am. Chem. Soc.,* 110, 7170 (1988), S. C. Busman et al., *J. Imaging Technol.,* 11 (4), 191 (1985), H. M. Houlihan et al., *Macromolecules,* 21, 2001 (1988), P. M. Collins et al., *J. Chem. Soc., Chem. Commun.,* 532 (1972), S. Hayase et al., *Macromolecules,* 18, 1799 (1985), E. Reichmanis et al., *J. Electrochem. Soc., Solid State Sci. Technol.,* 130 (6), F. M. Houlihan et al., *Macromolecules,* 21, 2001 (1988), European Patents 290,750, 046,083, 156,535, 271,851 and 388,343, U.S. Pat. Nos. 3,901,710 and 4,181, 531, JP-A-60-198538 and JP-A-53-133022, compounds producing sulfonic acids by photolysis which are represented by iminosulfonates described in M. Tunooka et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints Japan*, 37 (3), European Patents 199,672, 84,515, 44,115, 618,564, and 101,122, U.S. Pat. Nos. 618,564, 4,371,605 and 4,431,774, JP-A-64-18143, JP-A-2-245756 and JP-A-3-140109, and disulfone compounds described in JP-A-61-166544.

Further, compounds in which these groups or compounds generating acids with light are introduced into their main chains or side chains can be used. Examples of such compounds are described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Further, compounds generating acids with light can also be used which are described in V. N. R. Pillai *Synthesis*, (1) 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent 126,712.

Of the above-mentioned compounds which can be used in combination and are decomposed by irradiation of active light rays or radiation to generate acids, compounds particularly effectively used are described below.

(1) Oxazole derivatives substituted by trihalomethyl groups, which are represented by the following general formula (PAG1), or S-triazine derivatives represented by the following general formula (PGA2)

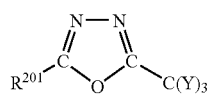
(PAG1)

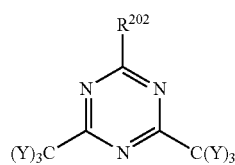
(PAG2)

wherein $R^{201}$ represents a substituted or unsubstituted aryl or alkenyl group; $R^{202}$ represents a substituted or unsubstituted aryl, alkenyl or alkyl group, or $-C(Y)_3$; and Y represents a chlorine atom or a bromine atom.

Specific examples thereof include but are not limited to the following compounds:

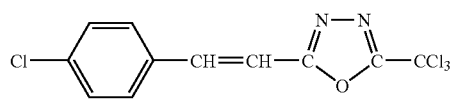
(PAG1-1)

-continued

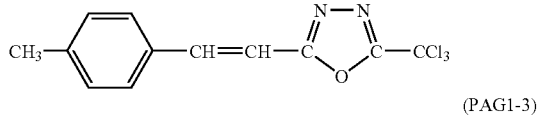
(PAG1-2)

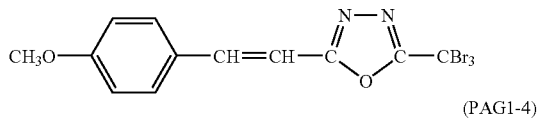
(PAG1-3)

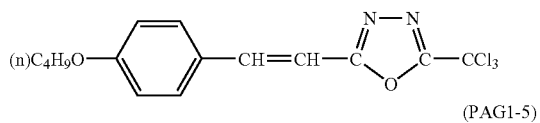
(PAG1-4)

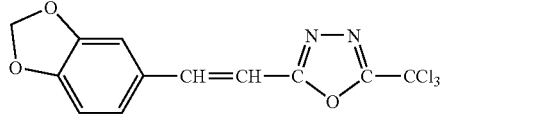
(PAG1-5)

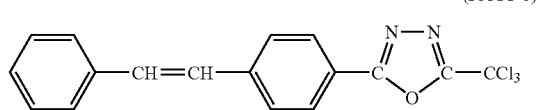
(PAG1-6)

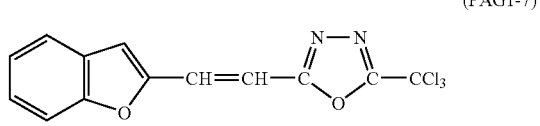
(PAG1-7)

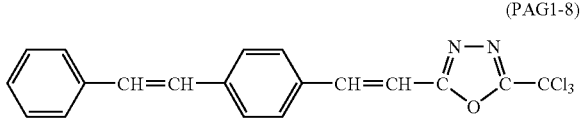
(PAG1-8)

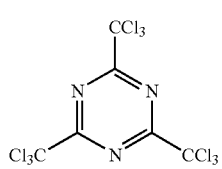
(PAG2-1)

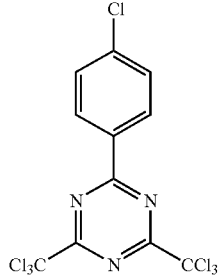
(PAG2-2)

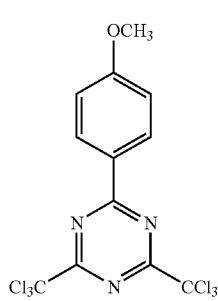
(PAG2-3)

-continued (PAG2-4)
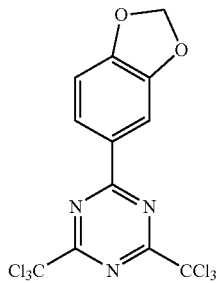

(PAG2-5)
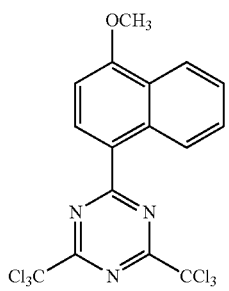

(PAG2-6)
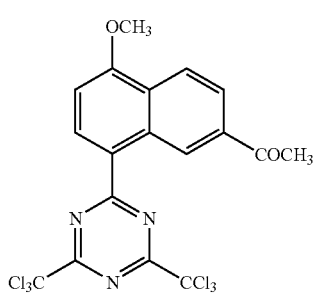

(PAG2-7)
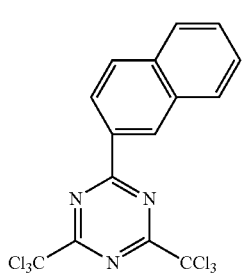

(PAG2-8)
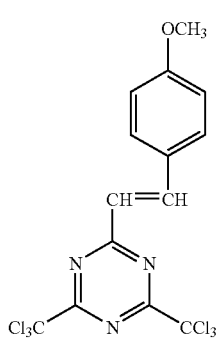

-continued (PAG2-9)
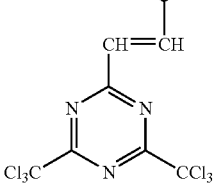

(PAG2-10)
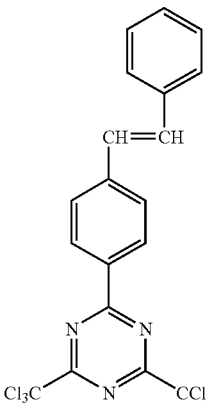

(2) Iodonium salts represented by the following general formula (PAG3) or sulfonium salts represented by the following general formula (PAG4)

$$\begin{array}{c} Ar^1 \\ \diagdown \\ I^+ Z^- \\ \diagup \\ Ar^2 \end{array}$$ (PAG3)

$$\begin{array}{c} R^{203} \\ | \\ R^{204}\!-\!S^+ Z^- \\ | \\ R^{205} \end{array}$$ (PAG4)

wherein $Ar^1$ and $Ar^2$ each independently represents a substituted or unsubstituted aryl group. Preferred examples of the substituent groups include alkyl, haloalkyl, cycloalkyl, aryl, alkoxyl, nitro, carboxyl, alkoxycarbonyl, hydroxyl, mercapto and halogen atoms.

$R^{203}$, $R^{204}$ and $R^{205}$ each independently represents a substituted or unsubstituted alkyl or aryl group, and preferably an aryl group having 6 to 14 carbon atoms, an alkyl group having 1 to 8 carbon atoms or a substituted derivative thereof. Preferred examples of the substituent groups for aryl include alkoxyl of 1 to 8 carbon atoms, alkyl of 1 to 8 carbon atoms, nitro, carboxyl, hydroxyl and halogen atoms, and preferred examples thereof for alkyl include alkoxyl of 1 to 8 carbon atoms, carboxyl and alkoxycarbonyl.

Z⁻ represents a counter ion such as a perfluoroalkanesulfonic acid anion, for example, $CF_3SO_3^-$, or a pentafluorobenzenesulfonic acid anion.

Two of $R^{203}$, $R^{204}$ and $R^{205}$, and $Ar^1$ and $Ar^2$ may combine together by each single bond or substituent group.

Specific examples thereof include but are not limited to the following compounds:

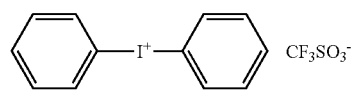 (PAG3-1)

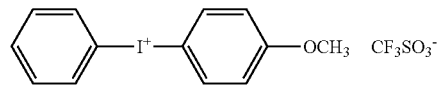 (PAG3-2)

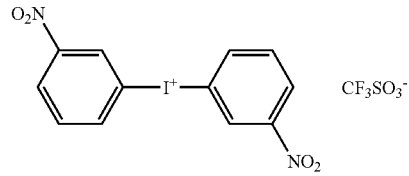 (PAG3-3)

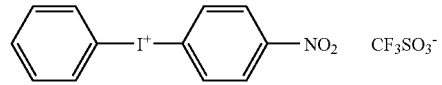 (PAG3-4)

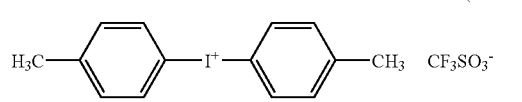 (PAG3-5)

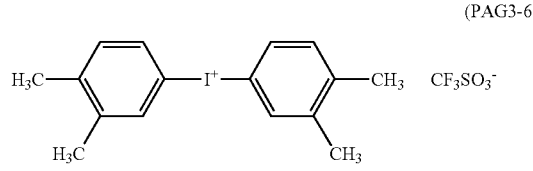 (PAG3-6)

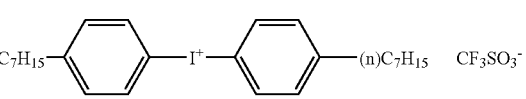 (PAG3-7)

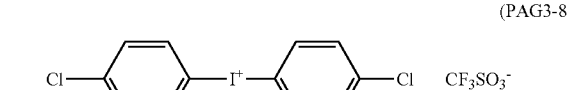 (PAG3-8)

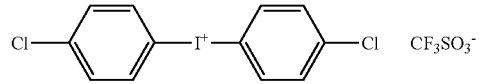 (PAG3-9)

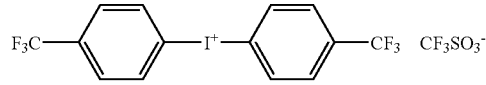 (PAG3-10)

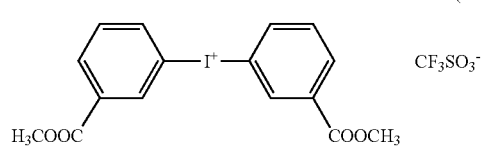

-continued

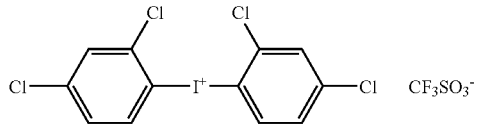 (PAG3-11)

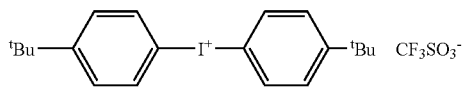 (PAG3-12)

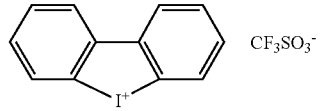 (PAG3-13)

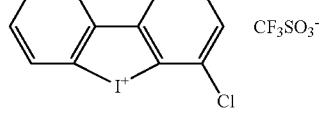 (PAG3-14)

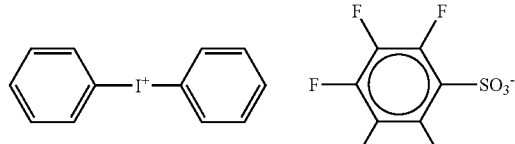 (PAG3-15)

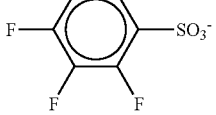

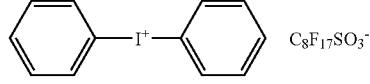 (PAG3-16)

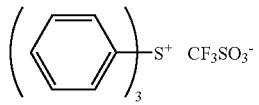 (PAG4-1)

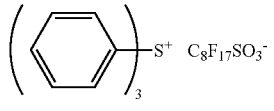 (PAG4-2)

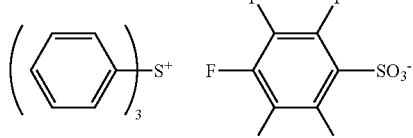 (PAG4-3)

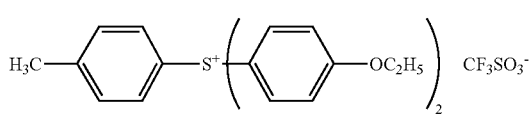 (PAG4-4)

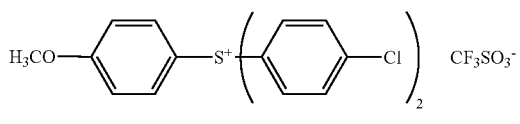 (PAG4-5)

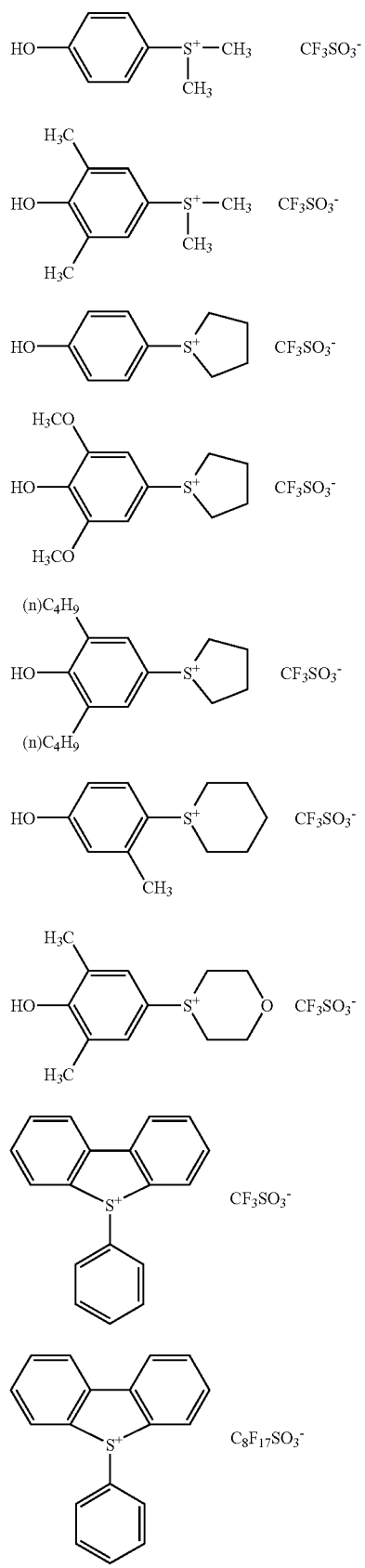
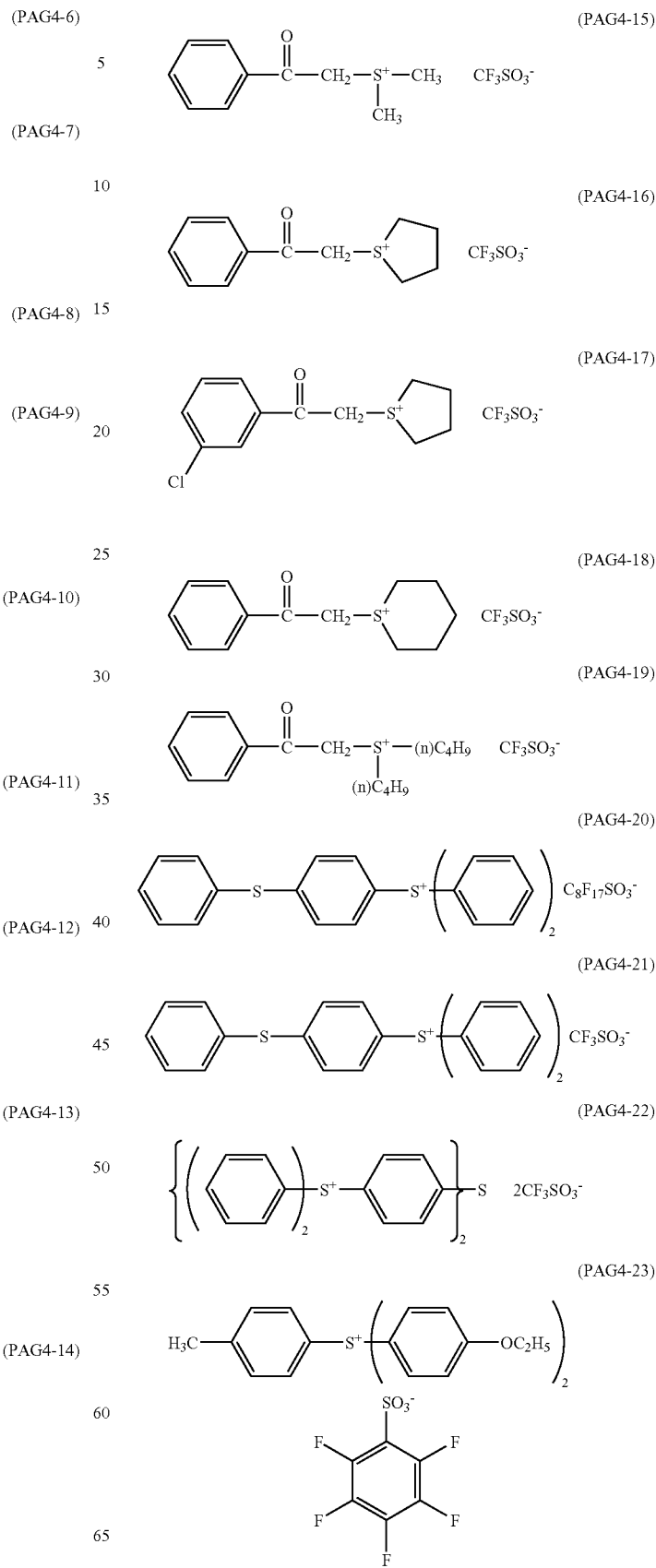

(PAG4-24)

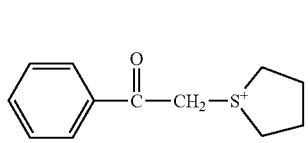 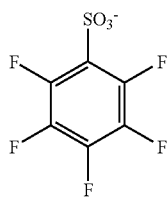

The above-mentioned onium salts represented by general formulas (PAG3) and (PAG4) are known, and can be synthesized, for example, by methods described in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polymer Chem. Ed.*, 18, 2677 (1980), U.S. Pat. Nos. 2,807,648 and 4,247,473, and JP-A-53-101331.

(3) Disulfone derivatives represented by the following general formula (PAG5) or iminosulfonate derivatives represented by the-following general formula (PAG6)

$$Ar^3-SO_2-SO_2-AR^4 \quad \text{(PAG5)}$$

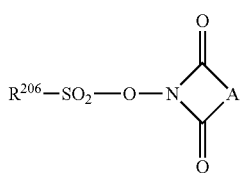
(PAG6)

wherein $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene or arylene group.

Specific examples thereof include but are not limited to the following compounds:

(PAG5-1)
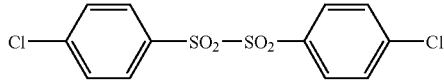

(PAG5-2)
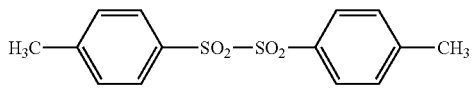

(PAG5-3)
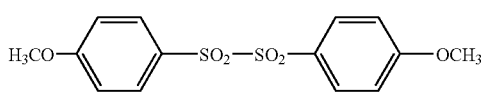

(PAG5-4)
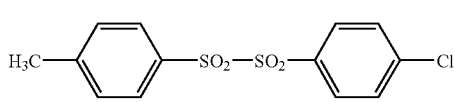

(PAG5-5)
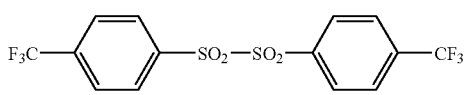

(PAG5-6)
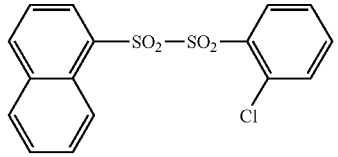

(PAG5-7)
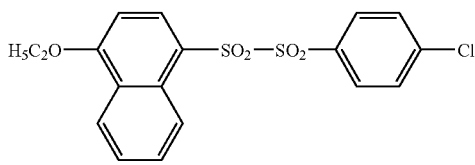

(PAG5-8)
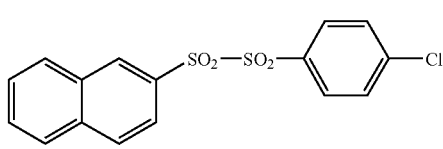

(PAG5-9)
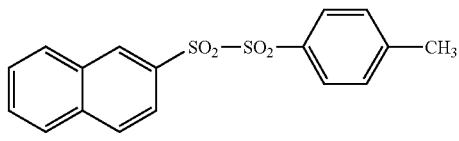

(PAG5-10)
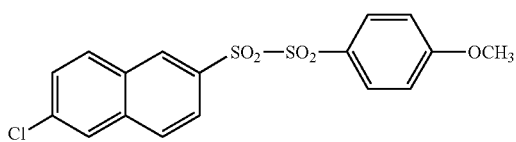

(PAG5-11)
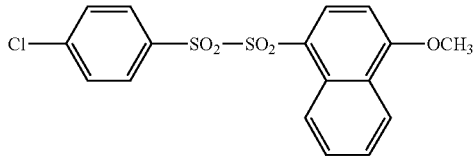

(PAG5-12)
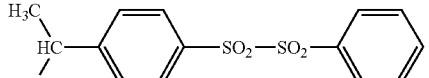

(PAG5-13)
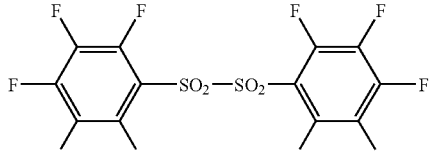

(PAG5-14)
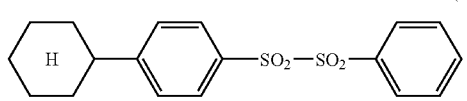

-continued (PAG6-1) 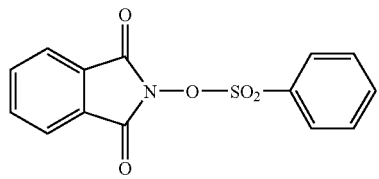

(PAG6-2) 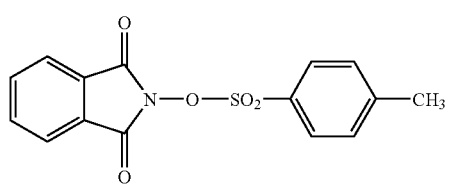

(PAG6-3) 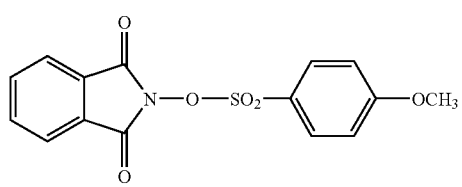

(PAG6-4) 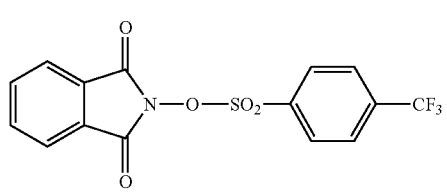

(PAG6-5) 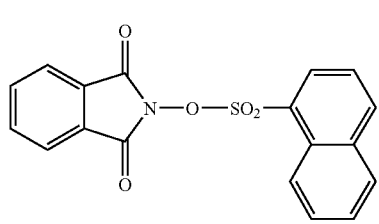

(PAG6-6) 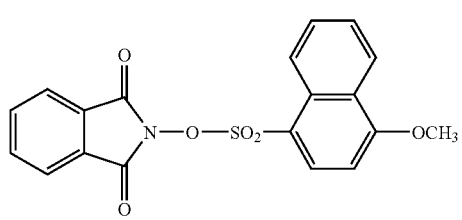

(PAG6-7) 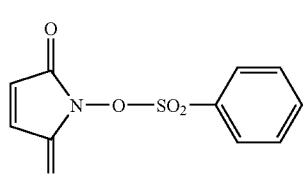

(PAG6-8) 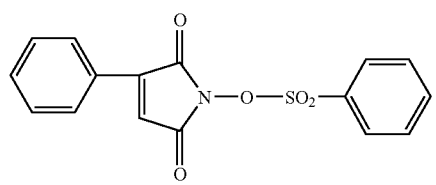

-continued (PAG6-9) 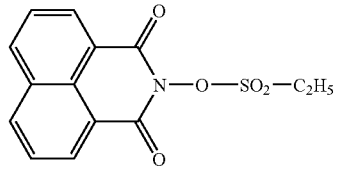

(PAG6-10) 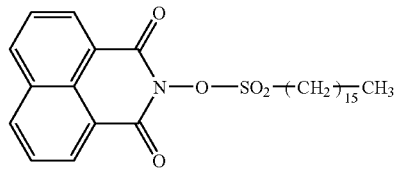

(PAG6-11) 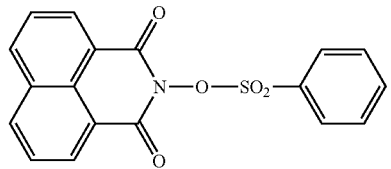

(PAG6-12) 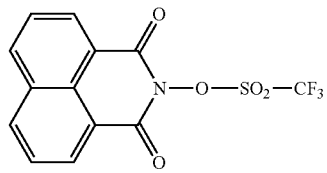

(PAG6-13) 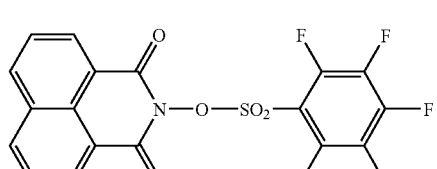

(PAG6-14) 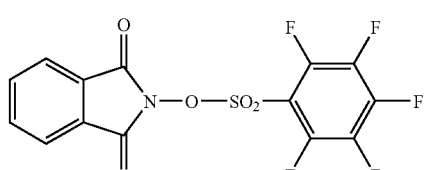

Appropriate alkali-soluble low molecular weight compounds may be added to the positive type photoresist compositions for-improving alkali solubility in the systems or controlling the glass transition temperature of the systems to prevent the films from becoming brittle and the heat resistance from being deteriorated. The alkali-soluble low molecular weight compounds include compounds having acidic groups in their molecules such as dialkylsulfonamide compounds, dialkylsulfonylimide (—SO$_2$—NH—CO—) compounds and dialkyldisulfonylimide (—SO$_2$—NH—SO$_2$—) compounds. The content of the alkali-soluble low molecular weight compound is preferably 40% by weight or less, more preferably 30% by weight or less, and most preferably 25% by weight or less, based on the binder resin.

The compositions of the present invention are preferably used as solutions thereof in specific solvents. Such solvents may be any, as long as they are organic solvents which sufficiently dissolve the respective solid components and can provide the solutions forming uniform coated films by methods such as spin coating. Further, they may be used alone or as a mixture of two or more of them. Specific examples thereof include but are not limited to n-propyl alcohol, isopropyl alcohol, n-butyl alcohol, t-butyl alcohol, methyl cellosolve acetate, ethyl cellosolve acetate, propylene glycol monoethyl ether acetate, methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidinone, cyclohexanone, cyclopentanone, cyclohexanol, methyl ethyl ketone, 1,4-dioxane, ethylene glycol monomethyl ether, ethylene glycol monomethyl ether acetate, ethylene glycol monoethyl ether, ethylene glycol monoisopropyl ether, diethylene glycol monomethyl ether, diethylene glycol dimethyl ether and 2-heptanone.

The positive type photoresist compositions of the present invention may further contain other components such as surfactants, pigments, stabilizers, coating improvers and dyes, if necessary.

Such positive type photoresist compositions of the present invention are applied onto substrates to form thin films. The thickness of the coated films is preferably 0.4 µm to 1.5 µm. As exposure means, ones in which the exposure wavelength is included within the range of 170 nm to 220 nm, such as ArF excimer laser stepper exposure, are preferred, and ArF excimer laser stepper exposure is particularly preferred.

The present invention will hereinafter be described in more detail by reference to examples. However, the present invention is not limited thereto.

SYNTHESIS EXAMPLE 1

Synthesis of Monomer [II-A-2]

2-Ethylthioethanol (106 g) was dissolved in dichloromethane, and 110 g of triethylamine was added thereto, followed by cooling on an ice bath. After sufficient cooling, 105 g of methacrylyl chloride was slowly added dropwise thereto for 1 hour. After the termination of addition, the ice bath was removed, and the temperature was spontaneously elevated to room temperature, followed by stirring as such for 3 hours. After the reaction was completed, acetic acid was added to the reaction product to neutralize it. Then, the resulting product was washed with distilled water. An oil layer was concentrated and purified by silica gel chromatography to obtain 165 g of the desired monomer.

SYNTHESIS EXAMPLE 2

Synthesis of Monomer [II-C-2]

Light Ester HO-MS manufactured by Kyoeisha Chemical Co., Ltd. was converted to an acid chloride with thionyl chloride, and the desired monomer was obtained in the same manner as with synthesis example 1 described above with the exception that the resulting acid chloride was used in place of methacrylyl chloride in Synthesis Example 1.

SYNTHESIS EXAMPLE 3

Synthesis of Monomer [II-A-14]

The desired monomer was obtained in the same manner as with synthesis example 1 described above with the exception that 2-methoxyethanol was used in place of 2-ethylthioethanol in Synthesis Example 1.

SYNTHESIS EXAMPLE 4

Synthesis of Resin A

Tricyclodecanyl methacrylate (11.0 g), the above-mentioned monomer [II-A-2] (5.3 g) and methacrylic acid (1.7 g) were dissolved in tetrahydrofuran (THF) (40 g), and then, the resulting solution was heated to 65° C. while passing a nitrogen gas therethrough for 30 minutes. As a polymerization initiator, 50 mg of V-65 manufactured by Wako Pure Chemical Industries, Ltd. was added thereto in 5 parts at intervals of 1 hour. After the final addition of the initiator, heating was continued as such for 4 hours. After the termination of heating, the temperature of the reaction solution was lowered to room temperature. The reaction solution diluted with 50 g of THF was reprecipitated with 3 liters of distilled water, thus recovering the desired copolymer as a white powder.

The GPC analysis of the resulting copolymer showed that it had a weight-average molecular weight of 47,000 in terms of standard polystyrene.

SYNTHESIS EXAMPLE 5

Synthesis of Resin B

Tricyclodecanyl methacrylate (11.0 g), the above-mentioned monomer [II-C-2] (9.5 g) and methacrylic acid (1.7 g) were dissolved in THF (50 g), and then, the resulting solution was heated to 65° C. while passing a nitrogen gas therethrough for 30 minutes. As a polymerization initiator, 50 mg of V-65 manufactured by Wako Pure Chemical Industries, Ltd. was added thereto in 5 parts at intervals of 1 hour. After the final addition of the initiator, heating was continued as such for 4 hours. After the termination of heating, the temperature of the reaction solution was lowered to room temperature. The reaction solution diluted with 50 g of THF was reprecipitated with 3 liters of distilled water, thus recovering the desired copolymer as a white powder.

The GPC analysis of the resulting copolymer showed that it had a weight-average molecular weight of 43,000 in terms of standard polystyrene.

SYNTHESIS EXAMPLE 6

Synthesis of Resin C

Tricyclodecanyl methacrylate (11.0 g), the above-mentioned monomer [II-A-14] (4.8 g) and methacrylic acid (1.7 g) were dissolved in THF (40 g), and then, the resulting solution was heated to 65° C. while passing a nitrogen gas therethrough for 30 minutes. As a polymerization initiator, 50 mg of V-65 manufactured by Wako Pure Chemical Industries, Ltd. was added thereto in 5 parts at intervals of 1 hour. After the final addition of the initiator, heating was continued as such for 4 hours. After the termination of heating, the temperature of the reaction solution was lowered to room temperature. The reaction solution diluted with 50 g of THF was reprecipitated with 3 liters of distilled water, thus recovering the desired copolymer as a white powder.

The GPC analysis of the resulting copolymer showed that it had a weight-average molecular weight of 46,000 in terms of standard polystyrene.

SYNTHESIS EXAMPLE 7

Monomer [d] having the following structure was synthesized in accordance with the method described in JP-A-8-259626, and binder resin D applicable to the present invention was synthesized.

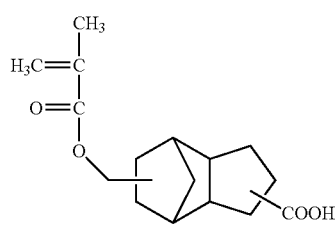

[d]

Tricyclodecanyl methacrylate (6.6 g), the above-mentioned monomer [II-A-2] (4.3 g) and monomer [d] (8.3 g) were dissolved in THF (45 g), and then, the resulting solution was heated to 65° C. while passing a nitrogen gas therethrough for 30 minutes. As a polymerization initiator, 50 mg of V-65 manufactured by Wako Pure Chemical Industries, Ltd. was added thereto in 5 parts at intervals of 1 hour. After the final addition of the initiator, heating was continued as such for 4 hours. After the termination of heating, the temperature of the reaction solution was lowered to room temperature. The reaction solution diluted with 50 g of THF was reprecipitated with 3 liters of distilled water, thus recovering the desired copolymer as a white powder.

The GPC analysis of the resulting copolymer showed that it had a weight-average molecular weight of 44,000 in terms of standard polystyrene.

SYNTHESIS EXAMPLE 8

Synthesis of Resin E for Comparison

Tricyclodecanyl methacrylate (11.0 g), t-butyl methacrylate (4.3 g) and methacrylic acid (1.7 g) were dissolved in THF (40 g), and then, the resulting solution was heated to 65° C. while passing a nitrogen gas therethrough for 30 minutes. As a polymerization initiator, 50 mg of V-65 manufactured by Wako Pure Chemical Industries, Ltd. was added thereto in 5 parts at intervals of 1 hour. After the final addition of the initiator, heating was continued as such for 4 hours. After the termination of heating, the temperature of the reaction solution was lowered to room temperature. The reaction solution diluted with 50 g of THF was reprecipitated with 3 liters of distilled water, thus recovering the desired copolymer as a white powder.

The GPC analysis of the resulting copolymer showed that it had a weight-average molecular weight of 48,000 in terms of standard polystyrene.

SYNTHESIS EXAMPLE 9

Synthesis of Resin F for Comparison

Tricyclodecanyl methacrylate (11.0 g), tetrahydrofuranyl methacrylate (5.2 g) and methacrylic acid (1.7 g) were dissolved in THF (42 g), and then, the resulting solution was heated to 65° C. while passing a nitrogen gas therethrough for 30 minutes. As a polymerization initiator, 50 mg of V-65 manufactured by Wako Pure Chemical Industries, Ltd. was added thereto in 5 parts at intervals of 1 hour. After the final addition of the initiator, heating was continued as such for 4 hours. After the termination of heating, the temperature of the reaction solution was lowered to room temperature. The reaction solution diluted with 50 g of THF was reprecipitated with 3 liters of distilled water, thus recovering the desired copolymer as a white powder.

The GPC analysis of the resulting copolymer showed that it had a weight-average molecular weight of 47,000 in terms of standard polystyrene.

SYNTHESIS EXAMPLE 10

Synthesis of Resin G for Comparison

Tricyclodecanyl methacrylate (11.0 g), 3-oxocyclohexyl methacrylate (5.6 g) and methacrylic acid (1.7 g) were dissolved in THF (43 g), and then, the resulting solution was heated to 65° C. while passing a nitrogen gas therethrough for 30 minutes. As a polymerization initiator, 50 mg of V-65 manufactured by Wako Pure Chemical Industries, Ltd. was added thereto in 5 parts at intervals of 1 hour. After the final addition of the initiator, heating was continued as such for 4 hours. After the termination of heating, the temperature of the reaction solution was lowered to room temperature. The reaction solution diluted with 50 g of THF was reprecipitated with 3 liters of distilled water, thus recovering the desired copolymer as a white powder.

The GPC analysis of the resulting copolymer showed that it had a weight-average molecular weight of 48,000 in terms of standard polystyrene.

SYNTHESIS EXAMPLE 11

Synthesis of Photo Acid Generator (1)

Sodium hydroxide (8 g) and hydroxylamine hydrochloride (14 g) were dissolved in 200 ml of distilled water, and 25 g of dimethylmaleic anhydride added thereto. Then, the resulting solution was stirred at room temperature for 5 hours, followed by heat stirring at 100° C. for 3 hours. After the reaction was completed, aqueous hydrochloric acid was added to the reaction solution. Then, the resulting solution was further saturated with sodium chloride, and thereafter extracted with ethyl acetate. The procedure of concentrating the extracted ethyl acetate solution to one third, adding toluene to the concentrated solution and reconcentrating the solution to which toluene was added was repeated to isolate 15 g of N-hydroxymaleinimide.

In dichloromethane, 4.2 g of N-hydroxymaleinimide thus synthesized was dissolved, and 8.5 g of trifluoromethanesulfonic acid anhydride was added dropwise on an ice bath for 1 hour. After 2.8 g of pyridine was further added dropwise for 2 hours, the ice bath was removed, and the temperature was elevated to room temperature, followed by stirring as such for 10 hours. After the reaction was completed, the reaction solution was washed with distilled water, and concentrated to conduct crystallization in hexane. The hexane layer was concentrated to obtain 10 g of the desired compound.

The following structure was confirmed by $^{13}$CNMR:

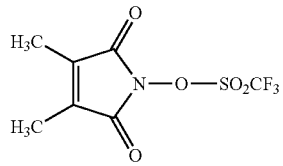

Examples 1 to 4 and Comparative Examples 1 to 3

In 2-heptanone, 1.2 g of each of resins A to G synthesized in Synthesis Examples described above and 0.1 g of photo acid generator (1) were dissolved so as to give a solid content of 14% by weight, and then, the resulting solution was filtered through a 0.1-μm microfilter to prepare a positive type photoresist composition solution. The formulation thereof is shown in Table 1 described below.

(Evaluation Tests)

The resulting positive type photoresist composition solution was applied onto a silicon wafer with a spin coater, and dried at 120° C. for 90 seconds to prepare a positive type photoresist film-having a thickness of about 0.5 μm, which was exposed to an ArF excimer laser beam (193 nm). After exposure, heat treatment was carried out at 110° C. for 90 seconds. Then, the photoresist film was developed with a 2.38% aqueous solution of tetramethylammonium hydroxide, and rinsed with distilled water to obtain a resist pattern profile.

[Relative Sensitivity]

Taking as a sensitivity an exposure which could reproduce a pattern having a width of 0.5 μm, and taking the resist sensitivity of Example 1 as 1, the relative sensitivity of a resist other than that of Example 1 was determined by the following equation:

Sensitivity other than that of Example 1/Sensitivity of Example 1

[Aging Storage Stability]

Coefficient of Variation in Sensitivity: The coefficient of variation in sensitivity was evaluated from the viewpoint of aging stability. A solution of the positive type photoresist composition prepared was stored at 30° C. for 1 month. Then, it was applied onto a silicon wafer and exposed in the same manner as above. The relative sensitivity was determined, and the difference from the above-mentioned relative sensitivity before storage was determined as the coefficient of variation with time.

Coefficient of Variation in Film Thickness Loss: The coefficient of variation in membrane decrease was evaluated from the viewpoint of aging stability. A profile of an unexposed area was observed under a scanning electron microscope (SEM), and the thickness of the film after development was measured. The change in the thickness of the film before and after development was compared between the positive type photoresist before storage at 30° C. for 1 month and that after storage for 1 month to examine the coefficient of variation with time in film thickness loss. Results thereof are shown in Table 1.

TABLE 1

Results of Resist Evaluation

| | Resin | Acid Generator | Relative Sensitivity | Coefficient of Variation in Sensitivity | Coefficient of Variation in Film Thickness Loss |
|---|---|---|---|---|---|
| Example 1 | A | 1 | 1.0 | 5% or less | 5% or less |
| Example 2 | B | 1 | 0.9 | 5% or less | 5% or less |
| Example 3 | C | 1 | 1.2 | 5% or less | 5% or less |
| Example 4 | D | 1 | 1.0 | 5% or less | 5% or less |
| Comparative Example 1 | E | 1 | 1.8 (NG) | 5% or less | 5% or less |
| Comparative Example 2 | F | 1 | 0.7 | 50% (NG) | 50% (NG) |
| Comparative Example 3 | G | 1 | 1.6 (NG) | 5% or less | 5% or less |

Comparative Examples 1 to 3 each has a problem in any one of the relative sensitivity, the coefficient of variation in sensitivity and the coefficient of variation in film thickness loss. On the other hand, Examples 1 to 4 relating to the positive type photoresist compositions of the present invention are at levels satisfying all of them. That is, the positive type photoresist compositions of the present invention are suitable for lithography using far ultraviolet rays including ArF excimer laser exposure.

SYNTHESIS EXAMPLE 12

Synthesis of Monomer [II-A'-2]

Methacrylic acid (86 g) was dissolved in 500 ml of dichloromethane, and 10 g of 4-dimethylaminopyridine was added thereto. Further, 102 g of 2-hydroxy-γ-butyrolactone was gently added. The resulting solution was cooled on an ice bath, and 25 g of dicyclohexylcarbodiimide was further slowly added thereto. After stirring as such for 30 minutes, the ice bath was removed, and the temperature was spontaneously elevated to room temperature, followed by stirring at room temperature for 3 hours. After the reaction was completed, the precipitated powder was filtered, and the resulting filtrate was extracted with 10% aqueous hydrochloric acid. The extract was washed with an aqueous solution of sodium bicarbonate, and further with saturated saline. The resulting oil layer was concentrated, and purified by silica gel column chromatography to obtain 150 g of the desired monomer [II-A'-2].

SYNTHESIS EXAMPLE 13

Synthesis of Monomer [II-C'-2]

Monomer [II-C'-2] was synthesized in the same manner as with Synthesis Example 12 with the exception that Light Ester HO-MS manufactured by Kyoeisha Chemical Co., Ltd. was substituted for methacrylic acid in Synthesis Example 12.

SYNTHESIS EXAMPLE 14

Synthesis of Monomer [II-F'-2]

Monomer [II-F'-2] was synthesized in the same manner as with Synthesis Example 12 with the exception that a terminal carboxylic acid methacrylate synthesized by the reaction of 3-hydroxypropionic acid and Karenzu MOI manufactured by Showa Denko K. K. was used in place of methacrylic acid in Synthesis Example 12.

SYNTHESIS EXAMPLE 15

Synthesis of Monomer 1 for Comparison

A monomer having the following structure was synthesized from mevalonolactone and methacrylyl chloride in accordance with the method described in *Journal of Photopolymer Science and Technology*, 9 (3), 509 (1996).

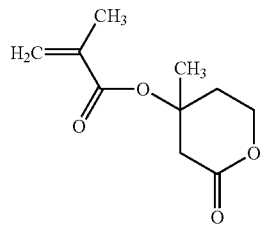

SYNTHESIS EXAMPLE 16

Synthesis of Resin A2

Tricyclodecanyl methacrylate (22.0 g), monomer [II-A'-2] (13.6 g) and methacrylic acid (1.7 g) were dissolved in THF (87 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 200 g of THF was reprecipitated with a mixed solvent of 4 liters of distilled water/2 liters of methanol, thus recovering the desired resin A2 as a white powder.

The GPC analysis of the resulting copolymer showed that it had a weight-average molecular weight of 36,000 in terms of standard polystyrene.

SYNTHESIS EXAMPLE 17

Synthesis of Resin B2

Tricyclodecanyl methacrylate (22.0 g), monomer [II-C'-2] (25.1 g) and methacrylic acid (1.7 g) were dissolved in THF (114 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 200 g of THF was reprecipitated with a mixed solvent of 4 liters of distilled water/2 liters of methanol, thus recovering the desired resin B2 as a white powder.

The GPC analysis of the resulting copolymer showed that it had a weight-average molecular weight of 37,500 in terms of standard polystyrene.

SYNTHESIS EXAMPLE 18

Synthesis of Resin C2

Tricyclodecanyl methacrylate (22.0 g), monomer [II-F'-2] (32.9 g) and methacrylic acid (1.7 g) were dissolved in THF (133 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 200 g of THF was reprecipitated with a mixed solvent of 4 liters of distilled water/2 liters of methanol, thus recovering the desired resin C2 as a white powder.

The GPC analysis of the resulting copolymer showed that it had a weight-average molecular weight of 39,000 in terms of standard polystyrene.

SYNTHESIS EXAMPLE 19

Synthesis of Resin D2

Tricyclodecanyl methacrylate (17.6 g), monomer [II-A'-2] (10.2 g), t-butyl methacrylate (5.7 g) and methacrylic acid (1.7 g) were dissolved in THF (82 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 200 g of THF was reprecipitated with a mixed solvent of 4 liters of distilled water/2 liters of methanol, thus recovering the desired resin D2 as a white powder.

The GPC analysis of the resulting copolymer showed that it had a weight-average molecular weight of 35,500 in terms of standard polystyrene.

SYNTHESIS EXAMPLE 20

Synthesis of Resin E2

Tricyclodecanyl methacrylate (17.6 g), monomer [II-C'-2] (18.9 g), t-butyl methacrylate (5.7 g) and methacrylic acid (1.7 g) were dissolved in THF (102 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 200 g of THF was reprecipitated with a mixed solvent of 4 liters of distilled water/2 liters of methanol, thus recovering the desired resin E2 as a white powder.

The GPC analysis of the resulting copolymer showed that it had a weight-average molecular weight of 37,200 in terms of standard polystyrene.

SYNTHESIS EXAMPLE 21

Synthesis of Resin F2

Tricyclodecanyl methacrylate (17.6 g), monomer [II-F'-2] (19.8 g), t-butyl methacrylate (5.7 g) and methacrylic acid (1.7 g) were dissolved in THF (105 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 200 g of THF was reprecipitated with a mixed solvent of 4 liters of distilled water/2 liters of methanol, thus recovering the desired resin F2 as a white powder.

The GPC analysis of the resulting copolymer showed that it had a weight-average molecular weight of 38,500 in terms of standard polystyrene.

SYNTHESIS EXAMPLE 22

Synthesis of Resin G2

Tricyclodecanyl methacrylate (22.0 g), monomer 1 for comparison (19.9 g) and methacrylic acid (1.7 g) were dissolved in THF (102 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 200 g of THF was reprecipitated with a mixed solvent of 4 liters of distilled water/2 liters of methanol, thus recovering the desired resin G2 as a white powder.

The GPC analysis of the resulting copolymer showed that it had a weight-average molecular weight of 35,600 in terms of standard polystyrene.

SYNTHESIS EXAMPLE 23

Synthesis of Resin H2

Tricyclodecanyl methacrylate (17.6 g), monomer 1 for comparison (12.0 g), t-butyl methacrylate (5.7 g) and methacrylic acid (1.7 g) were dissolved in THF (86 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 200 g of THF was reprecipitated with a mixed solvent of 4 liters of distilled water/2 liters of methanol, thus recovering the desired resin H2 as a white powder.

The GPC analysis of the resulting copolymer showed that it had a weight-average molecular weight of 34,500 in terms of standard polystyrene.

SYNTHESIS EXAMPLE 24

Synthesis of Photo Acid Generator (1)

Sodium hydroxide (8 g) and hydroxylamine hydrochloride (14 g) were dissolved in 200 ml of distilled water, and 25 g of dimethylmaleic anhydride added thereto. Then, the resulting solution was stirred at room temperature for 5 hours, followed by heat stirring at 100° C. for 3 hours. After the reaction was completed, aqueous hydrochloric acid was added to the reaction solution. Then, the resulting solution was further saturated with sodium chloride, and thereafter extracted with ethyl acetate. The procedure of concentrating the extracted ethyl acetate solution to one third, adding toluene to the concentrated solution and reconcentrating the solution to which toluene was added was repeated to isolate 15 g of N-hydroxymaleinimide.

In dichloromethane, 4.2 g of N-hydroxymaleinimide thus synthesized was dissolved, and 8.5 g of trifluoromethanesulfonic acid anhydride was added dropwise on an ice bath for 1 hour. After 2.8 g of pyridine was further added dropwise for 2 hours, the ice bath was removed, and the temperature was elevated to room temperature, followed by stirring as such for 10 hours. After the reaction was completed, the reaction solution was washed with distilled water, and concentrated to conduct crystallization in hexane. The hexane layer was concentrated to obtain 10 g of the desired compound.

The following structure was confirmed by $^{13}$CNMR:

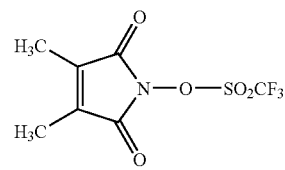

Examples 5 to 10 and Comparative Examples 4 and 5

In 2-heptanone, 1.2 g of each of resins A2 to H2 synthesized in Synthesis Examples described above and 0.25 g of photo acid generator (1) were dissolved so as to give a solid content of 14% by weight, and then, the resulting solution was filtered through a 0.1-μm microfilter to prepare a positive type photoresist composition solution. The formulation thereof is shown in Table 2 described below.

((Evaluation Tests)

The resulting positive type photoresist composition solution was applied onto a silicon wafer with a spin coater, and dried at 120° C. for 90 seconds to prepare a positive type photoresist film having a thickness of about 0.5 μm, which was exposed to an ArF excimer laser beam (193 nm). After exposure, heat treatment was carried out at 110° C. for 90 seconds. Then, the photoresist film was developed with a 2.38% aqueous solution of tetramethylammonium hydroxide, and rinsed with distilled water to obtain a resist pattern profile.

[Relative Sensitivity]

Taking as a sensitivity an exposure which could reproduce a pattern having a width of 0.5 μm, and taking the resist sensitivity of Example 5 as 1, the relative sensitivity of a resist other than that of Example 5 was determined by the following equation:

Sensitivity other than that of Example 5/Sensitivity of Example 5

[Pattern Profile]

The resist pattern profile obtained above was observed under a scanning electron microscope, and one showing a rectangular form was rated as O and one showing a T-top form as x.

[Adhesion]

Minimum Width of Remaining Thin Line: The resist pattern profile obtained above was observed under a scanning electron microscope, and the adhesion was evaluated by the width of the thinnest remaining line. That is, higher adhesion results in remaining of a pattern having a thinner line width. Conversely, a pattern poor in adhesion can not adhere to a substrate as the line width becomes thinner, resulting in separation of the pattern.

Results thereof are shown in Table 2.

TABLE 2

|  | Resin Used | Relative Sensitivity | Pattern Profile | Minimum Width of Remaining Thin Line |
|---|---|---|---|---|
| Example 5 | A2 | 1.0 | o | 0.29 |
| Example 6 | B2 | 0.9 | o | 0.30 |
| Example 7 | C2 | 0.9 | o | 0.31 |
| Example 8 | D2 | 0.6 | o | 0.28 |
| Example 9 | E2 | 0.5 | o | 0.29 |
| Example 10 | F2 | 0.6 | o | 0.30 |
| Comparative Example 4 | G2 | 2.4 | x | 0.59 |
| Comparative Example 5 | H2 | 1.7 | x | 0.60 |

Comparative Examples 4 and 5 each has problems in the relative sensitivity, the pattern profile and the adhesion. On the other hand, Examples 5 to 10 relating to the positive type photoresist compositions of the present invention are at levels satisfying all of them. That is, the positive type photoresist compositions of the present invention are suitable for lithography using far ultraviolet rays including ArF excimer laser exposure.

SYNTHESIS EXAMPLE 25

Synthesis of Monomer [I-A-1]

1-Methoxy-2-methyl-2-propanol was synthesized from 1-chloro-2-methyl-2-propanol and sodium methoxide.

Then, 72 g of acrylic acid was dissolved in 500 ml of dichloromethane, and 10 g of 4-dimethylaminopyridine was added thereto. Further, 90 g of 1-methoxy-2-methyl-2-propanol was gently added. The resulting solution was cooled on an ice bath, and 25 g of dicyclohexylcarbodiimide was further slowly added thereto. After stirring as such for 30 minutes, the ice bath was removed, and the temperature was spontaneously elevated to room temperature, followed by stirring at room temperature for 3 hours. After the reaction was completed, the precipitated powder was filtered, and the resulting filtrate was extracted with 10% aqueous hydrochloric acid. The extract was washed with an aqueous solution of sodium bicarbonate, and further with saturated saline. The resulting oil layer was concentrated, and purified by silica gel column chromatography to obtain 125 g of the desired monomer [I-A-1].

SYNTHESIS EXAMPLE 26

Synthesis of Monomer [I-A-7]

Monomer [I-A-7] was synthesized in the same manner as with Synthesis Example 25 with the exception that methylmercaptan sodium salt was used in place of sodium methoxide.

SYNTHESIS EXAMPLE 27

Synthesis of Monomer [I-C-1]

Monomer [I-C-1] was synthesized in the same manner as with Synthesis Example 25 with the exception that the following carboxylic acid monomer was used in place of acrylic acid:

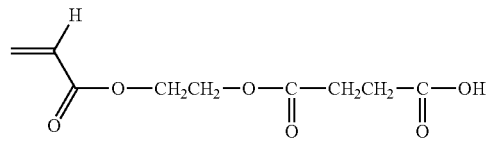

SYNTHESIS EXAMPLE 28

Synthesis of Monomer [I-D-1]

Monomer [I-D-1] was synthesized in the same manner as with Synthesis Example 25 with the exception that Aronix M-5600 manufactured by Toagosei Chemical Industry Co., Ltd. was used in place of acrylic acid.

SYNTHESIS EXAMPLE 29

Synthesis of Monomer [I-F-2]

Monomer [I-F-2] was synthesized in the same manner as with Synthesis Example 25 with the exception that a terminal carboxylic acid methacrylate synthesized by the reaction of 3-hydroxypropionic acid and Karenzu MOI manufactured by Showa Denko K. K. was used in place of acrylic acid in Synthesis Example 25.

SYNTHESIS EXAMPLE 30

Synthesis of Resin A3

Tricyclodecanyl methacrylate (22.0 g), monomer [I-A-1] (12.7 g) and acrylic acid (1.4 g) were dissolved in THF (55 g), and then, the reaction solution was heated to 65° C. while passing a nitrogen gas therethrough for 30 minutes. As a polymerization initiator, 100 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 2 liters of distilled water/2 liters of methanol, thus recovering the desired resin A3 as a white powder.

The GPC analysis of the resulting copolymer showed that it had a weight-average molecular weight of 32,000 in terms of standard polystyrene.

SYNTHESIS EXAMPLE 31

Synthesis of Resin B3

Tricyclodecanyl methacrylate (22.0 g), monomer [I-A-9] (13.9 g) and acrylic acid (1.4 g) were dissolved in THF (57 g), and then, the reaction solution was heated to 65° C. while passing a nitrogen gas therethrough for 30 minutes. As a polymerization initiator, 100 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 2 liters of distilled water/2 liters of methanol, thus recovering the desired resin B3 as a white powder.

The GPC analysis of the resulting copolymer showed that it had a weight-average molecular weight of 33,000 in terms of standard polystyrene.

SYNTHESIS EXAMPLE 32

Synthesis of Resin C3

Tricyclodecanyl methacrylate (22.0 g), monomer [I-C-1] (24.2 g) and acrylic acid (1.4 g) were dissolved in THF (70 g), and then, the reaction solution was heated to 65° C. while passing a nitrogen gas therethrough for 30 minutes. As a polymerization initiator, 100 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 150 g of THF was reprecipitated with a mixed solvent of 3 liters of distilled water/2 liters of methanol, thus recovering the desired resin C3 as a white powder.

The GPC analysis of the resulting copolymer showed that it had a weight-average molecular weight of 35,000 in terms of standard polystyrene.

SYNTHESIS EXAMPLE 33

Synthesis of Resin D3

Tricyclodecanyl methacrylate (22.0 g), monomer [I-D-1] (20.7 g) and acrylic acid (1.4 g) were dissolved in THF (66 g), and then, the reaction solution was heated to 65° C. while passing a nitrogen gas therethrough for 30 minutes. As a polymerization initiator, 100 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 150 g of THF was reprecipitated with a mixed solvent of 3 liters of distilled water/2 liters of methanol, thus recovering the desired resin D3 as a white powder.

The GPC analysis of the resulting copolymer showed that it had a weight-average molecular weight of 34,500 in terms of standard polystyrene.

SYNTHESIS EXAMPLE 34

Synthesis of Resin E3

Tricyclodecanyl methacrylate (22.0 g), monomer [I-F-2] (26.5 g) and acrylic acid (1.4 g) were dissolved in THF (80 g), and then, the reaction solution was heated to 65° C. while passing a nitrogen gas therethrough for 30 minutes. As a polymerization initiator, 125 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 200 g of THF was reprecipitated with a mixed solvent of 3 liters of distilled water/3 liters of methanol, thus recovering the desired resin E3 as a white powder.

The GPC analysis of the resulting copolymer showed that it had a weight-average molecular weight of 32,500 in terms of standard polystyrene.

SYNTHESIS EXAMPLE 35

Synthesis of Resin F3 for Comparison

Tricyclodecanyl methacrylate (22.0 g), t-butyl acrylate (10.3 g) and acrylic acid (1.4 g) were dissolved in THF (50 g), and then, the reaction solution was heated to 65° C. while passing a nitrogen gas therethrough for 30 minutes. As a polymerization initiator, 100 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 2 liters of distilled water/2 liters of methanol, thus recovering the desired resin F3 as a white powder.

The GPC analysis of the resulting copolymer showed that it had a weight-average molecular weight of 31,500 in terms of standard polystyrene.

SYNTHESIS EXAMPLE 36

Synthesis of Resin G3 for Comparison

Tricyclodecanyl methacrylate (22.0 g), the following monomer a (15.4 g) and acrylic acid (1.4 g) were dissolved in THF (58 g), and then, the reaction solution was heated to 65° C. while passing a nitrogen gas therethrough for 30 minutes. As a polymerization initiator, 100 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 2 liters of distilled water/2 liters of methanol, thus recovering the desired resin G3 as a white powder.

The GPC analysis of the resulting copolymer showed that it had a weight-average molecular weight of 32,300 in terms of standard polystyrene.

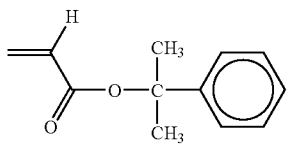

(a)

SYNTHESIS EXAMPLE 37

Synthesis of Resin H3 for Comparison

Tricyclodecanyl methacrylate (22.0 g), the following monomer b (11.2 g) and acrylic acid (1.4 g) were dissolved in THF (58 g), and then, the reaction solution was heated to 65° C. while passing a nitrogen gas therethrough for 30 minutes. As a polymerization initiator, 100 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 2 liters of distilled water/2 liters of methanol, thus recovering the desired resin H3 as a white powder.

The GPC analysis of the resulting copolymer showed that it had a weight-average molecular weight of 31,000 in terms of standard polystyrene.

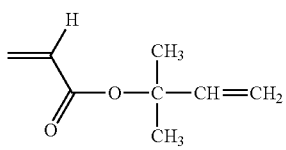

(b)

SYNTHESIS EXAMPLE 38

Synthesis of Resin I3 for Comparison

Tricyclodecanyl methacrylate (22.0 g), the following monomer c (15.9 g) and acrylic acid (1.4 g) were dissolved in THF (60 g), and then, the reaction solution was heated to 65° C. while passing a nitrogen gas therethrough for 30 minutes. As a polymerization initiator, 100 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 2 liters of distilled water/2 liters of methanol, thus recovering the desired resin I3 as a white powder.

The GPC analysis of the resulting copolymer showed that it had a weight-average molecular weight of 32,500 in terms of standard polystyrene.

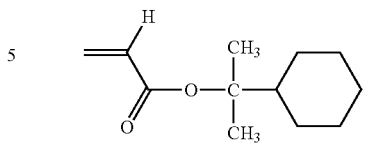

(c)

SYNTHESIS EXAMPLE 39

Synthesis of Photo Acid Generator (1)

Sodium hydroxide (8 g) and hydroxylamine hydrochloride (14 g) were dissolved in 200 ml of distilled water, and 25 g of dimethylmaleic anhydride added thereto. Then, the resulting solution was stirred at room temperature for 5 hours, followed by heat stirring at 100° C. for 3 hours. After the reaction was completed, aqueous hydrochloric acid was added to the reaction solution. Then, the resulting solution was further saturated with sodium chloride, and thereafter extracted with ethyl acetate. The procedure of concentrating the extracted ethyl acetate solution to one third, adding toluene to the concentrated solution and reconcentrating the solution to which toluene was added was repeated to isolate 15 g of N-hydroxymaleinimide.

In dichloromethane, 4.2 g of N-hydroxymaleinimide thus synthesized was dissolved, and 8.5 g of trifluoromethanesulfonic acid anhydride was added dropwise on an ice bath for 1 hour. After 2.8 g of pyridine was further added dropwise for 2 hours, the ice bath was removed, and the temperature was elevated to room temperature, followed by stirring as such for 10 hours. After the reaction was completed, the reaction solution was washed with distilled water, and concentrated to conduct crystallization in hexane. The hexane layer was concentrated to obtain 10 g of the desired compound.

The following structure was confirmed by $^{13}$CNMR:

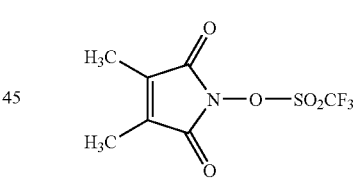

Examples 11 to 15 and Comparative Examples 6 to 9

In 2-heptanone, 1.2 g of each of resins A3 to I3 synthesized in Synthesis Examples described above and 0.25 g of photo acid generator (1) were dissolved so as to give a solid content of 14% by weight, and then, the resulting solution was filtered through a 0.1-μm microfilter to prepare a positive type photoresist composition solution. The formulation thereof is shown in Table 3 described below.

(Evaluation Tests)

The resulting positive type photoresist composition solution was applied onto a silicon wafer with a spin coater, and dried at 120° C. for 90 seconds to prepare a positive type photoresist film having a thickness of about 0.5 μm, which was exposed to an ArF excimer laser beam (193 nm). After exposure, heat treatment was carried out at 110° C. for 90 seconds. Then, the photoresist film was developed with a 2.38% aqueous solution of tetramethylammonium hydroxide, and rinsed with distilled water to obtain a resist pattern profile.

[Relative Sensitivity]

Taking as a sensitivity an exposure which could reproduce a pattern having a width of 0.5 μm, and taking the resist sensitivity of Example 11 as 1, the relative sensitivity of a resist other than that of Example 11 was determined by the following equation:

Sensitivity other than that of Example 11/Sensitivity of Example 11

[Pattern Profile]

The resist pattern profile obtained above was observed under a scanning electron microscope, and one showing a rectangular form was rated as O and one showing a T-top form as x.

[Adhesion]

Minimum Width of Remaining Thin Line: The resist pattern profile obtained above was observed under a scanning electron microscope, and the adhesion was evaluated by the width of the thinnest remaining line. That is, higher adhesion results in remaining of a pattern having a thinner line width. Conversely, a pattern poor in adhesion can not adhere to a substrate as the line width becomes thinner, resulting in separation of the pattern.

Results thereof are shown in Table 3.

TABLE 3

|  | Resin Used | Relative Sensitivity | Pattern Profile | Minimum Width of Remaining Thin Line |
|---|---|---|---|---|
| Example 11 | A3 | 1.0 | o | 0.30 |
| Example 12 | B3 | 1.0 | o | 0.29 |
| Example 13 | C3 | 1.1 | o | 0.31 |
| Example 14 | D3 | 0.9 | o | 0.28 |
| Example 15 | E3 | 0.9 | o | 0.29 |
| Comparative Example 6 | F3 | 1.8 | x | 0.45 |
| Comparative Example 7 | G3 | 2.0 | x | 0.47 |
| Comparative Example 8 | H3 | 1.9 | x | 0.50 |
| Comparative Example 9 | I3 | 1.9 | x | 0.48 |

[Transmission Density]

The same composition as that of the positive type photoresist composition solution applied onto the silicon wafer for the above-mentioned tests was applied onto a silica plate having no photoabsorption in the far ultraviolet region to prepare a sample for density measurement. The spectral adsorption in the far ultraviolet region was measured using a spectral densitometer to determine a transmission density at 193 nm, which was divided by a thickness of the coated layer of the sample to determine a transmission density per micron of coated layer in thickness.

Results thereof are shown in Table 4.

TABLE 4

|  | Resin Used | Transmission Density |
|---|---|---|
| Example 11 | A3 | 0.10 |
| Example 12 | B3 | 0.15 |
| Example 13 | C3 | 0.19 |
| Example 14 | D3 | 0.20 |
| Example 15 | E3 | 0.18 |
| Comparative Example 6 | F3 | 0.15 |
| Comparative Example 7 | G3 | 1.10 |
| Comparative Example 8 | H3 | 0.17 |
| Comparative Example 9 | I3 | 0.68 |

Referring to Table 3, Comparative Examples 7 to 9 each has problems in the relative sensitivity, the pattern profile and the adhesion. On the other hand, Examples 11 to 15 relating to the positive type photoresist compositions of the present invention are at levels satisfying all of them. That is, the positive type photoresist compositions of the present invention are suitable for lithography using far ultraviolet rays including ArF excimer laser exposure.

On the other hand, Table 4 shows that all sample resins A3 to E3 of the present invention have a transmission density of 0.4 or less per micron of coated layer in thickness at 193 nm, and sufficiently low in photoabsorption to exposure for patterning compared with the samples for comparison. This means that light reaches the substrate side of a composition layer by irradiation without significant attenuation, and is reflected in the good pattern profile and the high relative sensitivity shown in Table 3. In Comparative Examples 6 and 9, the resins low in transmission density are used, but is nevertheless inferior to the samples of the present invention in the photoresist characteristics shown in Table 3. This means that being low in transmission density is a necessary condition which the characteristics of the photoresists for far ultraviolet rays should possess, but not a sufficient condition.

SYNTHESIS EXAMPLE 40

Synthesis of Monomer [I-A'-1]

Acrylic acid (72 g) was dissolved in 500 ml of dichloromethane, and 10 g of 4-dimethylaminopyridine was added thereto. Further, 1-chloro-2-methyl-2-propanol was gently added. The resulting solution was cooled on an ice bath, and 25 g of dicyclohexylcarbodiimide was further slowly added thereto. After stirring as such for 30 minutes, the ice bath was removed, and the temperature was spontaneously elevated to room temperature, followed by stirring at room temperature for 3 hours. After the reaction was completed, the precipitated powder was filtered, and the resulting filtrate was extracted with 10% aqueous hydrochloric acid. The extract was washed with an aqueous solution of sodium bicarbonate, and further with saturated saline. The resulting oil layer was concentrated, and purified by silica gel column chromatography to obtain 145 g of the desired monomer [I-A'-1].

SYNTHESIS EXAMPLE 41

Synthesis of Monomer [I-C'-1]

Monomer [I-C'-1] was synthesized in the same manner as with Synthesis Example 40 with the exception that the following carboxylic acid monomer was used in place of acrylic acid:

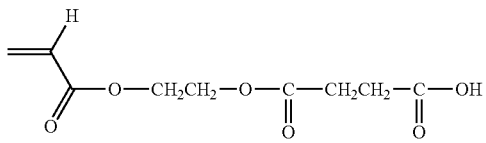

SYNTHESIS EXAMPLE 42

Synthesis of Monomer [I-D'-1]

Monomer [I-D'-1] was synthesized in the same manner as with Synthesis Example 40 with the exception that Aronix M-5600 manufactured by Toagosei Co., Ltd. was used in place of acrylic acid.

SYNTHESIS EXAMPLE 43

Synthesis of Resin A4

Tricyclodecanyl methacrylate (22.0 g), monomer [I-A'-1] (13.0 g) and acrylic acid (1.4 g) were dissolved in THF (85 g), and then, the reaction solution was heated to 65° C. while passing a nitrogen gas therethrough for 30 minutes. As a polymerization initiator, 100 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 2 liters of distilled water/2 liters of methanol, thus recovering the desired resin A4 as a white powder.

The GPC analysis of the resulting copolymer showed that it had a weight-average molecular weight of 18,000 in terms of standard polystyrene.

SYNTHESIS EXAMPLE 44

Synthesis of Resin B4

Tricyclodecanyl methacrylate (22.0 g), monomer [I-C'-1] (24.5 g) and acrylic acid (1.4 g) were dissolved in THF (112 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 150 g of THF was reprecipitated with a mixed solvent of 3 liters of distilled water/3 liters of methanol, thus recovering the desired resin B4 as a white powder.

The GPC analysis of the resulting copolymer showed that it had a weight-average molecular weight of 19,200 in terms of standard polystyrene.

SYNTHESIS EXAMPLE 45

Synthesis of Resin C4

Tricyclodecanyl methacrylate (22.0 g), monomer [I-D'-1] (21.1 g) and acrylic acid (1.4 g) were dissolved in THF (104 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 150 g of THF was reprecipitated with a mixed solvent of 3 liters of distilled water/2 liters of methanol, thus recovering the desired resin C4 as a white powder.

The GPC analysis of the resulting copolymer showed that it had a weight-average molecular weight of 18,800 in terms of standard polystyrene.

SYNTHESIS EXAMPLE 46

Synthesis of Resin D4

Tricyclodecanyl methacrylate (22.0 g), t-butyl acrylate (10.3 g) and acrylic acid (1.4 g) were dissolved in THF (80 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 2 liters of distilled water/2 liters of methanol, thus recovering the desired resin D4 as a white powder.

The GPC analysis of the resulting copolymer showed that it had a weight-average molecular weight of 17,800 in terms of standard polystyrene.

SYNTHESIS EXAMPLE 47

Synthesis of Resin E4 for Comparison

Tricyclodecanyl methacrylate (22.0 g), the following monomer a (11.2 g) and acrylic acid (1.4 g) were dissolved in THF (90 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 3 liters of distilled water/3 liters of methanol, thus recovering the desired resin E4 as a white powder.

The GPC analysis of the resulting copolymer showed that it had a weight-average molecular weight of 18,600 in terms of standard polystyrene.

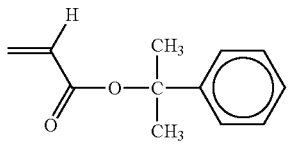

(a)

SYNTHESIS EXAMPLE 48

Synthesis of Resin F4 for Comparison

Tricyclodecanyl methacrylate (22.0 g), the following monomer b (11.2 g) and acrylic acid (1.4 g) were dissolved in THF (90 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 100 g of THF was reprecipitated with a mixed solvent of 3 liters of distilled water/3 liters of methanol, thus recovering the desired resin F4 as a white powder.

The GPC analysis of the resulting copolymer showed that it had a weight-average molecular weight of 18,300 in terms of standard polystyrene.

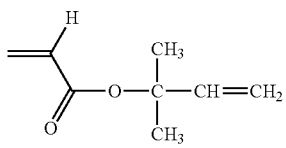

(b)

SYNTHESIS EXAMPLE 49

Synthesis of Resin G4 for Comparison

Tricyclodecanyl methacrylate (22.0 g), the following monomer c (15.9 g) and acrylic acid (1.4 g) were dissolved in THF (95 g), and then, the reaction solution was heated to 65° C. while passing a nitrogen gas therethrough for 30 minutes. As a polymerization initiator, 150 mg of V-65 manufactured by Wako Pure Chemical Industries, Ltd. was added thereto in 5 parts at intervals of 1 hour. After the final addition of the initiator, heating and stirring were continued as such for 4 hours. After the termination of heating, the temperature of the reaction solution was lowered to room temperature. The reaction solution diluted with 120 g of THF was reprecipitated with a mixed solvent of 3 liters of distilled water/3 liters of methanol, thus recovering the desired resin G4 as a white powder.

The GPC analysis of the resulting copolymer showed that it had a weight-average molecular weight of 18,400 in terms of standard polystyrene.

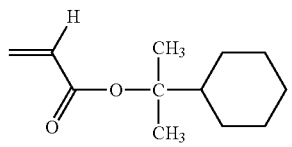

(c)

SYNTHESIS EXAMPLE 50

Synthesis of Photo Acid Generator (1)

Sodium hydroxide (8 g) and hydroxylamine hydrochloride (14 g) were dissolved in 200 ml of distilled water, and 25 g of dimethylmaleic anhydride added thereto. Then, the resulting solution was stirred at room temperature for 5 hours, followed by heat stirring at 100° C. for 3 hours. After the reaction was completed, aqueous hydrochloric acid was added to the reaction solution. Then, the resulting solution was further saturated with sodium chloride, and thereafter extracted with ethyl acetate. The procedure of concentrating the extracted ethyl acetate solution to one third, adding toluene to the concentrated solution and reconcentrating the solution to which toluene was added was repeated to isolate 15 g of N-hydroxymaleinimide.

In dichloromethane, 4.2 g of N-hydroxymaleinimide thus synthesized was dissolved, and 8.5 g of trifluoromethanesulfonic acid anhydride was added dropwise on an ice bath for 1 hour. After 2.8 g of pyridine was further added dropwise for 2 hours, the ice bath was removed, and the temperature was elevated to room temperature, followed by stirring as such for 10 hours. After the reaction was completed, the reaction solution was washed with distilled water, and concentrated to conduct crystallization in hexane. The hexane layer was concentrated to obtain 10 g of the desired compound.

The following structure was confirmed by $^{13}$CNMR:

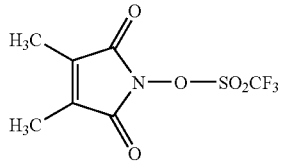

Examples 16 to 18 and Comparative Examples 10 to 13

In 2-heptanone, 1.2 g of each of resins A4 to G4 synthesized in Synthesis Examples described above and 0.25 g of photo acid generator (1) were dissolved so as to give a solid content of 14% by weight, and then, the resulting solution was filtered through a 0.1-μm microfilter to prepare a positive type photoresist composition solution.

(Evaluation Tests)

The resulting positive type photoresist composition solution was applied onto a silicon wafer with a spin coater, and dried at 120° C. for 90 seconds to prepare a positive type photoresist film having a thickness of about 0.5 μm, which was exposed to an ArF excimer laser beam (193 nm). After exposure, heat treatment was carried out at 110° C. for 90 seconds. Then, the photoresist film was developed with a 2.38% aqueous solution of tetramethylammonium hydroxide, and rinsed with distilled water to obtain a resist pattern profile.

[Relative Sensitivity]

Taking as a sensitivity an exposure which could reproduce a pattern having a width of 0.5 μm, and taking the resist sensitivity of Example 16 as 1, the relative sensitivity of a resist other than that of Example 16 was determined by the following equation:

Sensitivity other than that of Example 16/Sensitivity of Example 16

[Pattern Profile]

The resist pattern profile obtained above was observed under a scanning electron microscope, and one showing a rectangular form was rated as O and one showing a T-top form as x.

[Adhesion]

Minimum Width of Remaining Thin Line: The resist pattern profile obtained above was observed under a scanning electron microscope, and the adhesion was evaluated by the width of the thinnest remaining line.

Results thereof are shown in Table 5.

TABLE 5

|  | Resin Used | Relative Sensitivity | Pattern Profile | Minimum Width of Remaining Thin Line |
| --- | --- | --- | --- | --- |
| Example 16 | A4 | 1.0 | o | 0.30 |
| Example 17 | B4 | 1.0 | o | 0.29 |
| Example 18 | C4 | 1.1 | o | 0.31 |
| Comparative Example 10 | D4 | 1.7 | x | 0.50 |
| Comparative Example 11 | E4 | 2.1 | x | 0.45 |
| Comparative Example 12 | F4 | 1.6 | x | 0.48 |
| Comparative Example 13 | G4 | 1.5 | x | 0.48 |

[Transmission Density]

The same composition as that of the positive type photoresist composition solution applied onto the silicon wafer for the above-mentioned tests was applied onto a silica plate having no photoabsorption in the far ultraviolet region to prepare a sample for density measurement. The spectral adsorption in the far ultraviolet region was measured using a spectral densitometer to determine a transmission density at 193 nm, which was divided by a thickness of the coated layer of the sample to determine a transmission density per micron of coated layer in thickness.

Results thereof are shown in Table 6.

TABLE 6

|  | Resin Used | Transmission Density |
| --- | --- | --- |
| Example 16 | A4 | 0.16 |
| Example 17 | B4 | 0.17 |
| Example 18 | C4 | 0.20 |
| Comparative Example 10 | D4 | 0.16 |

TABLE 6-continued

|  | Resin Used | Transmission Density |
| --- | --- | --- |
| Comparative Example 11 | E4 | 1.10 |
| Comparative Example 12 | F4 | 0.17 |
| Comparative Example 13 | G4 | 0.68 |

Referring to Table 5, Comparative Examples 10 to 13 each has problems in the relative sensitivity, the pattern profile and the adhesion. On the other hand, Examples 16 to 18 relating to the positive type photoresist compositions of the present invention are at levels satisfying all of them. That is, of the resins in which the acid decomposable groups are attached by ester linkages to tertiary carbon, the resins of the present invention, namely resins each having the structure that tertiary carbon is substituted by a halomethylene group, are particularly suitable for lithography using far ultraviolet rays including ArF excimer laser exposure.

On the other hand, Table 6 shows that all sample resins A4 to C4 of the present invention have a transmission density of 0.4 or less per micron of coated layer in thickness at 193 nm, and sufficiently low in photoabsorption to exposure for patterning compared with the samples for comparison. This means that light reaches the substrate side of a composition layer by irradiation without significant attenuation, and is reflected in the good pattern profile and the high relative sensitivity shown in Table 5. In Comparative Examples 10 and 13, the resins low in transmission density are used, but is nevertheless inferior to the samples of the present invention in the photoresist characteristics shown in Table 5. This means that being low in transmission density is a necessary condition which the characteristics of the photoresists for far ultraviolet rays should possess, but not a sufficient condition.

As described above, according to the present invention, there can be provided positive photoresist compositions which are sufficiently suitable, particularly, for light in the wavelength region of 170 nm to 220 nm, high in sensitivity, excellent in adhesion and can give good resist pattern profiles.

What is claimed is:

1. A positive photoresist composition comprising a resin which has an ester group represented by the following general formula (I-2) in its molecule and is decomposed by action of an acid to increase solubility of the resin in an alkali solution, and a compound generating an acid by irradiation of an active light ray or radiation:

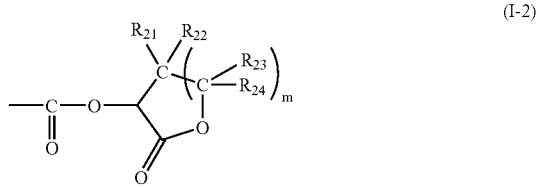

wherein $R_{21}$ to $R_{24}$, which may be the same or different, each represents a hydrogen atom or an alkyl group; and m represents 1 or 2;

wherein said resin further contains (1) repeating structure units each having an alicyclic hydrocarbon moiety and further contains (2) repeating structure units each having a group which is decomposed by action of an acid to increase solubility of the resin in an alkali developing solution.

2. The positive photoresist composition according to claim 1, wherein said resin is a resin which contains repeating structure units corresponding to a monomer represented by the following general formula (II-2) and is decomposed by action of an acid to increase solubility of the resin in an alkali solution:

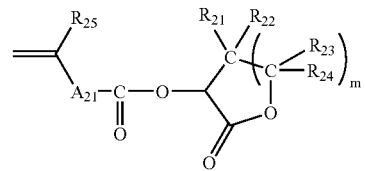

(II-2)

wherein $R_{21}$ to $R_{24}$ and m have the same meanings as given in claim 1; $R_{25}$ represents a hydrogen atom or a methyl group; and $A_{21}$ represents one group selected from the group consisting of a single bond, an alkylene group, a substituted alkylene group, an ether group, a thioether group, a carbonyl group, an ester group, an amido group, a sulfonamide group, a urethane group and a urea group, or a combination of two or more of them.

* * * * *